US008274273B2

(12) United States Patent
Nguyen et al.

(10) Patent No.: US 8,274,273 B2
(45) Date of Patent: Sep. 25, 2012

(54) TEST AND MEASUREMENT DEVICE WITH A PISTOL-GRIP HANDLE

(75) Inventors: Evans H. Nguyen, Renton, WA (US);
Scott D. Bublitz, Hartland, WI (US);
Jason R. Crowe, Milwaukee, WI (US);
Mike N. Jones, Lake Forest Park, WA (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

(21) Appl. No.: 12/936,808

(22) PCT Filed: Apr. 9, 2009

(86) PCT No.: PCT/US2009/040101
§ 371 (c)(1),
(2), (4) Date: Apr. 1, 2011

(87) PCT Pub. No.: WO2009/126824
PCT Pub. Date: Oct. 15, 2009

(65) Prior Publication Data
US 2011/0169481 A1    Jul. 14, 2011

Related U.S. Application Data

(63) Continuation-in-part of application No. 12/399,835, filed on Mar. 6, 2009.

(60) Provisional application No. 61/043,455, filed on Apr. 9, 2008, provisional application No. 61/095,053, filed on Sep. 8, 2008.

(51) Int. Cl.
*G01R 1/20* (2006.01)

(52) U.S. Cl. .......... 324/126; 324/127; 173/170
(58) Field of Classification Search .......... 324/126, 324/127; 235/462.45, 472.01; 173/170
See application file for complete search history.

(56) References Cited

U.S. PATENT DOCUMENTS
2,497,129 A    2/1950    Liston
(Continued)

FOREIGN PATENT DOCUMENTS
EP    0301652    2/1989
(Continued)

OTHER PUBLICATIONS

PCT/US2009/040101 International Search Report and Written Opinion dated Jul. 31, 2009 (11 pages).
(Continued)

*Primary Examiner* — Arleen M Vazquez
(74) *Attorney, Agent, or Firm* — Michael Best & Friedrich LLP

(57) ABSTRACT

In another embodiment, the invention provides a clamp meter configured to receive a removable and rechargeable battery pack. The clamp meter includes a main body having a first axis, a handle, a clamp, a trigger, and a display. The handle has a second axis and includes a first recess configured to receive the battery pack. The first recess includes at least first and second electrical terminals which are exposed when the battery pack is not inserted into the first recess. The second axis forms an oblique angle with the first axis, and the battery pack is inserted into the first recess along the second axis. The clamp is coupled to the main body, aligned with the first axis, and operable to measure an electrical characteristic of a conductor based on an induced current. The trigger is operable to selectively open and close the clamp, and the display configured to display an indication of the electrical characteristic.

18 Claims, 46 Drawing Sheets

U.S. PATENT DOCUMENTS

| | | | |
|---|---|---|---|
| 2,696,117 A | 12/1954 | Harrison | |
| 3,168,698 A * | 2/1965 | Goody et al. | 324/127 |
| 3,518,654 A | 6/1970 | Vassil | |
| 3,845,384 A | 10/1974 | Stoutenberg et al. | |
| 3,999,110 A | 12/1976 | Ramstrom et al. | |
| 4,005,605 A | 2/1977 | Michael | |
| 4,112,764 A | 9/1978 | Turner | |
| 4,301,682 A | 11/1981 | Everest | |
| 4,315,150 A | 2/1982 | Darringer et al. | |
| 4,428,685 A | 1/1984 | Lemelson et al. | |
| 4,433,923 A | 2/1984 | Rascati et al. | |
| 4,456,919 A | 6/1984 | Tomita et al. | |
| 4,464,622 A | 8/1984 | Franklin | |
| 4,498,481 A | 2/1985 | Lemke | |
| 4,505,600 A | 3/1985 | Suzuki et al. | |
| 4,591,256 A | 5/1986 | Matsumura | |
| 4,612,538 A | 9/1986 | Karcher, Jr. | |
| 4,634,294 A | 1/1987 | Christol et al. | |
| 4,722,612 A | 2/1988 | Junkert et al. | |
| 4,734,553 A | 3/1988 | Noda | |
| 4,743,122 A | 5/1988 | Yamano et al. | |
| 4,784,149 A | 11/1988 | Berman et al. | |
| 4,790,324 A | 12/1988 | O'Hara et al. | |
| 4,797,840 A | 1/1989 | Fraden | |
| 4,831,258 A | 5/1989 | Paulk et al. | |
| 4,853,617 A | 8/1989 | Douglas et al. | |
| 4,858,615 A | 8/1989 | Meinema | |
| 4,859,931 A | 8/1989 | Yamashita et al. | |
| 4,867,574 A | 9/1989 | Jenkofsky | |
| 4,881,823 A | 11/1989 | Tanaka et al. | |
| 4,900,162 A | 2/1990 | Beckman et al. | |
| 4,934,830 A | 6/1990 | Rieger et al. | |
| 4,986,669 A | 1/1991 | Yamaguchi | |
| 4,989,450 A | 2/1991 | Shoberg et al. | |
| 4,992,741 A | 2/1991 | Douglas et al. | |
| 4,993,419 A | 2/1991 | Pompei et al. | |
| 4,993,424 A | 2/1991 | Suszynski et al. | |
| 4,998,058 A | 3/1991 | Tofte et al. | |
| 5,012,813 A | 5/1991 | Pompei et al. | |
| 5,015,102 A | 5/1991 | Yamaguchi | |
| 5,017,018 A | 5/1991 | Iuchi et al. | |
| 5,018,872 A | 5/1991 | Suszynski et al. | |
| 5,060,657 A | 10/1991 | Teague | |
| 5,115,815 A | 5/1992 | Hansen | |
| D328,257 S | 7/1992 | Ormand et al. | |
| 5,148,108 A | 9/1992 | Dufour | |
| 5,150,969 A | 9/1992 | Goldberg et al. | |
| D330,171 S | 10/1992 | Wilson et al. | |
| 5,229,612 A | 7/1993 | Pompei et al. | |
| 5,258,871 A | 11/1993 | Gupta | |
| RE34,507 E | 1/1994 | Egawa et al. | |
| 5,296,806 A | 3/1994 | Hurl, Jr. | |
| 5,325,863 A | 7/1994 | Pompei | |
| 5,333,784 A | 8/1994 | Pompei | |
| 5,352,974 A | 10/1994 | Heger | |
| RE34,789 E | 11/1994 | Fraden | |
| 5,368,392 A | 11/1994 | Hollander et al. | |
| 5,381,796 A | 1/1995 | Pompei | |
| 5,399,018 A | 3/1995 | Hollander et al. | |
| D357,194 S | 4/1995 | O'Grady | |
| 5,449,882 A | 9/1995 | Black et al. | |
| 5,457,394 A | 10/1995 | McEwan | |
| 5,477,622 A | 12/1995 | Skalnik | |
| 5,512,834 A | 4/1996 | McEwan | |
| 5,524,984 A | 6/1996 | Hollander et al. | |
| 5,610,512 A * | 3/1997 | Selcuk | 324/127 |
| 5,619,128 A | 4/1997 | Heger | |
| 5,626,139 A | 5/1997 | Szeles et al. | |
| 5,626,424 A | 5/1997 | Litvin et al. | |
| 5,628,323 A | 5/1997 | Pompei | |
| 5,667,300 A | 9/1997 | Mandelis et al. | |
| 5,672,964 A | 9/1997 | Vinci | |
| 5,707,137 A | 1/1998 | Hon | |
| 5,727,880 A | 3/1998 | Hollander et al. | |
| 5,736,726 A * | 4/1998 | VanHorn et al. | 235/472.02 |
| 5,743,644 A | 4/1998 | Kobayashi et al. | |
| 5,764,684 A | 6/1998 | Pompei | |
| 5,790,586 A | 8/1998 | Hilton, Jr. et al. | |
| 5,812,057 A | 9/1998 | Hepworth et al. | |
| 5,823,678 A | 10/1998 | Hollander et al. | |
| 5,823,679 A | 10/1998 | Hollander et al. | |
| 5,826,980 A | 10/1998 | Kouzu et al. | |
| 5,836,692 A | 11/1998 | Pompei | |
| 5,836,694 A | 11/1998 | Nguyen | |
| 5,839,829 A | 11/1998 | Litvin et al. | |
| 5,877,618 A | 3/1999 | Luebke et al. | |
| 5,917,314 A | 6/1999 | Heger et al. | |
| 5,959,734 A | 9/1999 | Tanaka et al. | |
| 5,991,652 A | 11/1999 | Barthelemy et al. | |
| 6,000,845 A | 12/1999 | Tymkewicz et al. | |
| 6,022,120 A | 2/2000 | Chang | |
| 6,023,159 A | 2/2000 | Heger | |
| 6,045,257 A | 4/2000 | Pompei et al. | |
| 6,048,093 A | 4/2000 | Pompei | |
| 6,050,722 A | 4/2000 | Thundat et al. | |
| 6,076,962 A | 6/2000 | Chen | |
| 6,095,682 A | 8/2000 | Hollander et al. | |
| 6,123,453 A | 9/2000 | Hollander et al. | |
| 6,137,285 A | 10/2000 | Walsten et al. | |
| 6,157,591 A | 12/2000 | Krantz | |
| 6,186,959 B1 | 2/2001 | Canfield et al. | |
| 6,196,714 B1 | 3/2001 | Bellifemine | |
| 6,198,271 B1 | 3/2001 | Heger et al. | |
| 6,211,662 B1 | 4/2001 | Bijawat et al. | |
| 6,215,293 B1 | 4/2001 | Yim | |
| 6,249,113 B1 | 6/2001 | Krantz et al. | |
| 6,259,241 B1 | 7/2001 | Krantz | |
| 6,267,500 B1 | 7/2001 | Hollander et al. | |
| 6,301,997 B1 | 10/2001 | Welte | |
| 6,341,891 B1 | 1/2002 | Hollander et al. | |
| 6,402,371 B2 | 6/2002 | Pompei et al. | |
| D460,923 S | 7/2002 | Chen | |
| 6,425,688 B1 | 7/2002 | Hsu | |
| 6,433,551 B1 | 8/2002 | Shaland et al. | |
| 6,540,398 B2 | 4/2003 | Hollander et al. | |
| 6,553,813 B2 | 4/2003 | Rynhart et al. | |
| 6,565,254 B2 | 5/2003 | Sato et al. | |
| 6,575,590 B1 | 6/2003 | Wadsworth | |
| 6,614,356 B2 | 9/2003 | Li | |
| 6,631,287 B2 | 10/2003 | Newman et al. | |
| D483,280 S | 12/2003 | Leutz | |
| 6,659,639 B2 | 12/2003 | Hollander et al. | |
| 6,669,362 B1 | 12/2003 | Lin et al. | |
| 6,742,927 B2 | 6/2004 | Bellifemine | |
| D493,733 S | 8/2004 | Chen | |
| 6,771,043 B2 | 8/2004 | Matsunaga et al. | |
| 6,842,993 B1 | 1/2005 | DiMauro | |
| 6,844,713 B2 | 1/2005 | Steber et al. | |
| 6,847,394 B1 | 1/2005 | Hansen et al. | |
| D501,799 S | 2/2005 | Yamamoto et al. | |
| 6,886,979 B2 | 5/2005 | Conforti | |
| 6,894,508 B2 | 5/2005 | Sanoner et al. | |
| 6,924,605 B2 | 8/2005 | Chun | |
| 6,926,473 B2 | 8/2005 | Luebke | |
| 6,964,515 B2 | 11/2005 | Asakura et al. | |
| 6,978,503 B2 | 12/2005 | Del Cogliano | |
| 6,989,662 B2 | 1/2006 | Heger et al. | |
| 7,001,066 B1 | 2/2006 | Bellifemine | |
| 7,001,067 B2 | 2/2006 | Huston et al. | |
| 7,013,570 B2 | 3/2006 | Levine et al. | |
| 7,038,446 B1 | 5/2006 | Keely | |
| 7,048,437 B2 | 5/2006 | Bellifemine | |
| 7,056,012 B2 | 6/2006 | Blakeley, III | |
| 7,059,057 B2 | 6/2006 | Raskin et al. | |
| 7,079,040 B2 | 7/2006 | Barton | |
| 7,093,974 B2 | 8/2006 | Kienitz | |
| 7,111,981 B2 | 9/2006 | Blakeley, III | |
| 7,116,091 B2 | 10/2006 | Miller | |
| 7,125,145 B2 | 10/2006 | Gardiner et al. | |
| 7,134,217 B2 | 11/2006 | Melittas | |
| 7,147,162 B2 | 12/2006 | Fitch et al. | |
| 7,148,703 B2 | 12/2006 | Miller | |
| 7,157,705 B2 | 1/2007 | Hamrelius et al. | |
| 7,157,882 B2 | 1/2007 | Johnson et al. | |
| 7,163,336 B2 * | 1/2007 | Blakeley, III | 374/142 |
| 7,164,467 B2 | 1/2007 | Heinke et al. | |
| 7,168,316 B2 | 1/2007 | Blakeley, III | |

| Patent No. | Date | Inventor |
|---|---|---|
| 7,170,076 B2 | 1/2007 | Butler et al. |
| 7,178,250 B2 | 2/2007 | Nash et al. |
| 7,181,855 B2 | 2/2007 | Krantz et al. |
| 7,186,000 B2 * | 3/2007 | Lebens et al. .................. 362/184 |
| 7,192,186 B2 | 3/2007 | Blakeley, III |
| 7,193,405 B2 | 3/2007 | Murray |
| 7,208,932 B1 | 4/2007 | Chun |
| 7,212,014 B2 | 5/2007 | Krantz |
| 7,222,437 B2 | 5/2007 | Spanski et al. |
| D549,114 S | 8/2007 | Sebban |
| 7,256,587 B2 | 8/2007 | Sanoner et al. |
| 7,278,223 B1 | 10/2007 | Dever et al. |
| 7,287,336 B1 | 10/2007 | Goodrich |
| D559,386 S | 1/2008 | Pease et al. |
| D560,804 S | 1/2008 | Pease et al. |
| 7,316,073 B2 | 1/2008 | Murray |
| 7,339,685 B2 | 3/2008 | Carlson et al. |
| D567,123 S | 4/2008 | Babb et al. |
| 7,350,973 B2 | 4/2008 | Craig et al. |
| 7,352,445 B2 | 4/2008 | Schreher |
| 7,357,526 B2 | 4/2008 | Zeiler |
| 7,358,746 B2 | 4/2008 | Clauss et al. |
| 7,384,308 B2 | 6/2008 | Boehnlein et al. |
| 7,390,124 B2 | 6/2008 | Kienitz |
| 7,407,323 B2 | 8/2008 | Hutcherson |
| 7,411,660 B2 | 8/2008 | Cho et al. |
| 7,431,619 B2 | 10/2008 | Boehnlein et al. |
| 7,447,565 B2 | 11/2008 | Cerwin |
| 7,504,817 B2 | 3/2009 | Sanoner et al. |
| 7,537,381 B2 | 5/2009 | Hollander et al. |
| 7,545,492 B2 | 6/2009 | Kienitz |
| 7,550,725 B2 | 6/2009 | Hollander et al. |
| 7,557,536 B2 | 7/2009 | Lobert et al. |
| 7,581,988 B2 | 9/2009 | Boehnlein et al. |
| 7,584,534 B2 | 9/2009 | Pease et al. |
| 7,589,500 B2 | 9/2009 | Johnson et al. |
| 7,600,885 B2 | 10/2009 | Canino et al. |
| 7,602,175 B2 | 10/2009 | Mednikov et al. |
| 7,633,282 B2 * | 12/2009 | Radle et al. ...................... 324/67 |
| D609,590 S | 2/2010 | Wingate |
| 7,677,752 B2 | 3/2010 | Tadokoro et al. |
| 7,688,028 B2 | 3/2010 | Phillips et al. |
| 7,758,495 B2 | 7/2010 | Pease et al. |
| D623,080 S | 9/2010 | Nguyen et al. |
| 2001/0007420 A1 | 7/2001 | Bijawat et al. |
| 2001/0017879 A1 | 8/2001 | Kienitz et al. |
| 2002/0048307 A1 | 4/2002 | Schmidt |
| 2003/0058638 A1 * | 3/2003 | Gillette ........................ 362/119 |
| 2003/0218469 A1 | 11/2003 | Brazell et al. |
| 2004/0196888 A1 | 10/2004 | Musbach et al. |
| 2004/0252747 A1 | 12/2004 | Garvelink et al. |
| 2005/0080354 A1 | 4/2005 | Crossley |
| 2005/0083991 A1 | 4/2005 | Wong |
| 2005/0094705 A1 | 5/2005 | Chi |
| 2005/0097765 A1 | 5/2005 | Sorensen et al. |
| 2005/0117624 A1 | 6/2005 | Hollander et al. |
| 2005/0169347 A1 | 8/2005 | Kuo |
| 2005/0185695 A1 | 8/2005 | Hollander et al. |
| 2005/0201444 A1 | 9/2005 | Hollander et al. |
| 2005/0247460 A1 | 11/2005 | Luebke |
| 2005/0276308 A1 | 12/2005 | Pint |
| 2006/0002233 A1 | 1/2006 | Malard |
| 2006/0028194 A1 | 2/2006 | Bosch |
| 2006/0062276 A1 | 3/2006 | Conforti |
| 2006/0076385 A1 | 4/2006 | Etter et al. |
| 2006/0078037 A1 | 4/2006 | Lee et al. |
| 2006/0087286 A1 * | 4/2006 | Phillips et al. ................. 320/114 |
| 2006/0113985 A1 | 6/2006 | Gist et al. |
| 2006/0148519 A1 | 7/2006 | Simpson et al. |
| 2006/0155168 A1 | 7/2006 | Pease |
| 2006/0196059 A1 | 9/2006 | Berto |
| 2006/0215728 A1 | 9/2006 | Jang |
| 2006/0262519 A1 | 11/2006 | Hirschburger et al. |
| 2006/0262829 A1 | 11/2006 | Manlove et al. |
| 2007/0069716 A1 | 3/2007 | Sleeman et al. |
| 2007/0079445 A1 | 4/2007 | Siebeck |
| 2007/0086508 A1 * | 4/2007 | Reading et al. ............... 374/208 |
| 2007/0185379 A1 | 8/2007 | Newman et al. |
| 2007/0200547 A1 | 8/2007 | Chen |
| 2007/0240892 A1 | 10/2007 | Brotto et al. |
| 2008/0036644 A1 | 2/2008 | Skultety-Betz et al. |
| 2008/0064339 A1 | 3/2008 | Cavalier |
| 2008/0144696 A1 | 6/2008 | Bruggeman et al. |
| 2008/0158349 A1 | 7/2008 | Miller et al. |
| 2008/0186010 A1 | 8/2008 | Skultety-Betz et al. |
| 2008/0196910 A1 | 8/2008 | Radle et al. |
| 2008/0235954 A1 | 10/2008 | Radle |
| 2008/0259993 A1 | 10/2008 | Blakeley |
| 2008/0272761 A1 | 11/2008 | Sanoner et al. |
| 2009/0045806 A1 | 2/2009 | Worones |
| 2009/0109045 A1 | 4/2009 | Delmonico et al. |
| 2009/0125330 A1 | 5/2009 | Sebban |
| 2009/0229842 A1 | 9/2009 | Gray et al. |
| 2009/0257222 A1 | 10/2009 | Jones et al. |
| 2009/0257469 A1 | 10/2009 | Jones et al. |
| 2009/0262782 A1 | 10/2009 | Ko et al. |
| 2010/0046577 A1 | 2/2010 | Sheard et al. |
| 2010/0117885 A1 | 5/2010 | Holbrook et al. |
| 2010/0225299 A1 | 9/2010 | Nguyen et al. |

FOREIGN PATENT DOCUMENTS

| | | |
|---|---|---|
| GB | 2331581 | 5/1999 |
| JP | 63078029 | 4/1988 |
| JP | 63153435 | 6/1988 |
| JP | 2245624 | 10/1990 |
| JP | 2002207057 | 7/2002 |
| WO | 2008/011517 | 1/2008 |

OTHER PUBLICATIONS

PCT/US2009/036399 International Search Report and Written Opinion dated May 11, 2009 (9 pages).

V18 Lithium-Ion System, Milwaukee Electric Tool Corporation, 2006-2007 Catalog, p. 17, CAT2006-07/9-06/500m/IPC, Printed in USA.

Testing and Measurement, Greenlee: A Textron Company, pp. 308-350, 2007.

International Safety Systems Inc.: Fire, Safety and Industrial Supplies, 16 pages, published in 2007.

PS200 Ferroscan, Hilti USA, available online at: <http://www.us.hilti.com/holus/modules/prcat/prca$_{13}$ fuse.jsp?RANGE_OID=35223>, publicly available before Mar. 6, 2009.

Extech Instruments, New Products Fall 2004, 12 pages, 2004.

Heavy-Duty 18V Cordless Rotary Laser—Combo Kit (Int/Ext)—DW073KD, DeWalt, available online at: <http://www.dewalt.com/us/products/tool_detail.asp?productID=2901>, 2 pages, printed Jun. 5, 2009, publicly available before Mar. 6, 2009.

Extech Instruments, "Newly Patented EX470 Combination Multimeter/IR Thermometer", New Equipment Digest, available online at: <http://www.newequipment.com/303/ProductDetail/62102/303-6550/Newly_Patented_EX470_Combination_Multimeter_IR_Thermometer.aspx>, Jun. 19, 2007.

Fluke T5-600/62/1AC IR Thermometer, Electrical Tester and Voltage Detector Kit, Fluke, available online at: <http://us.fluke.com/usen/products/62+T5+Kit.htm?catalog_name=FlukeUnitedStates&category=INFTHE(FlukeProducts)>, 2 paages, printed Apr. 21, 2009, publicly available before Mar. 6, 2009.

Oscilloscopes for Field Applications, Fluke, 5 pages, publicly available before Mar. 6, 2009.

ThermaCAM P620 Infrared Camera, FLIR Systems: The Global Leader in Infrared Cameras, 2 pages, publicly available before Mar. 6, 2009.

D-tect 100 Bosch Wall Scanner Bosch D-tect 100, Power Tools UK, available online at: <http://www.powertoolsuk.co.uk/webcat/details.asp?ProductCode=D-tect%20100&ID=957>, publicly available before Mar. 6, 2009.

BP120 Rechargeable Ni-Cad Battery Pack, Fluke, available online at: <http://us.fluke.com/usen/products/AccessoryDetail.htm?cs_id=8301%28FlukeProducts%29&catalog_name=FlukeUnitedStates&category=BATT(FlukeProducts)>, 1 page, printed Jun. 5, 2009, publicly available before Mar. 6, 2009.

MS2008B 3 3/4 Mini Autorange Digital Clamp Meter, Precision Mastech Enterprises Co., LTD., available online at: <http://www.p-mastech.com/products/05_acdcdcm/ms2008b.html>, 2007.

116/322 HVAC Combo Kit, Fluke, available online at: <http://us.fluke.com/usen/products/16+322+KIT.htm?catalog_name=FlukeUnitedStates&category=HMA(FlukeProducts)>, 1 page, printed Apr. 21, 2009, publicly available before Mar. 6, 2009.

62/322/1AC IR Thermometer, Clamp Meter and Voltage Detector Kit, Fluke, available online at: <http://us.fluke.com/usen/products/62+322+Kit.htm?catalog_name=FlukeUnitedStates&category=INFTHE(FlukeProducts)>, 1 page, printed Apr. 21, 2009, publicly available before Mar. 6, 2009.

Testo AG—testo 830-T3, Practical Measuring Instruments for Non-Contact Measurements, available online at: <http://www.testo.us/online/abaxx-?$part=PORTAL.USA.ProductCategoryDesk.activearea.catalog.ProductDetail.details.probes>, 4 pages, at least as early as Jun. 19, 2008.

FLIR Systems—The Global Leader in Infrared Cameras, ThermaCAM P620 Infrared Camera, www.goinfrared.com/P620, 2007.

Eutech Instruments—Technology Made Easy, OAKTON TempTestr IR, http://www.eutechinst.com, 2 pages, at least as early as Apr. 3, 2008.

Cole-Parmer Instrument Company, "Infrared Thermometry and its Applications", Sales Tip #3, 1999.

Fluke, Fluke 50 Series II Thermometers, Catalog, available online at: <http://us.fluke.com/usen/Products/Fluke+50+Series+II.htm?catalog_name=FlukeUnitedStates&category=DTHE(FlukeProducts)>, at least as early as Apr. 21, 2009.

Fluke, Fluke 570 Precision Infrared Thermometers, available online at: <http://us.fluke.com/usen/products/Fluke+570+Series.htm>, 2 pages, at least as early as Apr. 16, 2009.

Garber, Warren, C., et al., "Applying Distance to Spot Ratio Values to Infrared Imagers for Accurate Temperature Measurement", IRINFO, Infraspection Institute, Burlington, NJ, Oct. 20, 2002.

Milwaukee Electric Tool—News and Media, Milwaukee Introduces M12 Sub-Scanner Detection Tool, Press Releases, available online at: <http://www.milwaukeetool.com/NewsAndMedia/PressReleases/Milwaukee(R)_Introduces_M12_Sub-Scanner(TM)_Detection_Tool/995>, May 1, 2009.

Bosch, Precise detection with the Wallscanner D-tect 150 Professional from Bosch, Press Release, PI 6588 PT MS, Sep. 2009.

D-tect 150 User Manual, pp. 18-29, available online at: <http://www.bosch-pt.dk/boptocs2-dk/modules/oragetblob.dll/WallscannerD-tect150_manual.pdf?db=ocsr55_s041&item=OCSHEIMWPDF.v$m$d$lobvalues.r55&id=60862,5600,17&filenanne=WallscannerD-tect150_manual.pdf>, Jul. 14, 2009.

Bosch Swedish Products Flyer, available online at: <http://www.bosch-pt.dk/mam/bosch-pt-centralpool/professional/newsandextras/news/promo_dk_20100504.pdf>, May 4, 2010.

Hilti, PX 10 Transpointer, Hilti USA, available online at: <http://www.us.hilti.com/holus/page/module/product/prca_rangedetail.jsf?lang=en&nodeId=-72691>, available at least as early as Apr. 21, 2009.

Office Action from the United Kingdom Intellectual Property Office for Application No. 1017744.2 dated Jan. 24, 2012 (3 pages).

Office Action from the United States Patent Office for U.S. Appl. No. 12/421,455 dated Oct. 31, 2011 (14 pages).

Office Action from the United States Patent Office for U.S. Appl. No. 12/554,684 dated Nov. 9, 2011 (18 pages).

Search Report from the United Kingdom Intellectual Property Office for Application No. 1210676.1 dated Jul. 4, 2012 (5 pages).

Office Action from the United States Patent and Trademark Office for U.S. Appl. No. 12/554,684 dated Apr. 23, 2012 (21 pages).

Office Action from the United States Patent and Trademark Office for U.S. Appl. No. 12/421,455 dated May 24, 2012 (17 pages).

Chicago Electric Power Tools, 18 Volt Cordless Chainsaw, 2000, available at http://images.harborfreight.com/manuals/44000-44999/44493.PDF.

* cited by examiner

TEST AND MEASUREMENT DEVICE WITH A PISTOL-GRIP HANDLE

RELATED APPLICATIONS

This application is a continuation-in-part of prior filed co-pending U.S. patent application Ser. No. 12/399,835, filed Mar. 6, 2009, the entire contents of which are hereby incorporated by reference. This application also claims the benefit of prior filed U.S. provisional patent application Ser. No. 61/043,455, filed on Apr. 9, 2008, and Ser. No. 61/095,053, filed on Sep. 8, 2008, the entire contents of which are both hereby incorporated by reference.

BACKGROUND

Test and measurement devices, such as digital multimeters ("DMM's"), clamp meters, thermometers, stud sensors, and the like, are powered by replaceable or rechargeable alkaline batteries. For example, a typical test and measurement device includes a receiving area on a bottom or back face of the device that is adapted to receive a plurality (e.g., 2, 3, 4, etc.) of alkaline batteries. The batteries are secured in the receiving area via a removable door or plate which is fixedly attached to the device's housing. The alkaline batteries, which typically have a nominal voltage of 1.5V, are connected in series to provide operational power to the devices.

In many instances, these devices have dedicated functionalities. For example, a DMM is capable of measuring electrical characteristics such as voltage and current and displaying an indication of the measured electrical characteristic. Clamp meters have similar or identical functionality to the DMM, but differ in the manner in which some of the electrical characteristics are measured (e.g., using inductive coupling). Thermometers, such as infrared ("IR") thermometers, include a detector and a laser source for projecting an indication of the location or size of a sensed area. Stud sensors include the capability of detecting wooden or metal studs hidden behind a surface and providing an indication of a sensed stud via light emitting diodes ("LEDs") or an audible indicator such as a small speaker.

SUMMARY

In one embodiment, the invention provides a test and measurement device configured to receive a removable and rechargeable battery pack. The test and measurement device includes a main body having a first axis, a handle having a second axis, a first recess, and a second recess. The first recess includes a mating interface for receiving, along the second axis, a first attachment operable to provide power to the test and measurement device, and the second recess is configured to receive a second attachment operable to provide operational control for the test and measurement device. The handle is offset from the main body of the test and measurement device, and is attached to a lower portion of the main body along the second axis such that the handle forms an oblique angle with respect to the first axis.

In another embodiment, the invention provides a clamp meter configured to receive a removable and rechargeable battery pack. The clamp meter includes a main body having a first axis, a handle, a clamp, a trigger, and a display. The handle has a second axis and includes a first recess configured to receive the battery pack. The first recess includes at least first and second electrical terminals which are exposed when the battery pack is not inserted into the first recess. The second axis forms an oblique angle with the first axis, and the battery pack is inserted into the first recess along the second axis. The clamp is coupled to the main body, aligned with the first axis, and operable to measure an electrical characteristic of a conductor based on an induced current. The trigger is operable to selectively open and close the clamp, and the display is configured to display an indication of the electrical characteristic.

In another embodiment, the invention provides a method of operating a clamp meter that includes a main body, a handle, a clamp, and a pair of electrical leads. The method includes powering the clamp meter with a removable battery pack inserted into a recess of the handle; sensing, using the clamp, a first electrical characteristic based on an induced current; measuring, based on signals received through the pair of electrical leads, a second electrical characteristic; and displaying, on a display, an indication of the first electrical characteristic and the second electrical characteristic. The pair of electrical leads are operable to receive a pair of electrical probes, the battery pack is inserted along a first axis, the clamp is aligned along a second axis, and the first axis and the second axis form an oblique angle.

Other aspects of the invention will become apparent by consideration of the detailed description and accompanying drawings.

DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Test and measurement devices (e.g., wall scanners, thermometers, digital multimeters ("DMMs"), clamp meters, etc.) and other non-motorized sensing tools are generally lightweight and low-power consumption devices which are powered by one or more alkaline batteries. Removable and rechargeable batteries (e.g., nickel-cadmium ("NiCd") or nickel-metal hydride ("NiMH") batteries), such as those used in power tools, cannot reasonably be used with test and measurement devices because of the batteries' size and weight. However, lithium-ion battery packs enable the use of high-voltage removable and rechargeable battery packs with these non-motorized sensing tools.

As a result of the test and measurement devices receiving operational power from battery packs with lithium-based chemistries, the devices are capable of including a variety of features or functions in addition to their traditional features and functions, which increase the power demand of the devices. For example, a clamp meter can include a high-intensity LED flashlight, a non-contact voltage detector, a thermocouple, a backlighted control section or actuators, a high-resolution LCD, a color LCD, and/or an additional or remote display. Conventionally powered clamp meters (e.g., clamp meters powered by alkaline batteries) are either unable to provide the required voltage and current to power these additional features, or the operational runtime (i.e., the amount of time for which the batteries can power the clamp meter before the batteries need to be replaced or recharged) of the alkaline batteries is shortened. In contrast, the lithium-based battery packs are capable of powering the additional features of the clamp meter as well as the traditional features and functions, while maintaining an operational runtime that is comparable to or longer than a conventional clamp meter that does not include additional features. Additional test and measurement devices, such as infrared ("IR") thermometers and wall scanners, are also able to include additional features and functions when powered by the lithium-based battery packs.

Figure 1:
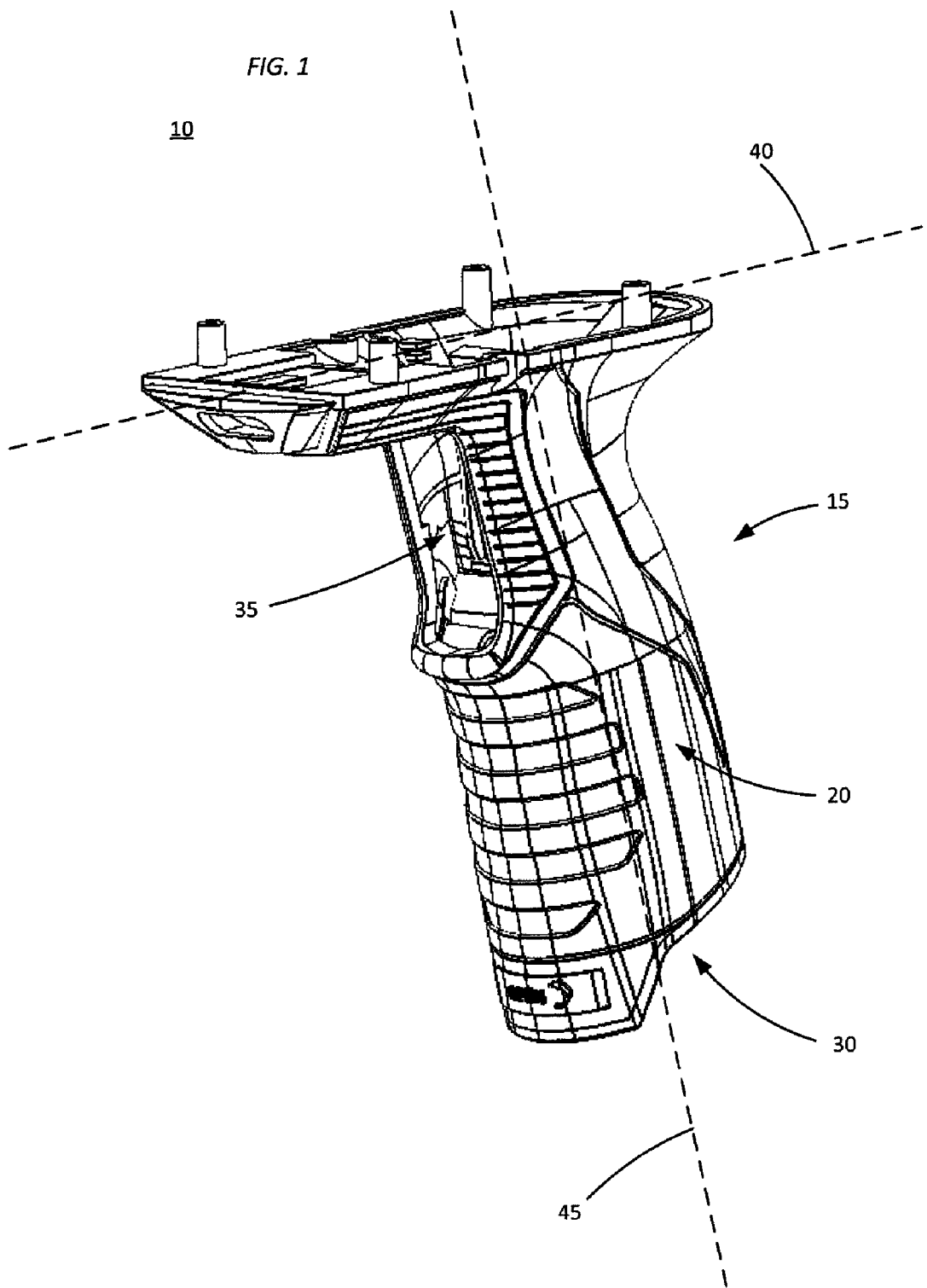
FIG. 1 is a front perspective view of a handle of a test and measurement device according to an embodiment of the invention.
Figure 2:
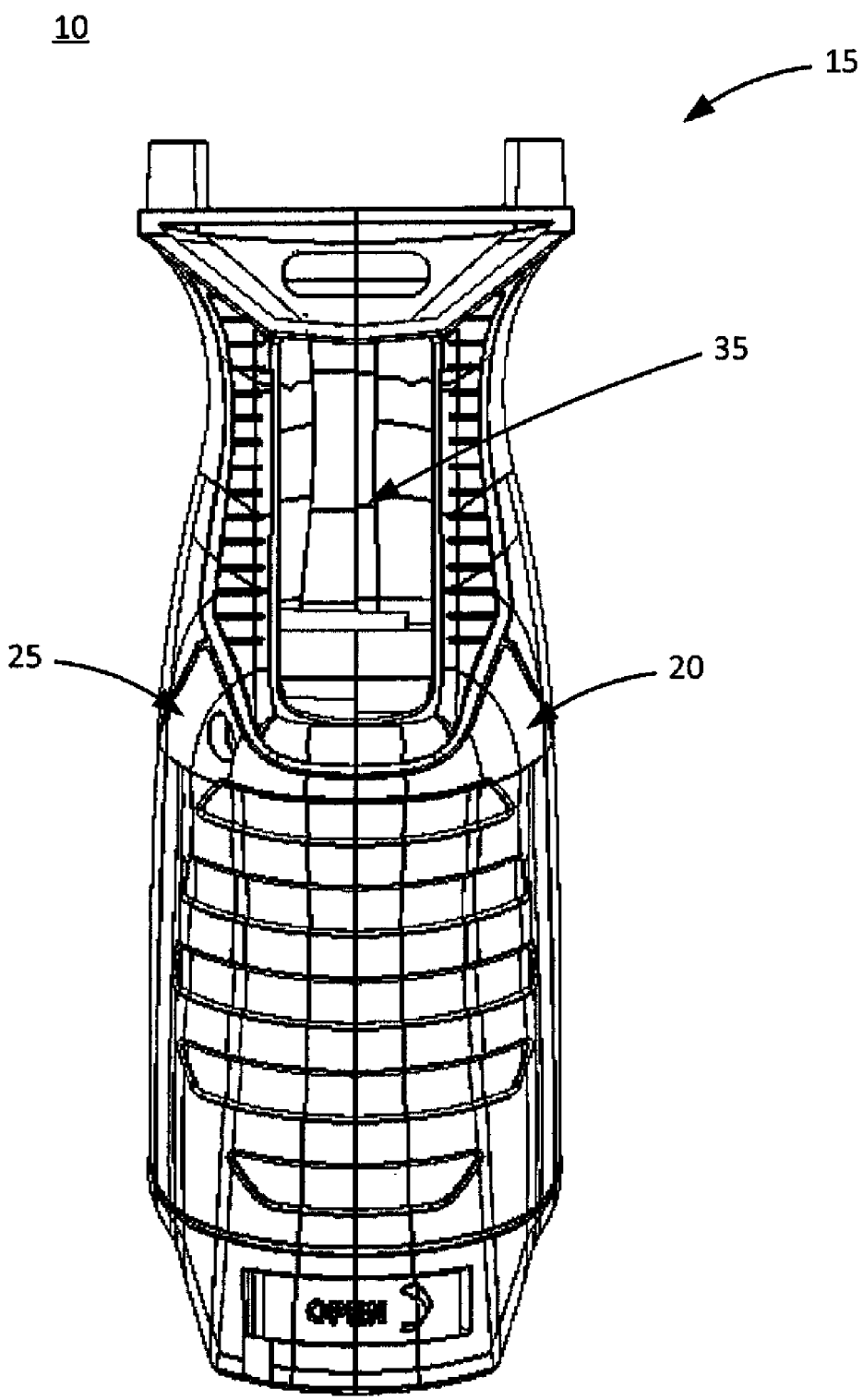
FIG. 2 is a front view of the handle of FIG. 1.
Figure 3:
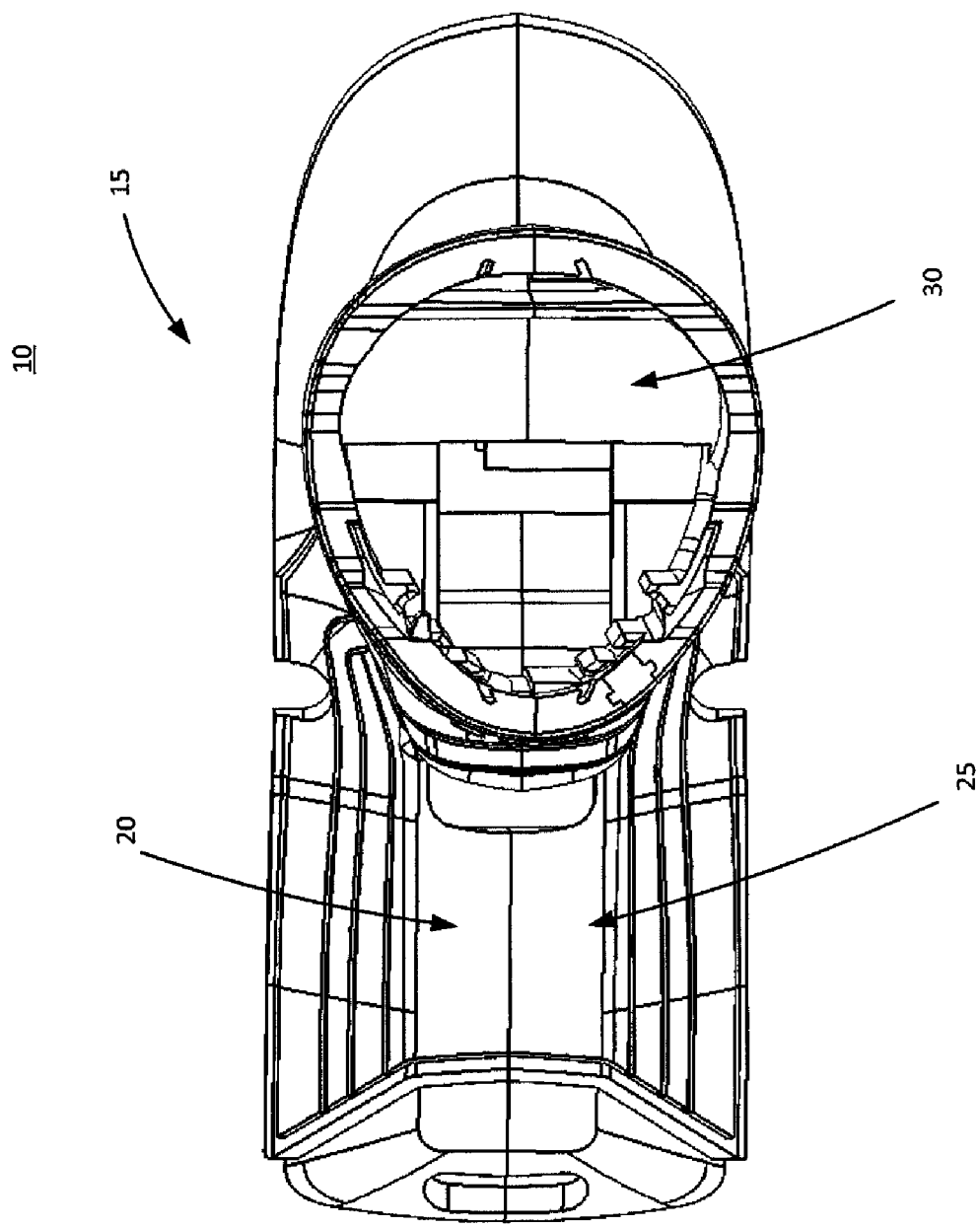
FIG. 3 is a bottom view of the handle of FIG. 1.

An embodiment of the invention is described with respect to a handle for a test and measurement device, such as the handle 10 illustrated in FIGS. 1, 2, and 3. The handle 10 is a pistol-grip handle and includes an outer casing 15 and a plurality of recesses. The outer casing 15 includes, for example, a first half 20 and a second half 25. The first and second halves 20 and 25 of the outer casing 15 are fixedly attached to one another in, for example, a clamshell configuration. The first half 20 and the second half 25 form the plurality of recesses when coupled to one another. In other embodiments, the handle 10 is molded as a single piece. A first recess 30 includes a mating interface, such as, for example, rails or a mating groove (not shown) for slidably receiving an attachment, such as the battery pack. A second recess 35 is configured to receive a control device, such as, for example, a trigger or a knob for controlling at least a portion of the operation of the device. In other embodiments of the invention, more or fewer recesses are included. The handle 10 is further configured to ergonomically conform to the shape of a user's hand (right or left) such that the device can be held and operated using a single hand without the user having to divert his or her line-of-sight, as described below.

The handle 10 is configured to offset a holding position of the device to align a display, the control device, and the operation of the device with the user's line-of-sight or a first axis 40. The handle 10 is attached to a lower portion of a main body of the device along a second axis 45 such that the handle 10 is at an oblique angle with respect to the first axis 40. In other embodiments, the handle 10 is approximately perpendicular to the main body. The battery pack is inserted into the first recess 30 and along the second axis 45 of the handle 10 to provide power to the test and measurement device.

Figure 4:
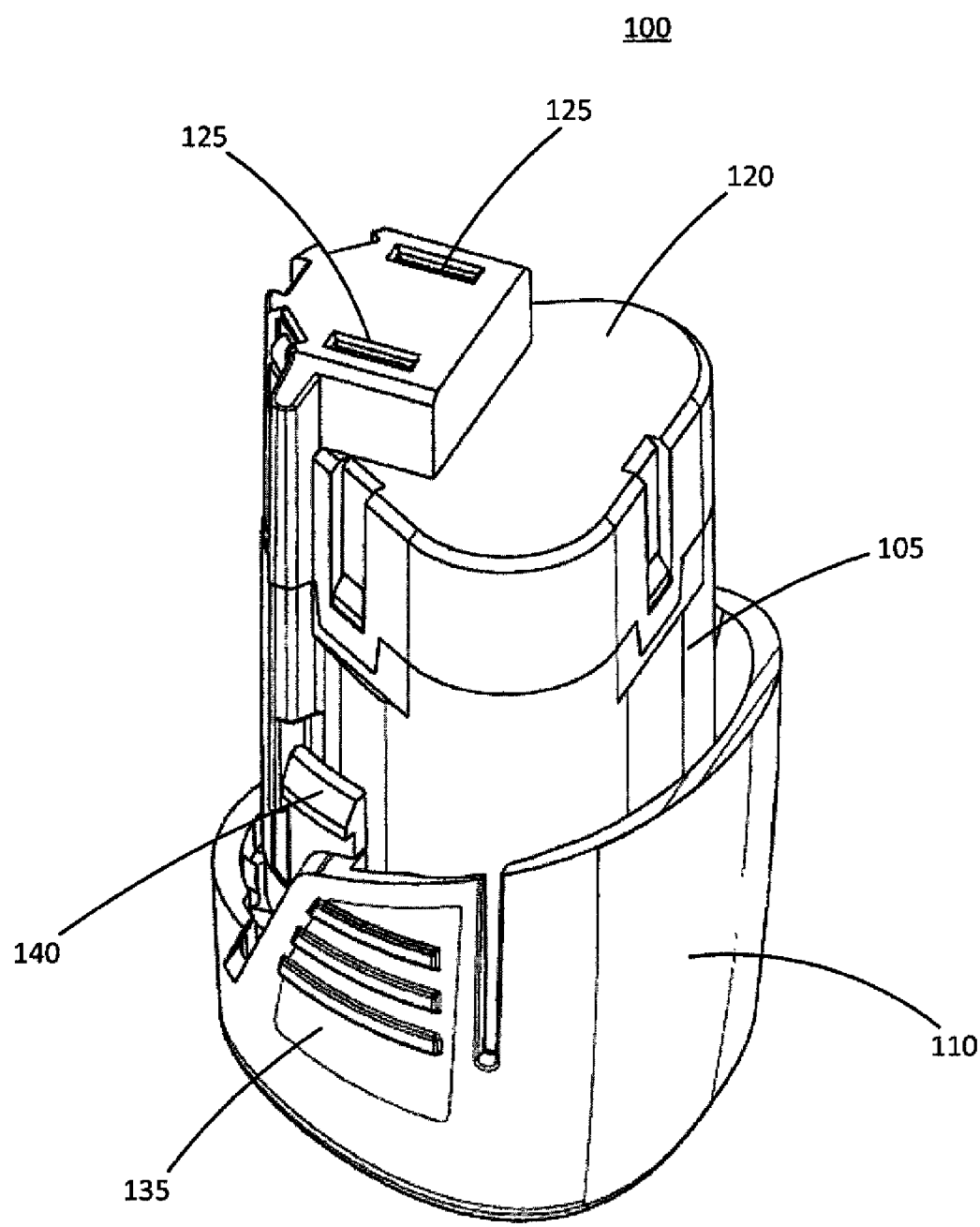
FIG. 4 is a perspective view of a battery pack.
Figure 5:
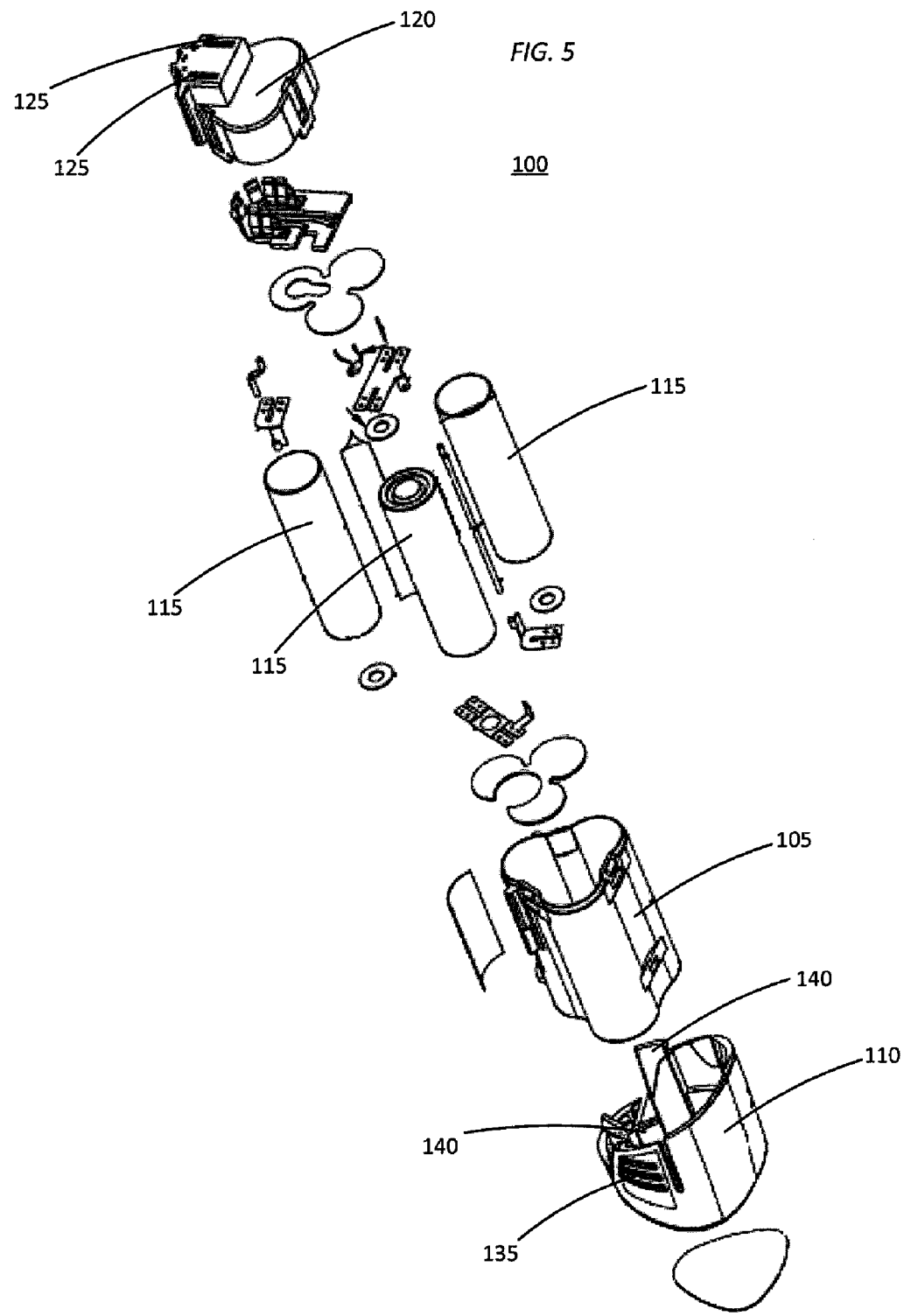
FIG. 5 is an exploded view of the battery pack of FIG. 4.
Figure 6:
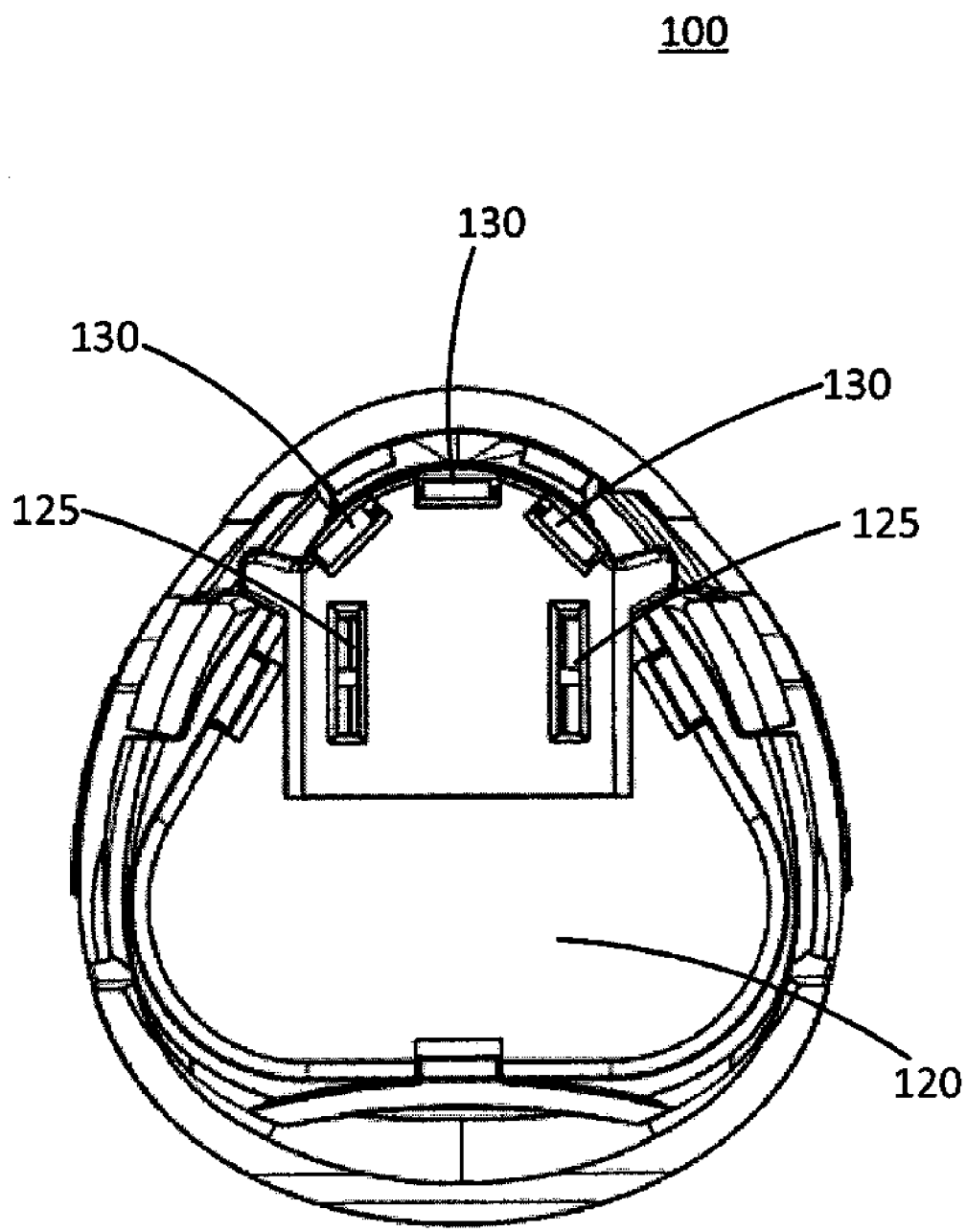
FIG. 6 is a top view of the battery pack of FIG. 4.

An embodiment of a lithium-based battery pack for powering the test and measurement device is illustrated in FIGS. 4, 5, and 6. In the illustrated embodiment, the battery pack 100 includes battery cells having a lithium-based chemistry such that the battery pack 100 is over 65% lighter and 50% smaller than an equivalent nickel-cadmium ("NiCd") battery pack. The lithium-ion battery pack 100 also provides a longer operational run-time for the test and measurement device, and a longer life (e.g., number of recharge cycles) than the other non-lithium-based battery packs.

Figure 11:
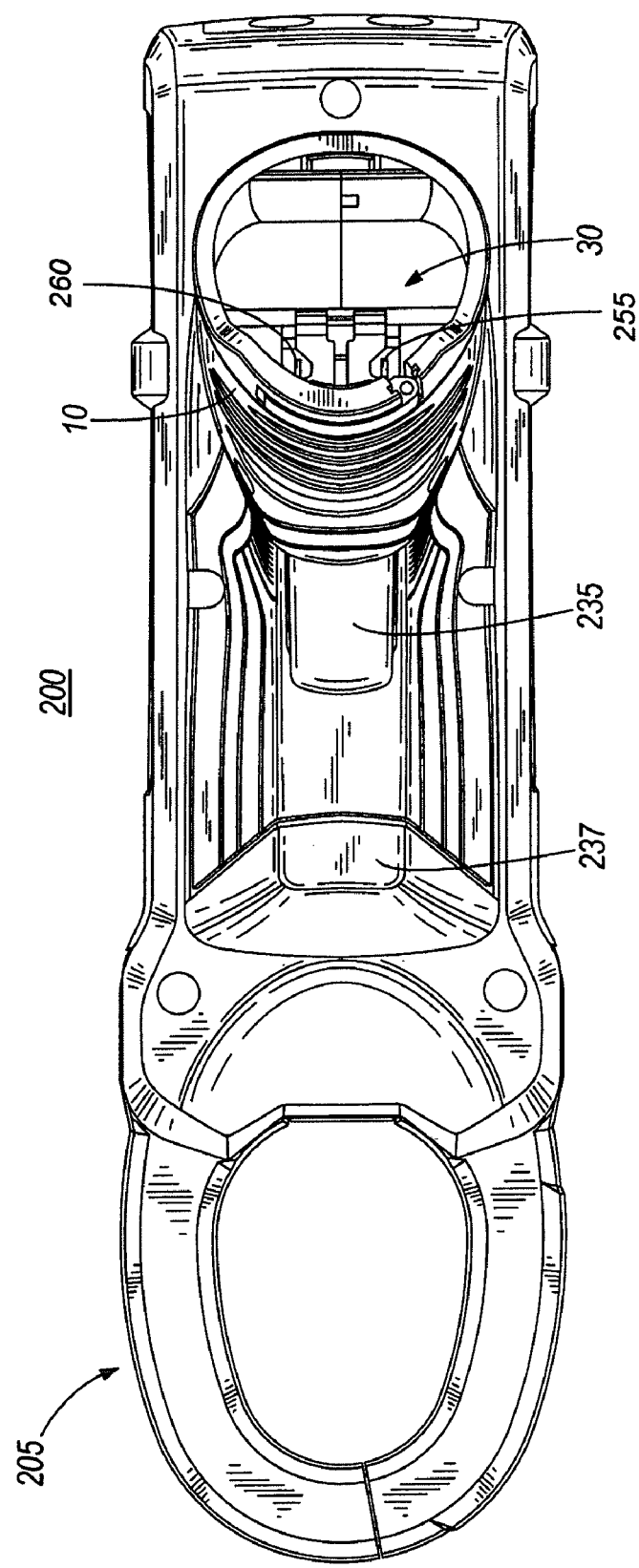
FIG. 11 is a bottom view of the clamp meter of FIG. 7.
Figure 12:
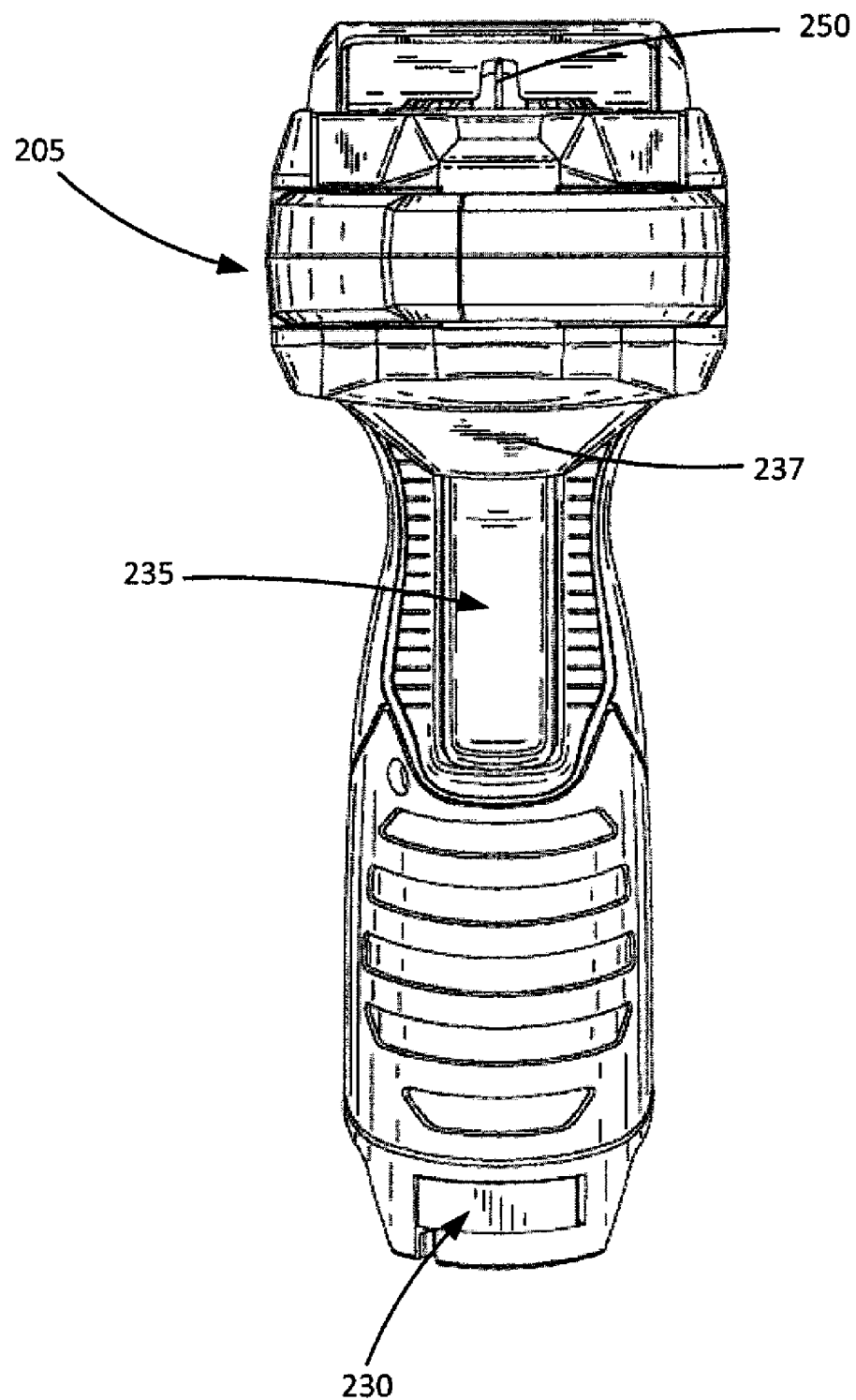
FIG. 12 is a front view of the clamp meter of FIG. 7.
Figure 13:
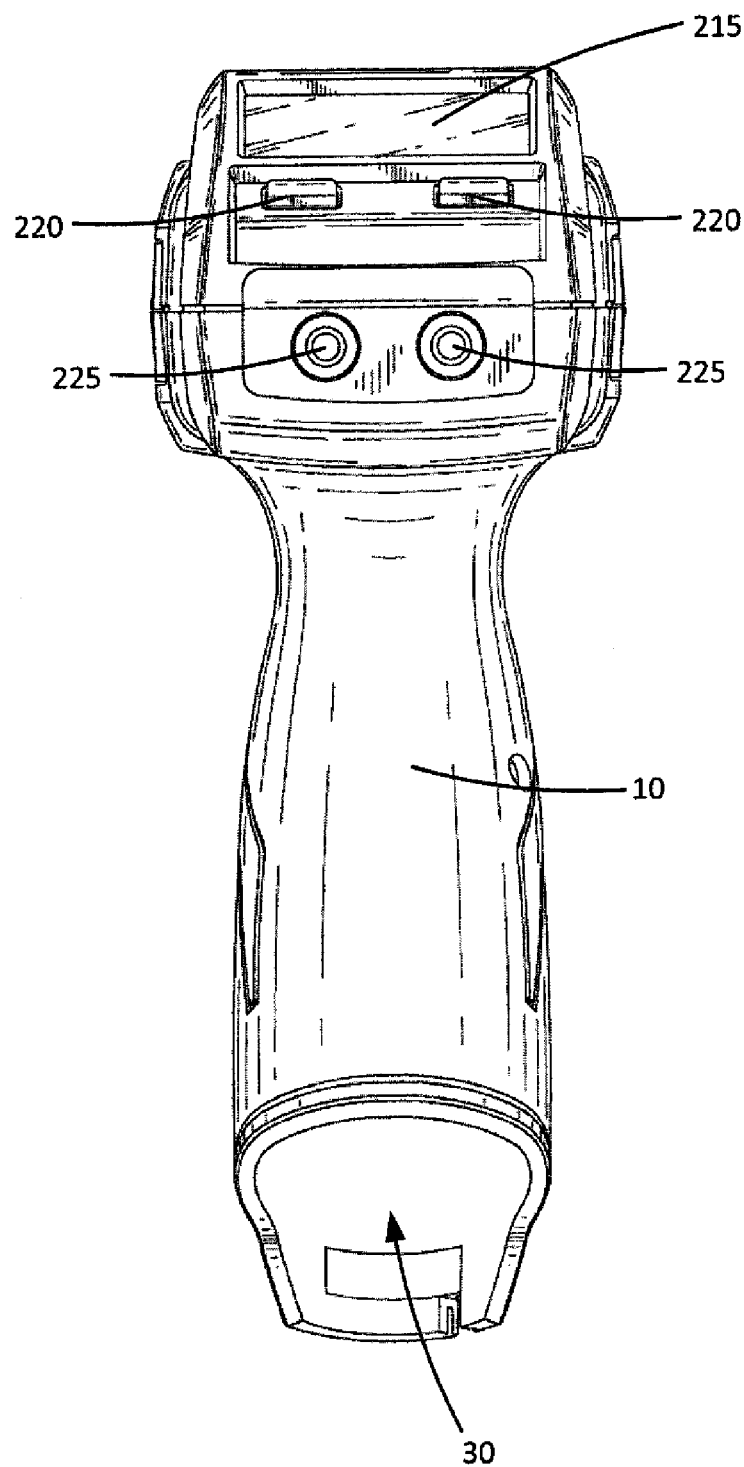
FIG. 13 is a rear view of the clamp meter of FIG. 7.

The illustrated battery pack 100 includes a casing 105, an outer housing 110 coupled to the casing 105, and a plurality of battery cells 115 (see FIG. 5) positioned within the casing 105. The casing 105 is shaped and sized to fit within the recess 30 in the device to connect the battery pack 100 to the device. The casing 105 includes an end cap 120 to substantially enclose the battery cells 115 within the casing 105. The illustrated end cap 120 includes two power terminals 125 configured to mate with corresponding power terminals 255 and 260 of the device (e.g., see FIG. 11). In other embodiments, the end cap 120 may include terminals 125 that extend from the battery pack 100 and are configured to be received in receptacles supported by the device. The end cap 120 also includes sense or communication terminals 130 (see FIG. 6) that are configured to mate with corresponding terminals from the device. The terminals 130 couple to a battery circuit (not shown). The battery circuit can be configured to monitor various aspects of the battery pack 100, such as pack temperature, pack and/or cell state of charge, etc. and can also be configured to send and/or receive information and/or commands to and/or from the device. In one embodiment, the battery circuit operates as illustrated and described in U.S. Pat. No. 7,157,882 entitled "METHOD AND SYSTEM FOR BATTERY PROTECTION EMPLOYING A SELECTIVELY-ACTUATED SWITCH," issued Jan. 2, 2007, the entire contents of which are hereby incorporated by reference. In another embodiment, the battery circuit operates as illustrated and described in U.S. Patent Publication No. 2006/0091858 entitled "METHOD AND SYSTEM FOR BATTERY PROTECTION," filed May 24, 2005, the entire contents of which are also hereby incorporated by reference.

The casing 105 and power terminals 125 substantially enclose and cover the terminals 255 and 260 of the device when the pack 100 is positioned in the recess 30. That is, the battery pack 100 functions as a cover for the recess 30 and terminals 255 and 260 of the device. Once the battery pack 100 is disconnected from the device and the casing is removed from the recess 30, the battery terminals 255 and 260 on the device are generally exposed to the surrounding environment.

The outer housing 110 is coupled to an end of the casing substantially opposite the end cap 120 and surrounds a portion of the casing 105. In the illustrated construction, when the casing 105 is inserted into or positioned within the corresponding recess 30 in the device, the outer housing 110 generally aligns with an outer surface of the handle. In this construction, the outer housing 110 is designed to substantially follow the contours of the device to match the general shape of the handle. In such embodiments, the outer housing 110 generally increases (e.g., extends) the length of the handle 10 of the test and measurement device.

In the illustrated embodiment, two actuators 135 (only one of which is shown) and two tabs 140 are formed in the outer housing 110 of the battery pack 100. The actuators 135 and the tabs 140 define a coupling mechanism for releasably securing the battery pack 100 to the device. Each tab 140 engages a corresponding recess formed in the device to secure the battery pack 100 in place. The tabs 140 are normally biased away from the casing 105 (i.e., away from each other) due to the resiliency of the material forming the outer housing 110. Actuating (e.g., depressing) the actuators 135 moves the tabs 140 toward the casing 105 (i.e., toward each other) and out of engagement with the recesses such that the battery pack 100 may be pulled out of the recess 30 and away from the device. The device also includes a secondary battery lock (described below) which must be released before the battery pack 100 can be removed from the device. In other embodiments, the battery pack 100 may include other suitable coupling mechanisms to releasably secure the battery pack 100 to the device, as discussed below.

As shown in FIG. 5, the battery pack 100 includes three battery cells 115 positioned within the casing 105 and electrically coupled to the terminals 125. The battery cells 115 provide operational power (e.g., DC power) to the test and measurement device. In the illustrated embodiment, the battery cells 115 are arranged in series, and each battery cell 115 has a nominal voltage of approximately four-volts ("4.0V"), such that the battery pack 100 has a nominal voltage of approximately twelve-volts ("12V"). The cells 115 also have a capacity rating of approximately 1.4 Ah. In other embodiments, the battery pack 100 may include more or fewer battery cells 115, and the cells 115 can be arranged in series, parallel, or a serial and parallel combination. For example, the battery pack 100 can include a total of six battery cells 115 in a parallel arrangement of two sets of three series-connected cells. The series-parallel combination of battery cells 115 creates a battery pack 100 having a nominal voltage of approximately 12V and a capacity rating of approximately 2.8 Ah. In other embodiments, the battery cells 115 may have different nominal voltages, such as, for example, 3.6V, 3.8V, 4.2V, etc., and/or may have different capacity ratings, such as, for example, 1.2 Ah, 1.3 Ah, 2.0 Ah, 2.4 Ah, 2.6 Ah, 3.0 Ah, etc. In other embodiments, the battery pack 100 can have a different nominal voltage, such as, for example, 10.8V, 14.4V, etc. In the illustrated embodiment, the battery cells 115 are lithium-ion battery cells having a chemistry of, for example, lithium-cobalt ("Li—Co"), lithium-manganese ("Li—Mn"), or Li—Mn spinel. In other embodiments, the battery cells 115 may have other suitable lithium or lithium-based chemistries.

Another embodiment of the invention is described with respect to a clamp meter 200 as illustrated in FIGS. 7-13. The clamp meter 200 includes, among other things, the handle 10 described above, a clamp 205, a main body 210, an embedded display 215, a plurality of control buttons 220, electrical terminals or leads 225, an aperture for a secondary battery lock 230 (see FIG. 12), a control device or trigger 235, a jaw mechanism (see FIG. 9), a flashlight 237, and a non-contact voltage detector (not shown). The handle 10 is also operable to receive the battery pack 100. The clamp meter 200 is operable to measure various electrical properties or characteristics of circuit elements such as wires, resistors, capacitors, and the like.

The clamp 205 is attached to a front portion 240 of the main body 210 along the first axis 40 such that the handle 10 also forms an oblique angle with respect to the clamp 205. The clamp 205 supports and encloses a magnetic core for measuring current flowing through an object or medium (e.g., a wire). The clamp 205 allows a user to measure, for example, the electrical current flowing through the circuit element without disconnecting the element from the corresponding circuit. When the clamp 205 is opened, a conductor (e.g., a wire) is positioned within an opening defined by the clamp 205 such that the magnetic core substantially surrounds the wire. When the clamp 205 is closed, an alternating current flowing through the conductor induces a current in the clamp 205.

The display 215 is attached to a rear portion 245 of the main body 210 along the first axis 40. The user's line-of-sight is aligned with or parallel to the first axis 40. In the illustrated embodiment, the display 215 is a liquid crystal display ("LCD"), such as a negative LCD ("NLCD") with an electroluminescent backlight, but may alternatively be another suitable type of display. The negative LCD includes lighted symbols, such as white alphanumeric symbols, on a black background. The NCLD improves the visibility of the display 215 in low or poor lighting conditions, such as outdoor, dark, or dirty conditions. In some embodiments, the display 215 is at a first angle with respect to the first axis 40 to improve the visibility of the display 215. The display 215 also includes a screen timeout period which is either preprogrammed or set by the user. If the screen timeout period is reached or lapses and no control buttons 220 are actuated and/or no measurements are taken, the display 215 enters a standby or power saving mode to conserve power.

The control buttons 220 are positioned proximate to the display 215, on the handle 10, on the main body 210, or any combination thereof. The position and configuration of the buttons 220 allow the clamp meter 200 to be controlled without the user having to divert his or her line-of-sight from the display 215 or the operation of the clamp meter 200. The control buttons 220 are operable to select functions and adjust settings of the clamp meter 200. For example, one control button 220 may be actuated to zero the clamp meter, one control button 220 may be actuated to change the units of a displayed value (e.g., from Fahrenheit to Celsius), one control button 220 may be actuated to temporarily hold or save a displayed value, one control button 220 may be actuated to display minimum and maximum measured values, and one control button 220 may be actuated to display only a peak or inrush value.

The clamp meter 200 also includes positive and negative terminals 225 positioned on the rear portion 245 of the main body 210 substantially opposite the clamp 205. The terminals 225 are operable to receive electrical leads for probes (not shown), allowing a user to test other electrical characteristics or properties of a circuit. For example, the terminals 225 can be used to measure AC and DC current, AC and DC voltages, resistance, and capacitance of various circuit elements. In some embodiments, the terminals 225 are operable to receive a contact temperature sensor such as a thermocouple (e.g., a K-type thermocouple). The thermocouple includes two metallic elements (e.g., a hot junction and a cold junction) which provide differing output voltages. The difference between the output voltages is used to determine a contact temperature measurement. An ambient temperature sensor (not shown) such as a thermistor can be used in combination with a look-up table for cold junction compensation of the thermocouple. In some embodiments, the thermocouple is operable to detect temperatures in the range of, for example, −40° C. (−40° F.) to 400° C. (752° F.).

Figure 10:
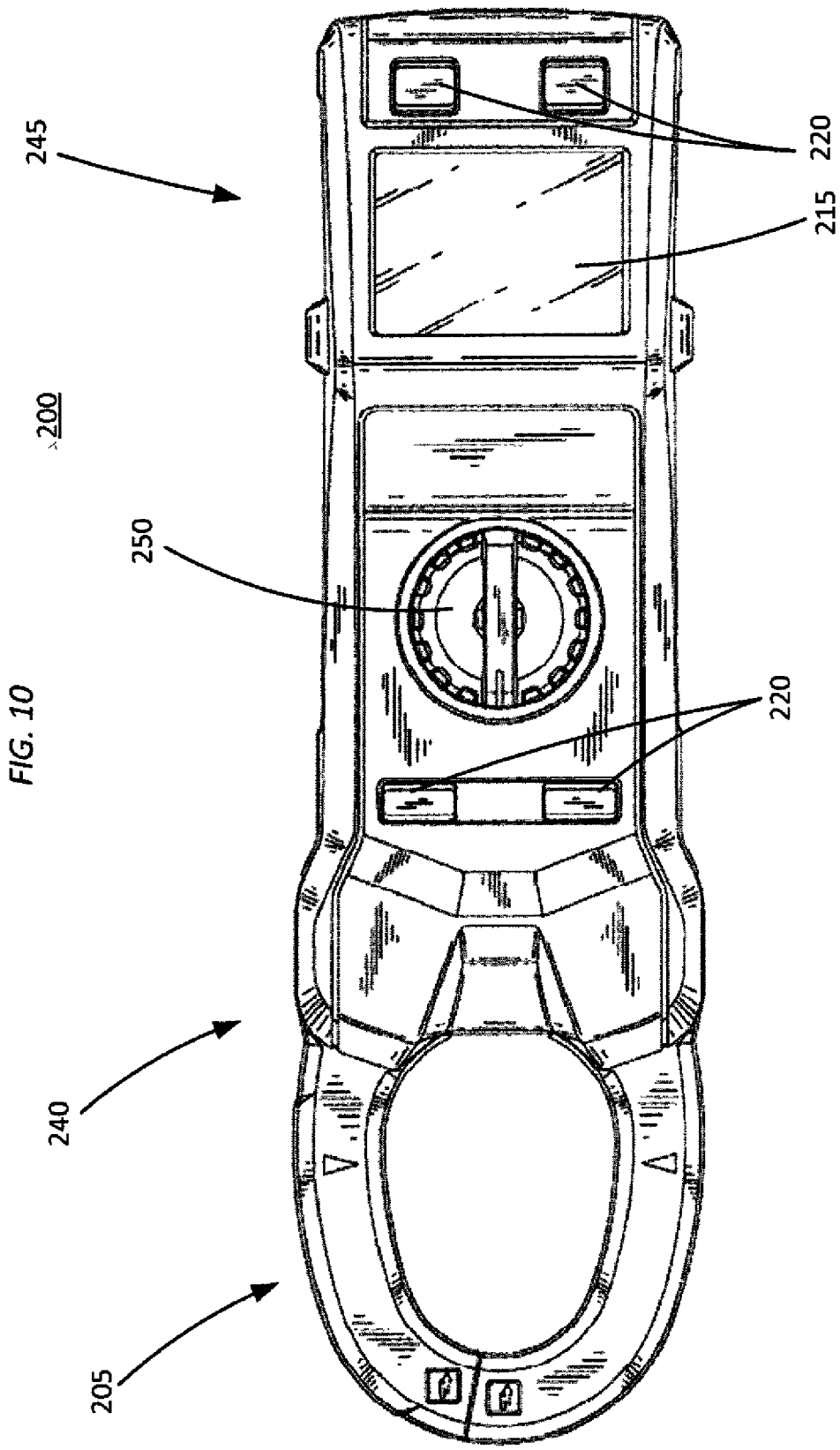
FIG. 10 is a top view of the clamp meter of FIG. 7.

As shown in FIG. 10, the clamp meter 200 also includes a dial 250 supported on an upper surface of the main body 210. The dial 250 is electrically coupled to a controller and is operable to change the operating mode (i.e., the electrical characteristic being tested) of the clamp meter 200. That is, actuating (e.g., rotating) the dial 250 adjusts the electrical characteristic being measured by the clamp meter 200. The electrical characteristics that the clamp meter 200 can measure include, for example, alternating current ("AC"), direct current ("DC"), AC voltage, DC voltage, resistance, capacitance, continuity, and temperature. In addition, one position of the dial 250 is an off position to interrupt current flowing from the battery pack 100 to the clamp meter 200.

Figure 14:
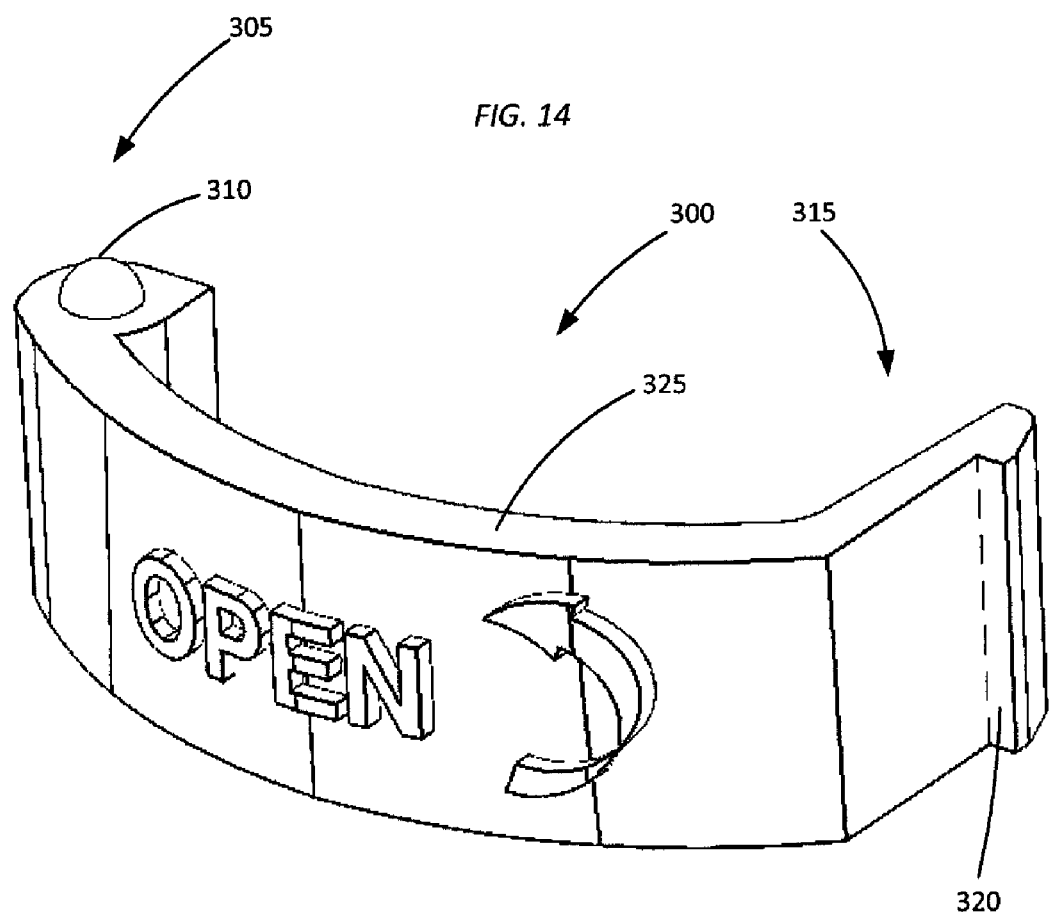
FIG. 14 is a front perspective view of a secondary battery lock according to an embodiment of the invention.
Figure 15:
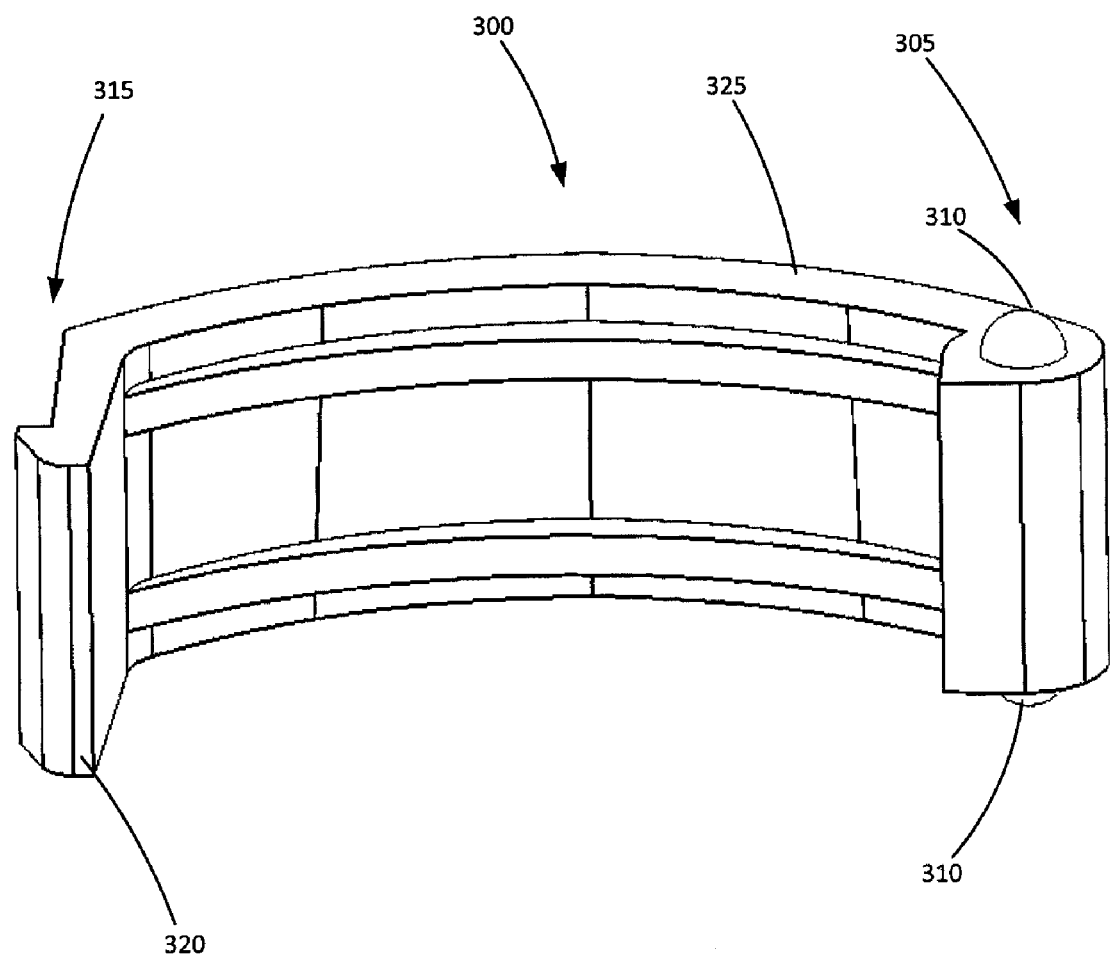
FIG. 15 is a rear view of the secondary battery lock of FIG. 14.
Figure 16:
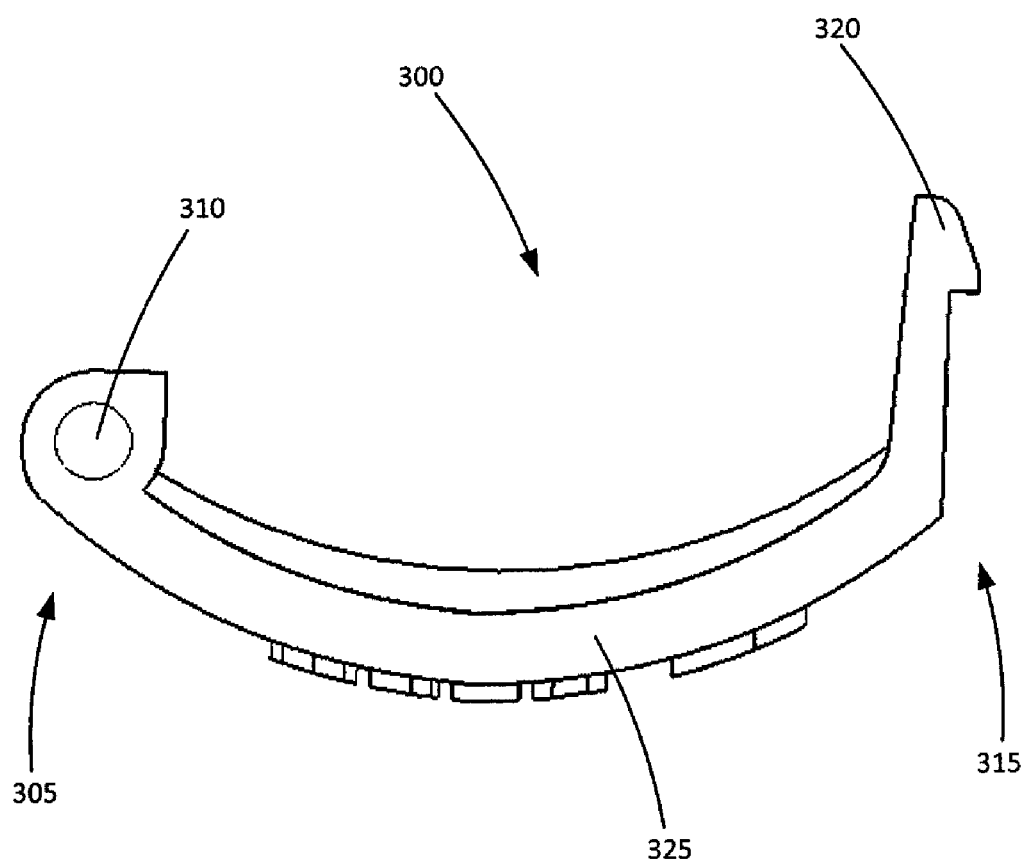
FIG. 16 is a top view of the secondary battery lock of FIG. 14.

In some embodiments, the clamp meter 200 includes a secondary battery lock or redundant locking mechanism or another suitable lockable structure which prevents a user from easily removing the battery pack. For example, in one embodiment, the clamp meter 200 includes a secondary battery lock 300, as shown in FIGS. 14-16. The secondary battery lock 300 works in conjunction with the actuators and tabs of the battery pack 100, and is operable to redundantly secure the battery pack 100 to the clamp meter 200. In the illustrated embodiment, the secondary battery lock 300 includes a first end 305 having ball joints 310 for pivotably coupling the secondary battery lock 300 to the handle 10 of the clamp meter 200. The secondary battery lock 300 includes a second end 315 having a flange 320 for mating with a rib, groove, spine, etc. of the battery pack 100. The secondary battery lock 300 is positioned within the aperture 230 (see FIG. 12) of the handle 10, and is configured such that it is only releasable using a separate tool, such as a flat-headed screwdriver or a knife. As such, the secondary battery lock 300 must be consciously opened or brought out of engagement with the battery pack 100 before the battery pack 100 can be removed. The secondary battery lock 300 also includes an arcuate central portion 325 which connects the first end 305 and the second end 315. The central portion 325 is configured to conform to the contours and curvature of the handle 10. In some embodiments, the central portion 325 is straight and does not conform to the contours of the handle 10.

Figure 17:
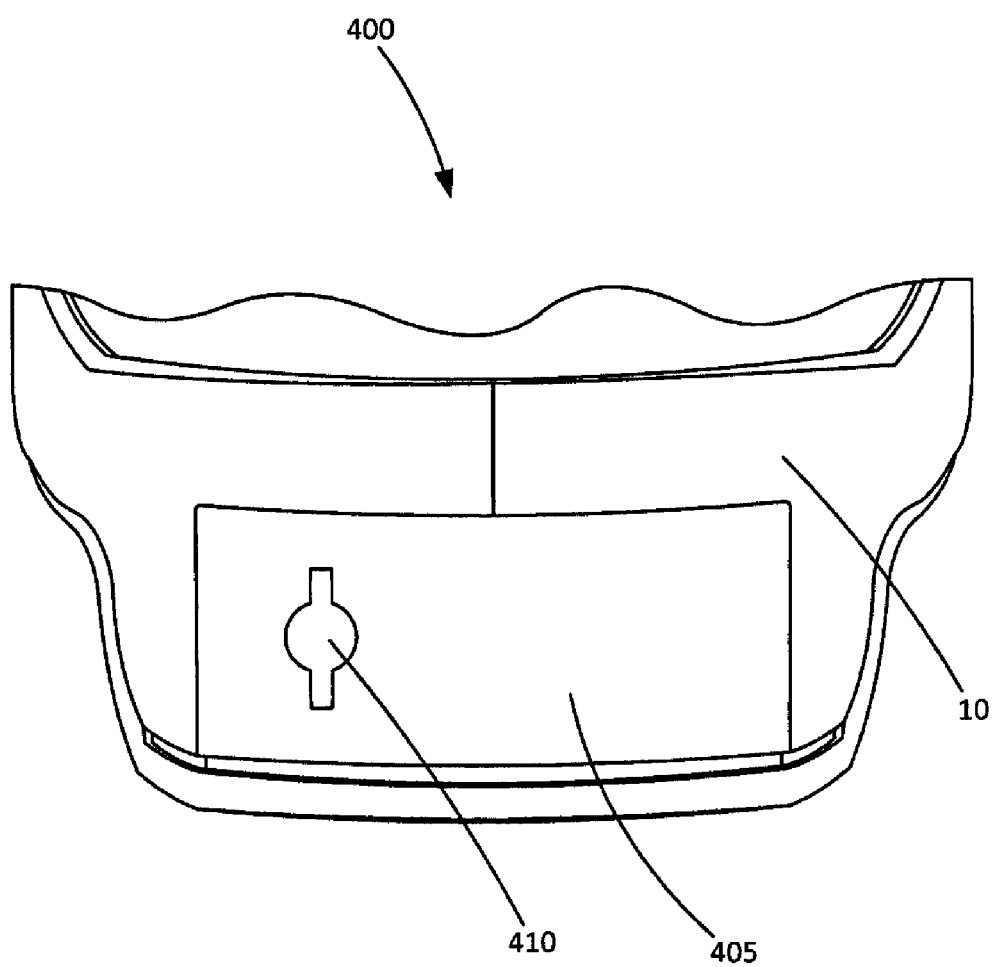
FIG. 17 is a front view of a secondary battery lock according to another embodiment of the invention.

FIG. 17 illustrates a secondary battery lock 400 according to another embodiment. The secondary battery lock 400 is similar to the secondary battery lock 300 described above with respect to FIGS. 14-16. However, the secondary battery lock 400 is positioned behind a surface 405 or door within the aperture 230 of the handle 10. In some embodiments, the secondary battery lock 400 includes a first end having, for example, ball joints for pivotably coupling the secondary battery lock 400 to the housing of the clamp meter. In other embodiments, the secondary battery lock 400 includes a cylindrical recess for receiving a rod, shaft, or pin. In such embodiments, the secondary battery lock 400 pivots about the cylindrical recess. The secondary battery lock 400 includes a second end having a flange for mating with a rib, groove, spine, etc. of the battery pack. The secondary battery lock 400 also includes an arcuate central portion which connects the first end and the second end. The central portion is configured to conform to the contours and curvature of the handle 10.

The secondary battery lock 400 is contacted through a keyhole 410 in the surface 405 of the handle 10. The keyhole 410 is configured such that the secondary battery lock 400 is only releasable using a separate tool, such as a flat-headed screwdriver or a knife. The tool is inserted into the keyhole 410 to contact the secondary battery lock 400, the battery lock 400 is forced to pivot about the first end, and the battery lock disengages the battery pack 100. As such, the secondary battery lock 400 must be consciously opened or brought out of engagement with the battery pack 100 before the battery pack 100 can be removed.

Figure 18:
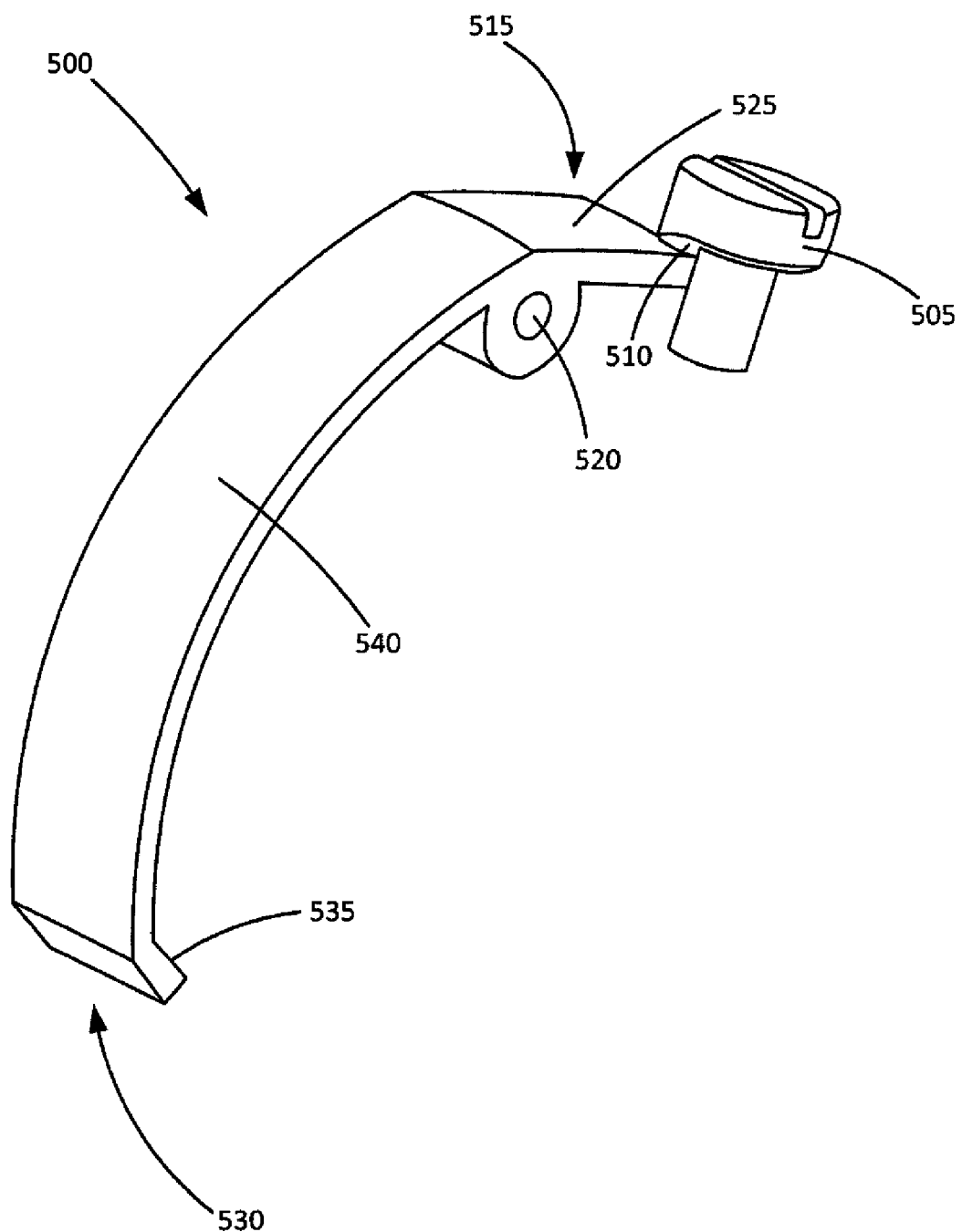
FIG. 18 is a perspective view of a secondary battery lock according to another embodiment of the invention.

FIG. 18 illustrates a secondary battery lock 500 according to yet another embodiment. The secondary battery lock 500 is similar to the secondary battery lock 300 described above with respect to FIGS. 14-16. However, the secondary battery lock 500 includes a screw 505 having a first cam 510. The secondary battery lock 500 includes a first end 515 having, for example, a cylindrical recess 520 for receiving a rod, shaft, or pin, and a first flange 525 or surface. In such embodiments, the secondary battery lock 500 pivots about the cylindrical recess 520. In other embodiments, the secondary battery lock 500 includes ball joints for pivotably coupling the secondary battery lock to the handle 10. The secondary battery lock 500 includes a second end 530 having a second flange 535 for mating with a rib, groove, spine, etc. of the battery pack 100. The secondary battery lock 500 also includes an arcuate central portion 540 which connects the first end 515 and the second end 530. The central portion 540 is configured to conform to the contours and curvature of the handle 10. The secondary battery lock 500 is disengaged from the battery pack 100 by turning the screw 505 using a separate tool, such as a screwdriver or a knife. The screw 505 is accessed through a window in the handle 10 or a keyhole similar to that described above with respect to FIG. 17. As the screw 505 is turned, the first cam 510 is rotated into engagement with the first flange 525. The first cam 510 forces the first flange 525 to rotate about the cylindrical recess 520 and disengage the second flange 535 from the battery pack 100. In some embodiments, the screw 505 is spring loaded such that the screw 505 is caused to close or rotate the secondary battery lock 500 into engagement with the battery pack 100 when the battery pack 100 is inserted into a the first recess 30. Accordingly, the secondary battery lock 500 must be consciously brought out of engagement with the battery pack 100 before the battery pack 100 can be removed.

Figure 19:
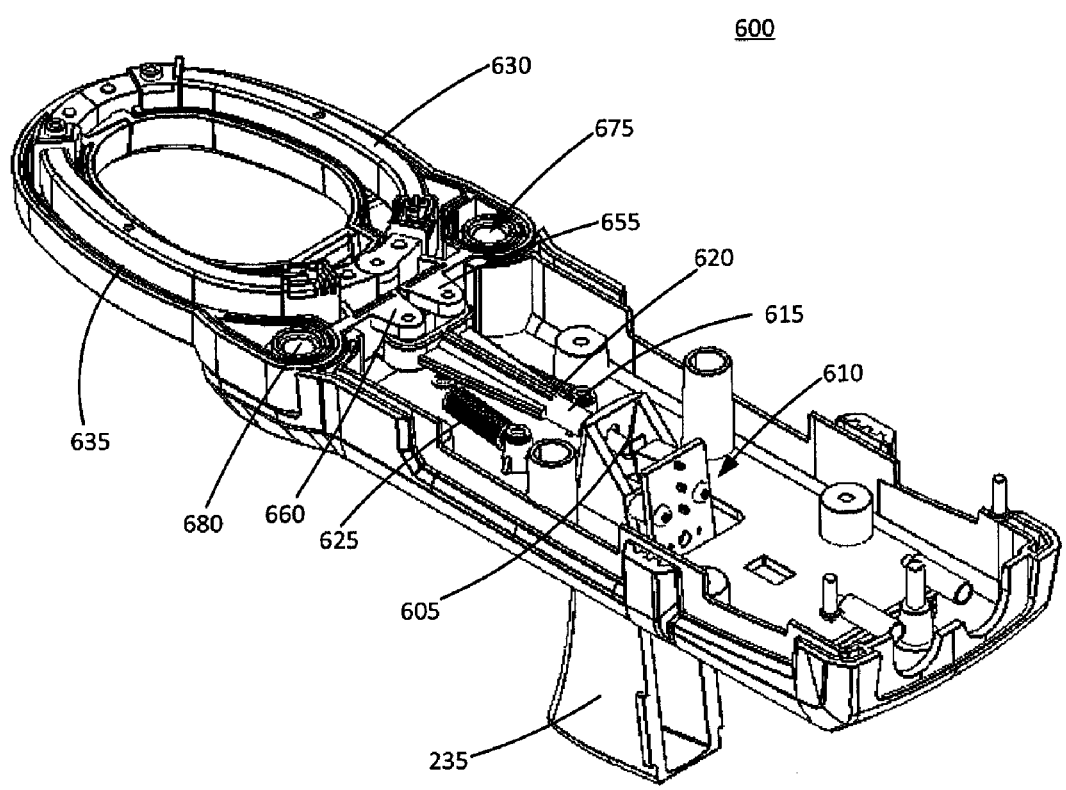
FIG. 19 is a rear perspective view of a clamp meter jaw mechanism according to an embodiment of the invention.
Figure 20:
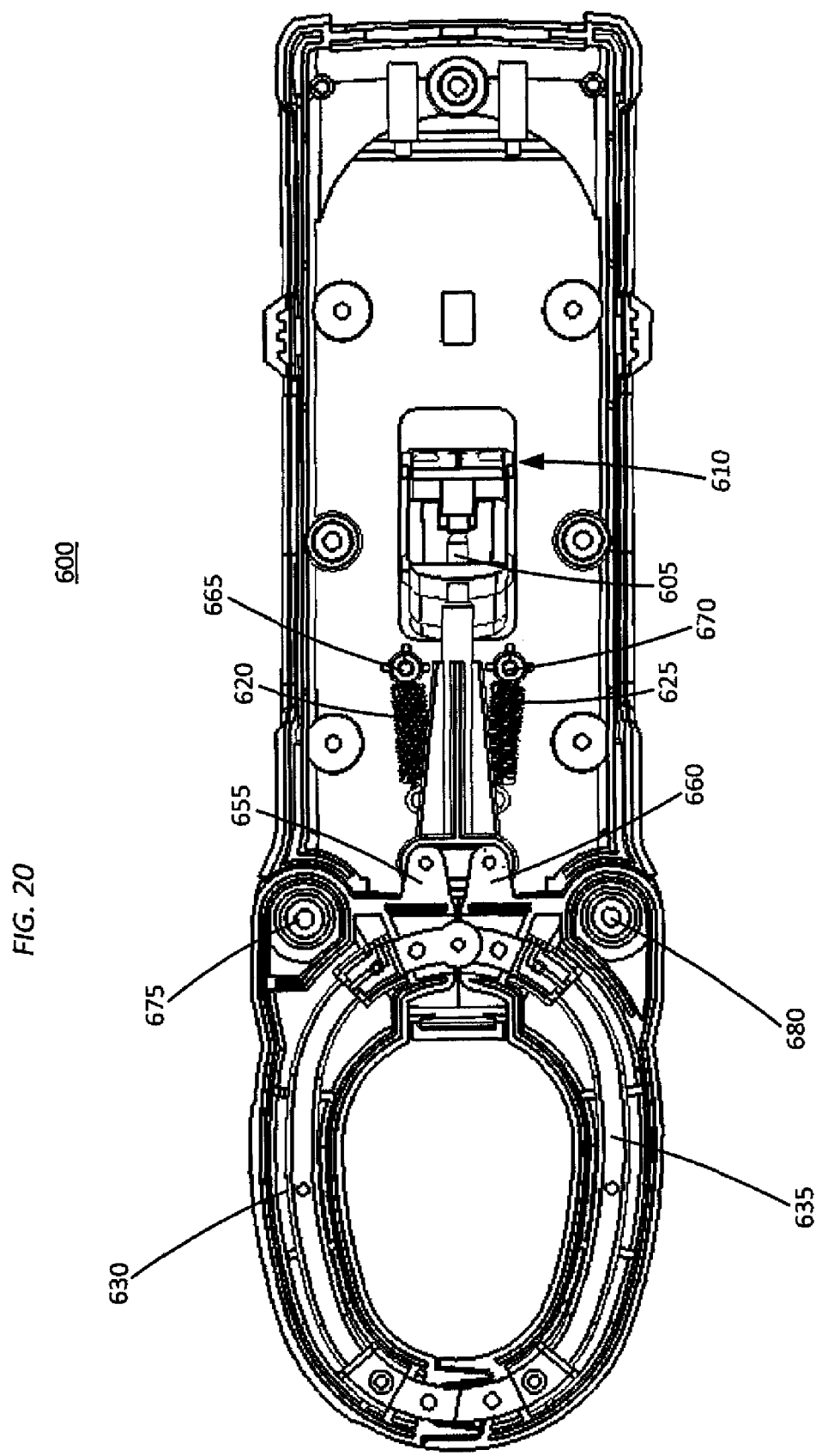
FIG. 20 is a top view of the clamp meter jaw mechanism of FIG. 19.
Figure 21:
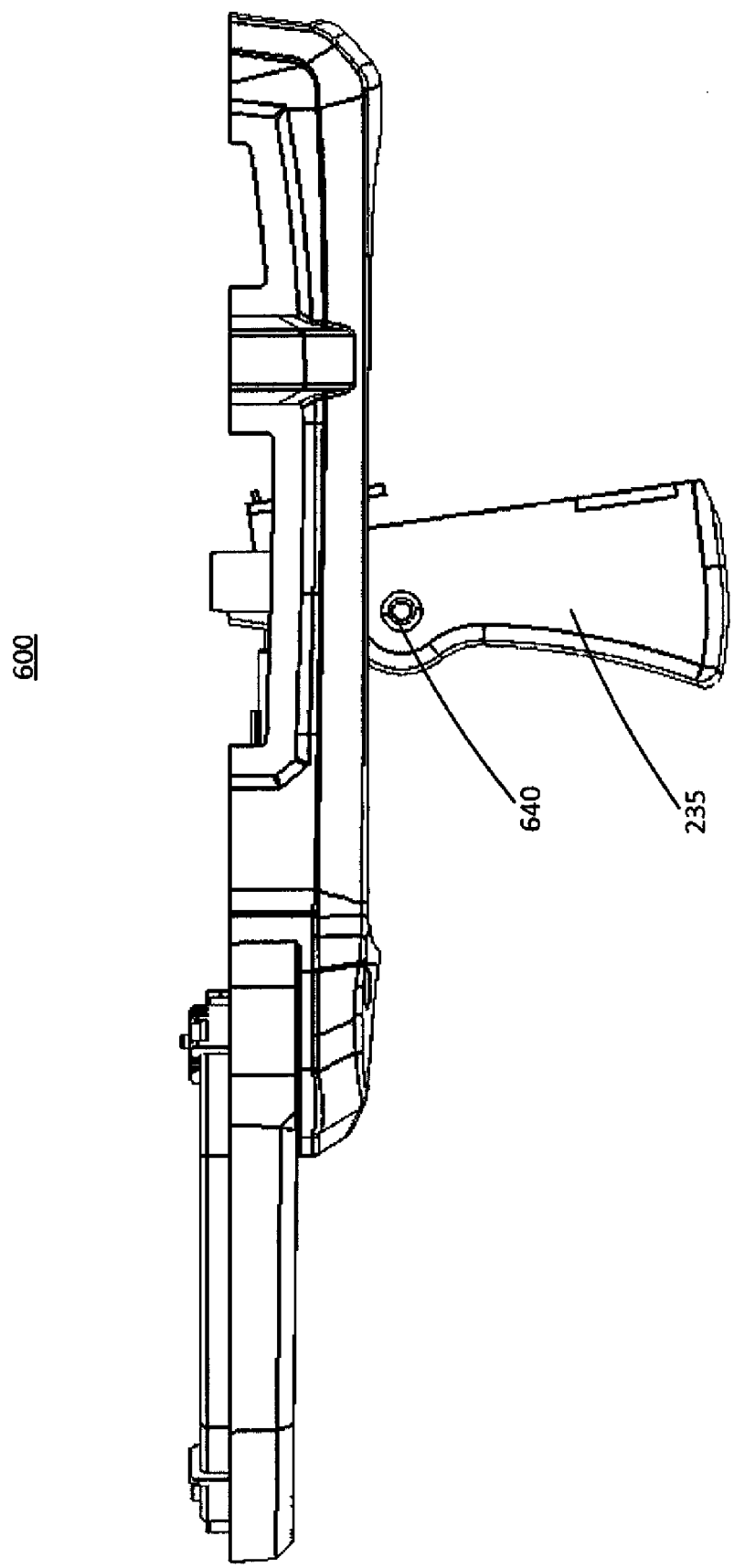
FIG. 21 is a side view of the clamp meter jaw mechanism of FIG. 19.

The trigger 235 of the clamp meter 200 is operable to control, for example, a jaw mechanism for opening and closing the clamp 205. The trigger 235 is also operable to turn on the LED flashlight 237. In one embodiment, the clamp meter 200 includes a jaw mechanism 600 as illustrated in FIGS. 19-21. The jaw mechanism 600 includes the trigger 235, a conductor or switch 605, an LED flashlight circuit 610, a ram 615, a first spring 620, a second spring 625, a first jaw 630, and a second jaw 635. In the illustrated embodiment, the jaw mechanism 600 is operable to both activate an LED flashlight 237 and open the first and second jaws 630 and 635. The switch 605 is a two-stage switch. The trigger 235 pivots about a point 640 such that a rotational motion is imparted upon the flashlight circuit 610. For example, the trigger 235 is engaged a first distance to close the switch 605 and activate the LED flashlight 237. As the trigger 235 is engaged, a terminal contact of the flashlight circuit 610 moves in the direction opposite to the motion of the trigger 235 and approaches the switch 605. After the trigger 235 has been engaged the first distance, the terminal contact of the circuit 610 contacts the switch 605 and closes an LED flashlight circuit 610. With the LED flashlight circuit 610 closed, a voltage provided by the battery pack 100 is applied to the terminals of the LED flashlight 237 and the LED flashlight 237 is illuminated.

As the trigger 235 is engaged further, the top portion of the trigger 235 contacts the ram 615 and produces a linear motion toward the first and second jaws 630 and 635. The ram 615 is coupled to first and second jaw latches 655 and 660 of the first and second jaws 630 and 635, respectively. The first spring 620 and the second spring 625 are also coupled to first and second hooks 665 and 670, respectively, to provide a resilient connection between the first and second jaws 630 and 635 and the main body 210. After the trigger 235 has been engaged a second distance, the top portion of the trigger forces the ram 615 into the first and second jaws 630 and 635. The linear motion of the ram 615 is converted into a rotational motion of the first and second jaws 630 and 635 about first and second jaw pivot axes 675 and 680, respectively. When the trigger 235 is fully engaged, the ram 615 is fully extended, and the clamp 205 provides a maximum separation between the first and second jaws 630 and 635 to allow a wire or other conductor to be placed within the clamp 205.

After the conductor has been placed within the clamp 205, the trigger 235 is released to close the first and second jaws 630 and 635. If the user requires the LED flashlight 237 to illuminate an area enclosed by the clamp 205 or in front of the clamp meter 200, the trigger 235 can be partially disengaged such that the terminal contact of the LED flashlight circuit 610 remains in contact with the switch 605 to close the LED flashlight circuit 610. Alternatively, the trigger 235 can be fully disengaged and the LED flashlight 237 is deactivated. When the first and second jaws 630 and 635 are closed, the magnetic core within the clamp 205 is closed, and an induced current can be used to measure the current in the conductor. In some embodiments, the trigger 235 is coupled to a geared mechanical actuator. In other embodiments, the clamp 205 may be opened and closed electronically when the trigger 235 is engaged and disengaged, or a different mechanical jaw mechanism can be used.

The flashlight 237 can include an incandescent light bulb, a plurality of light emitting diodes, or the like. In one embodiment, the LED flashlight 237 includes three high-intensity LEDs and has an output of, for example, 250 LUX at a distance of two feet. In some embodiments of the invention, the output of the LED flashlight 237 is greater than 250 LUX at a distance of two feet. In some embodiments, the LED flashlight 237 is integral to or detachable from the clamp meter 200. In such embodiments, the flashlight 237 includes a secondary power source that is charged or otherwise receives power from the battery pack 100. The LED flashlight 237 also includes a flashlight timeout period. The flashlight timeout period can have a preprogrammed value or be set by the user. If the flashlight timeout period is reached or lapses and the LED flashlight 237 has not been turned off, the clamp meter 200 turns off the LED flashlight 237 to conserve power.

The non-contact voltage detector ("NCVD") (not shown) is positioned at a base of the clamp 205 on the main body 210. A voltage sense circuit is positioned within the clamp meter 200 and illuminates a voltage sense indicator, such as an LED, when it detects an AC voltage. In some embodiments, all or a portion of the voltage sense circuit is included in a clamp meter controller (described below). The voltage sense circuit is operable to detect AC voltages in the range of, for example, 90V-600V. In some embodiments, the voltage sense circuit NCVD is operable to detect AC voltages anytime the clamp meter is powered or turned on. In other embodiments, the NCVD is selectively activatable using an NCVD control button or switch. In other embodiments, the clamp meter includes a detachable non-contact voltage detector (not shown), such as that described in co-pending U.S. patent application Ser. No. 12/421,187, filed on Apr. 9, 2009 and titled "SLIDABLY ATTACHABLE NON-CONTACT VOLTAGE DETECTOR," the entire contents of which are hereby incorporated by reference, which is slidably attachable to the clamp meter.

Figure 7:
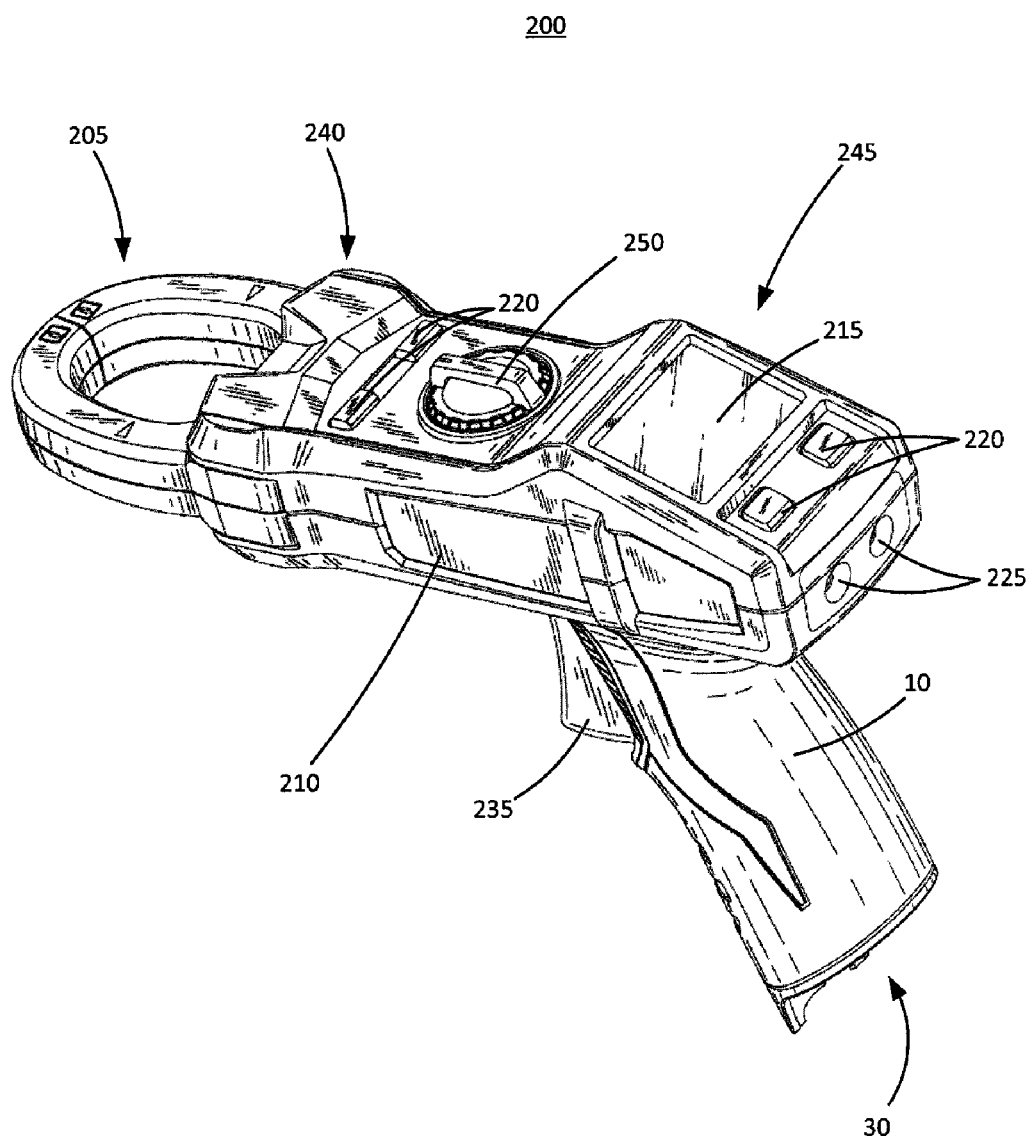
FIG. 7 is a rear perspective view of a clamp meter according to an embodiment of the invention.
Figure 8:
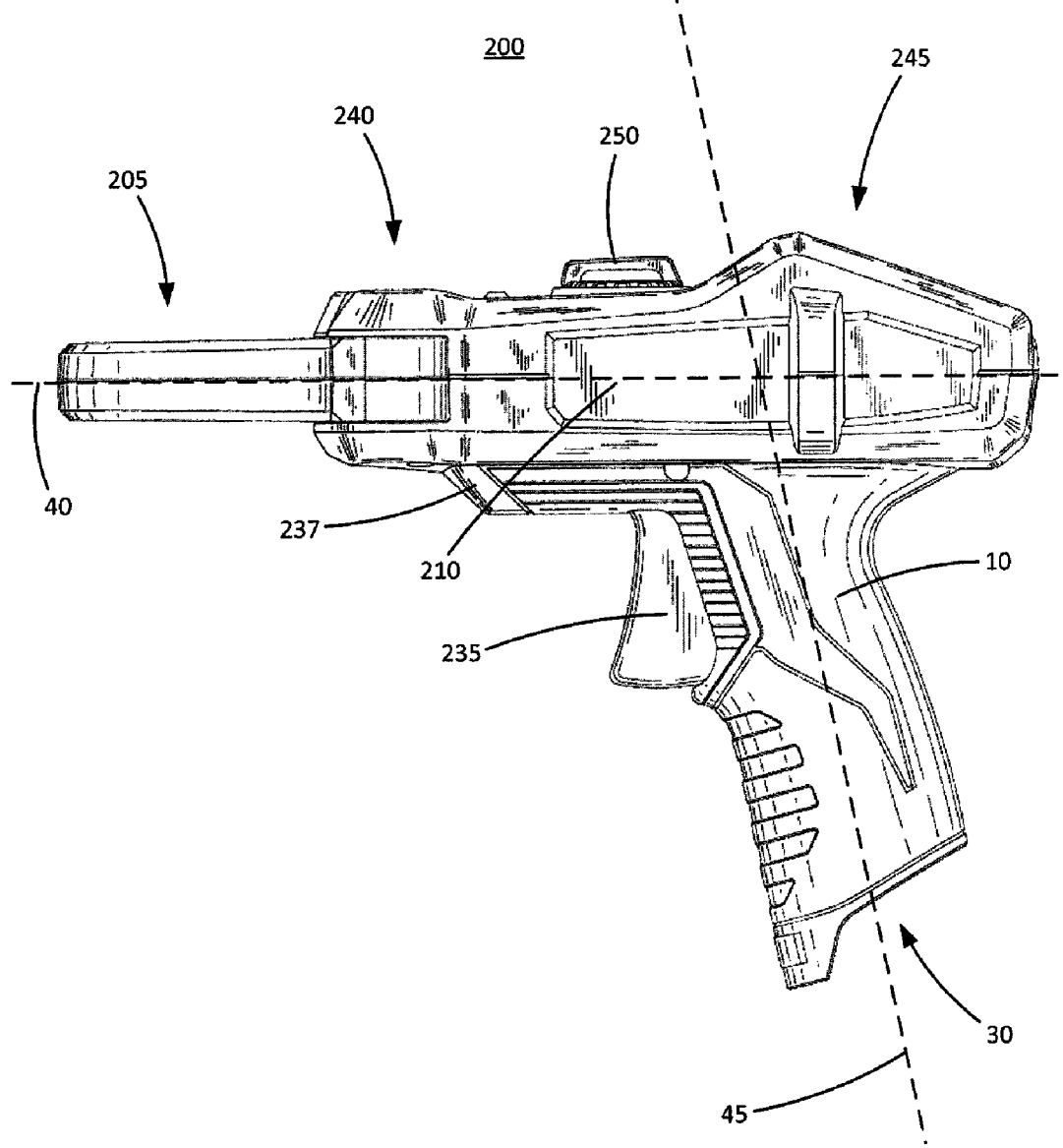
FIG. 8 is a right side view of the clamp meter of FIG. 7.
Figure 9:
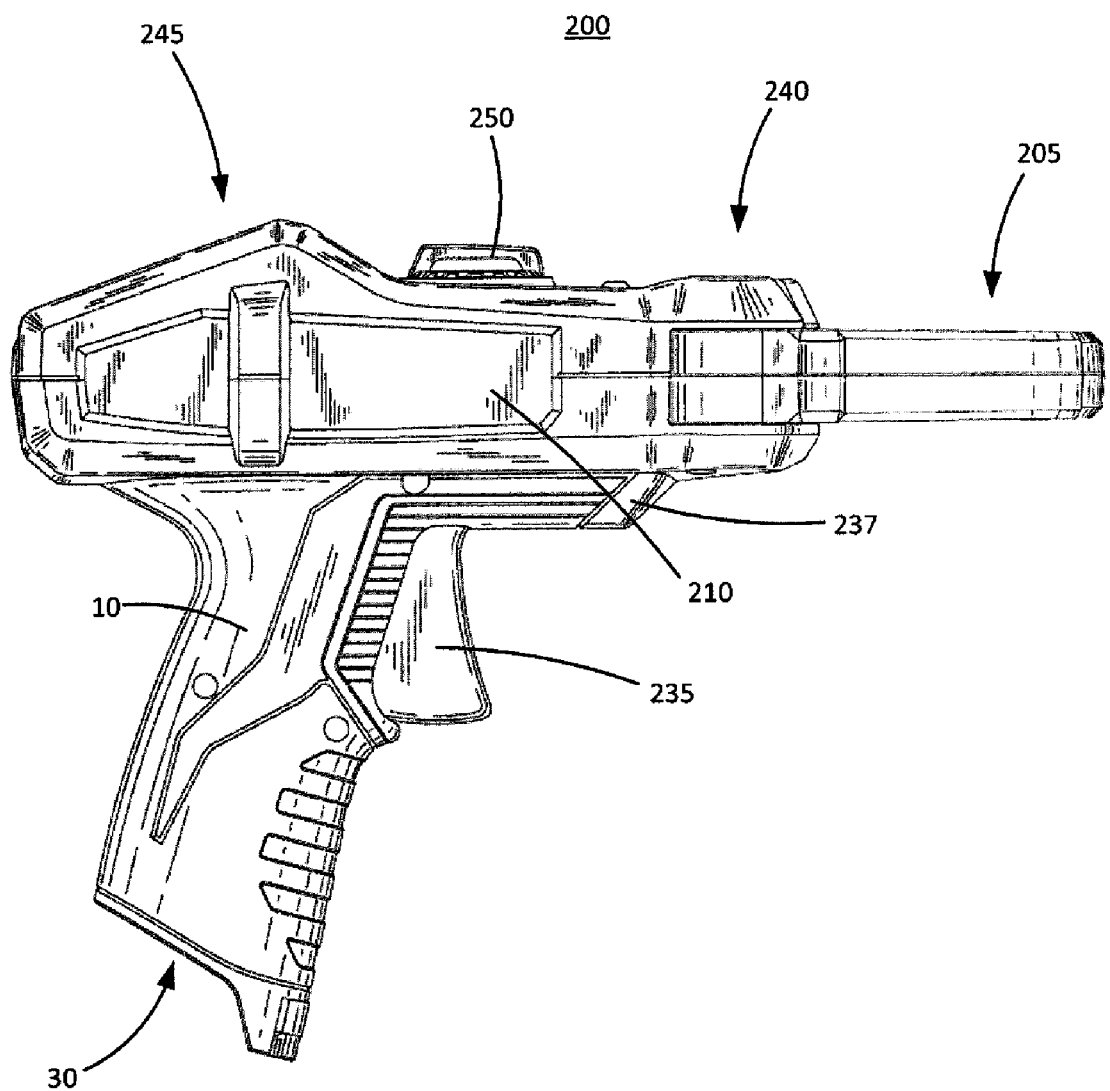
FIG. 9 is a left side view of the clamp meter of FIG. 7.
Figure 22:
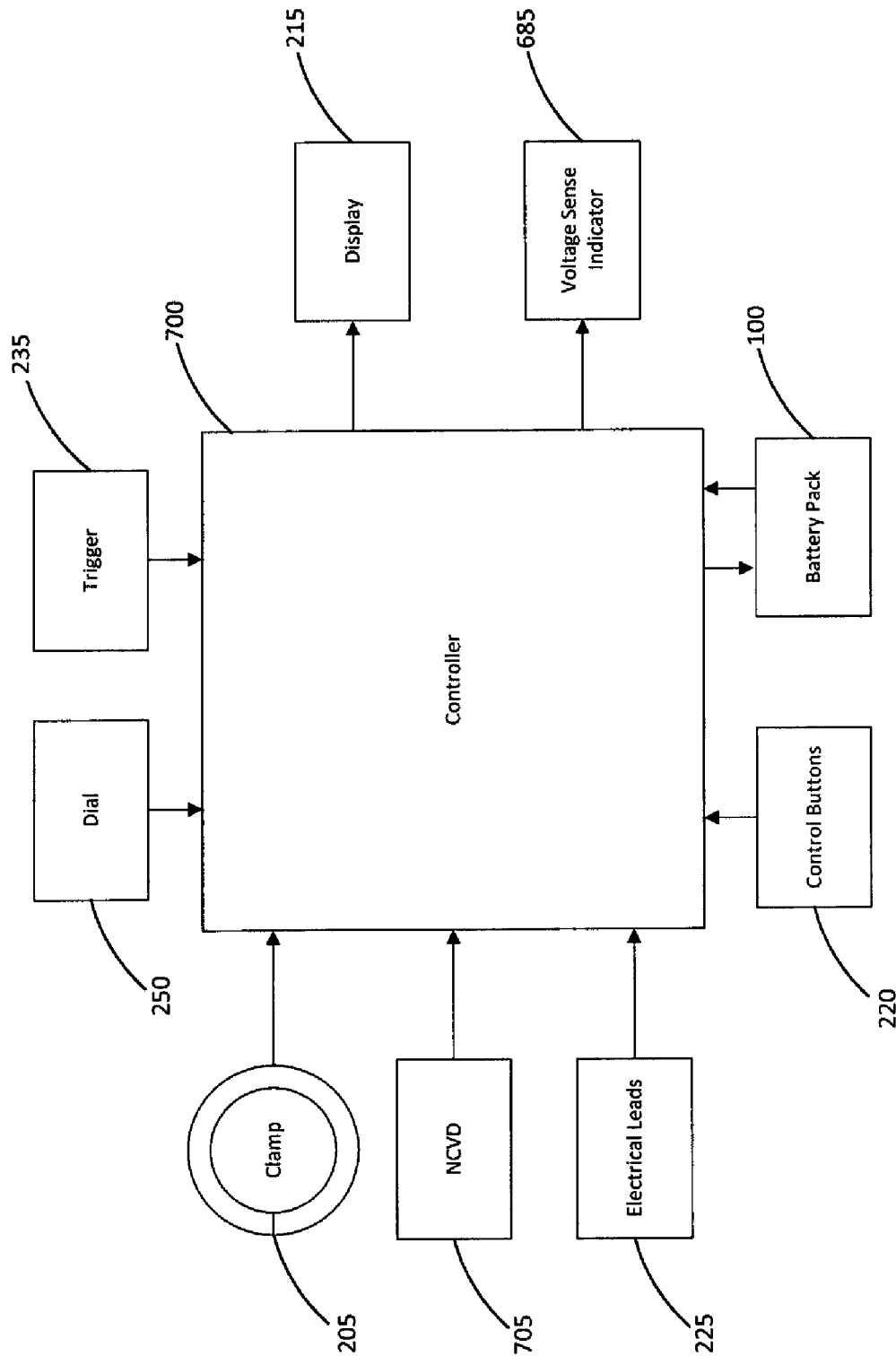
FIG. 22 is a block diagram of the clamp meter of FIG. 7.
Figure 23:
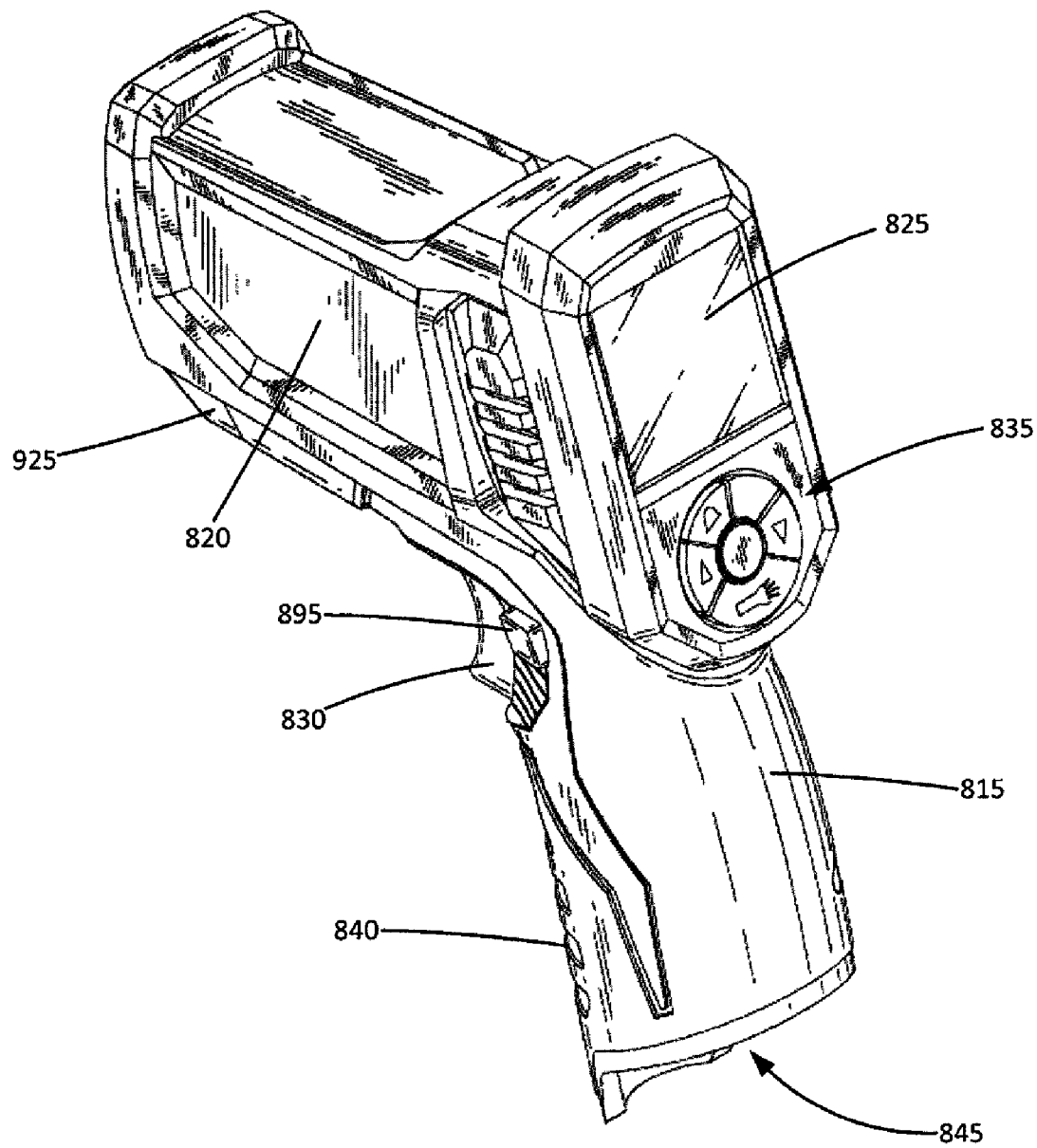
FIG. 23 is a rear perspective view of an infrared ("IR") thermometer according to an embodiment of the invention.
Figure 24:
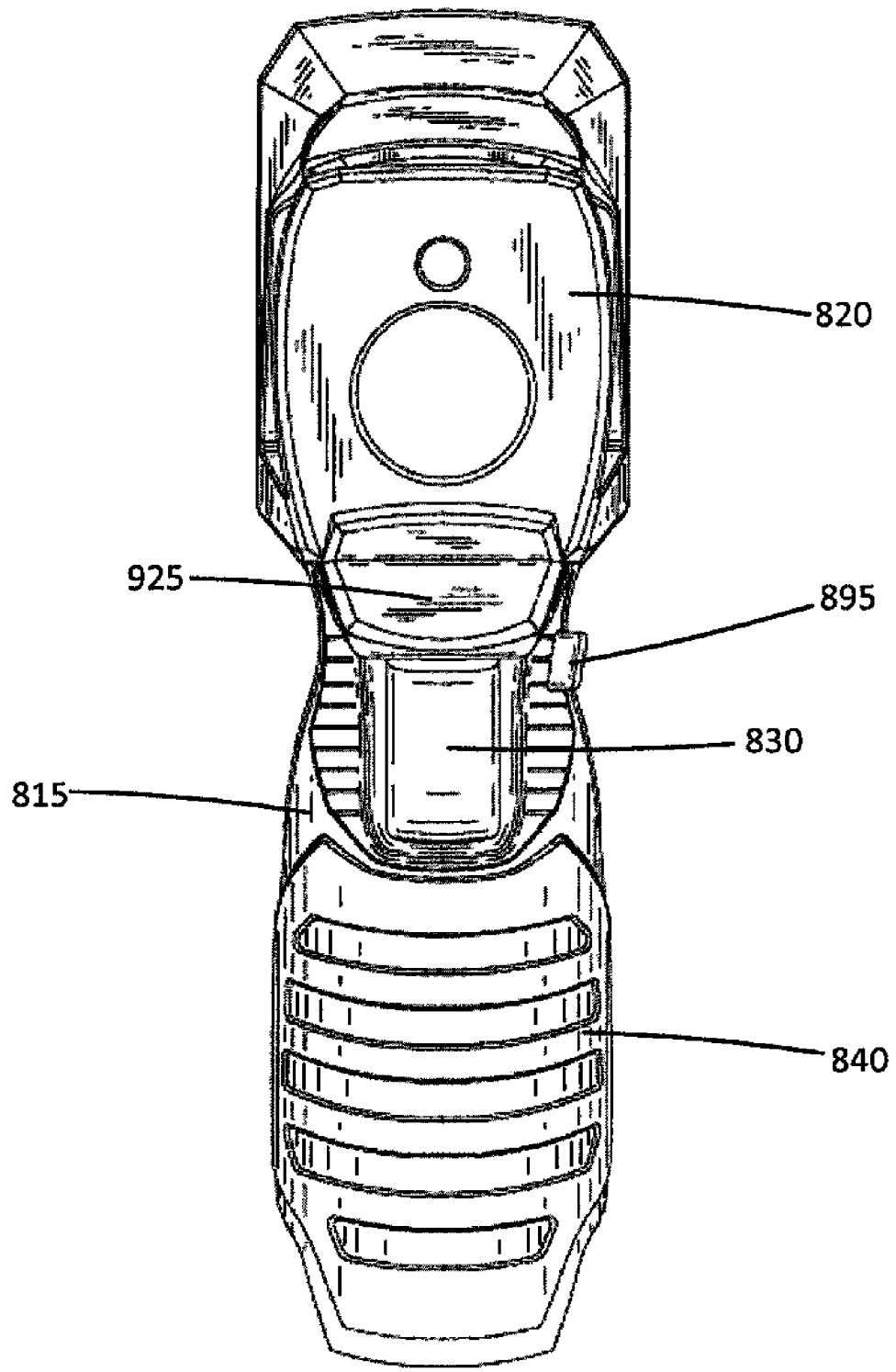
FIG. 24 is a front view of the IR thermometer of FIG. 23.
Figure 25:
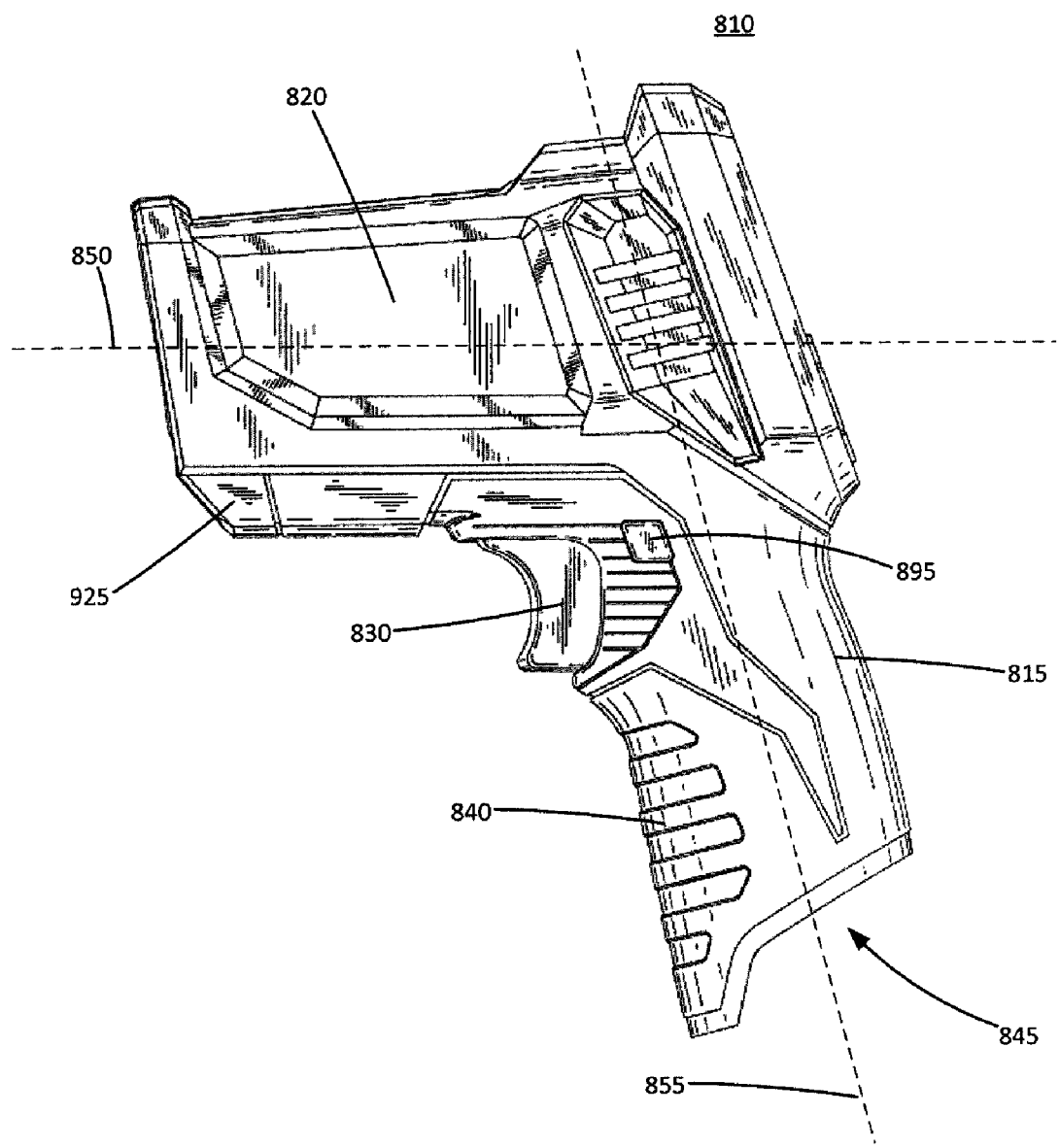
FIG. 25 is a right side view of the IR thermometer of FIG. 23.
Figure 26:
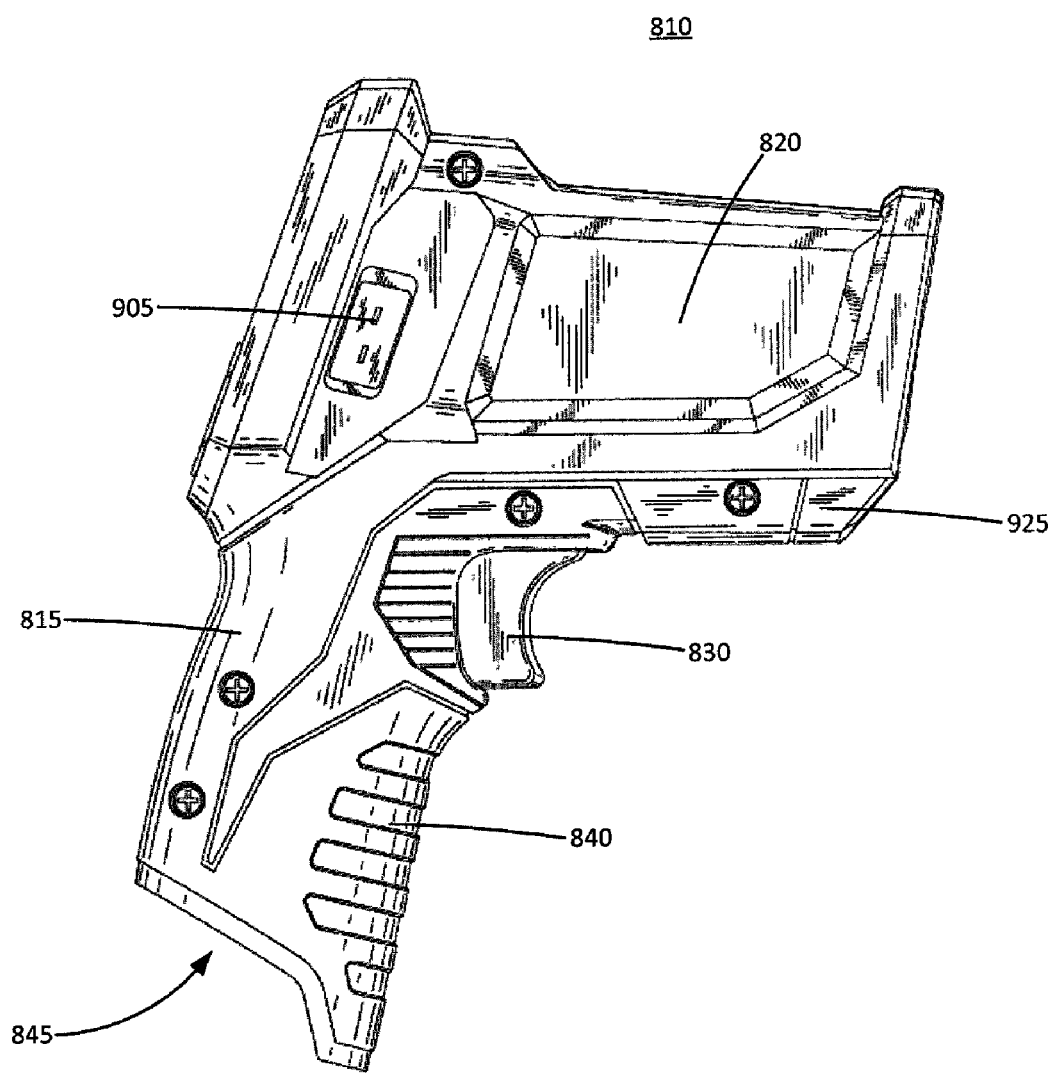
FIG. 26 is a left side view of the IR thermometer of FIG. 23.
Figure 27:
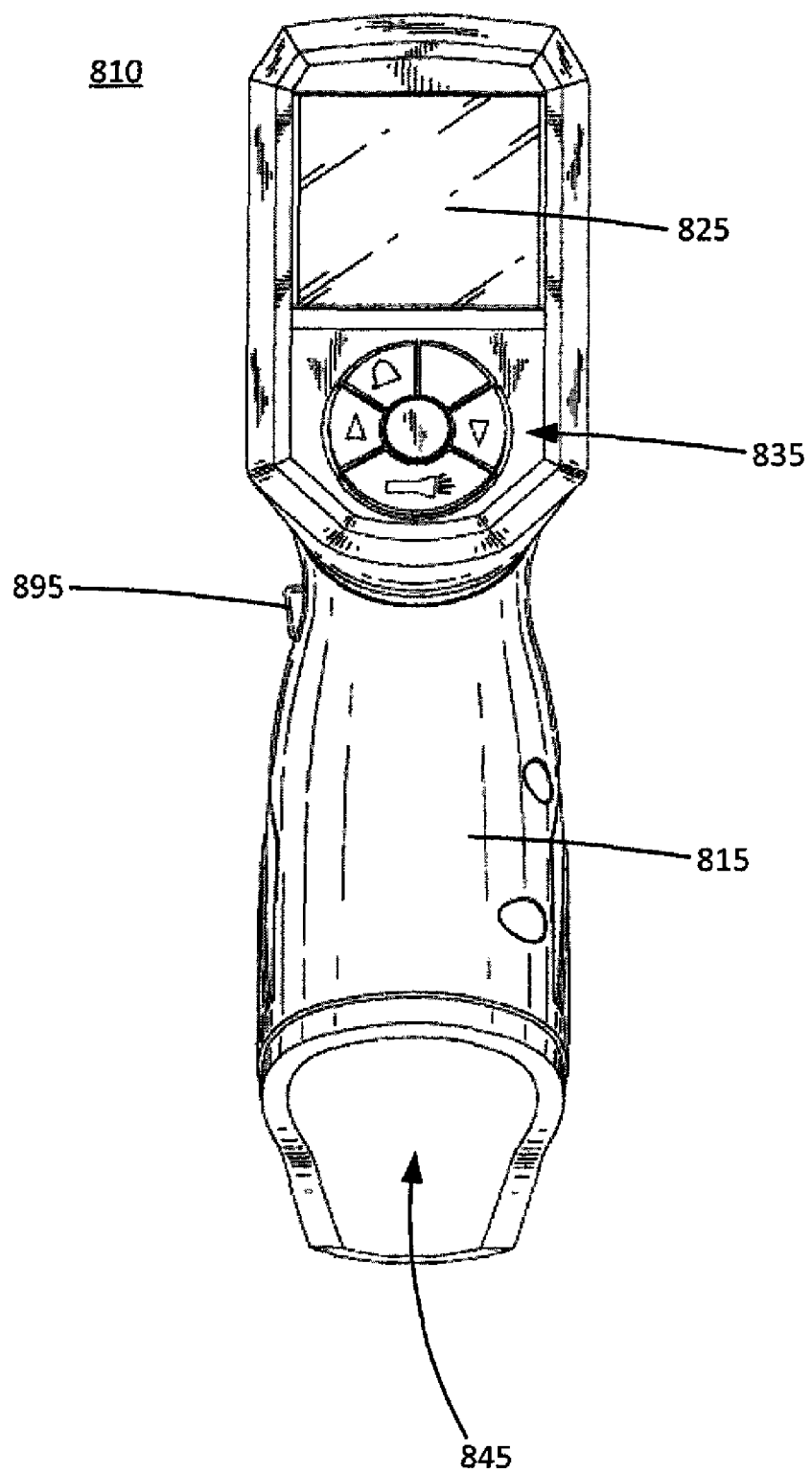
FIG. 27 is a rear view of the IR thermometer of FIG. 23.
Figure 28:
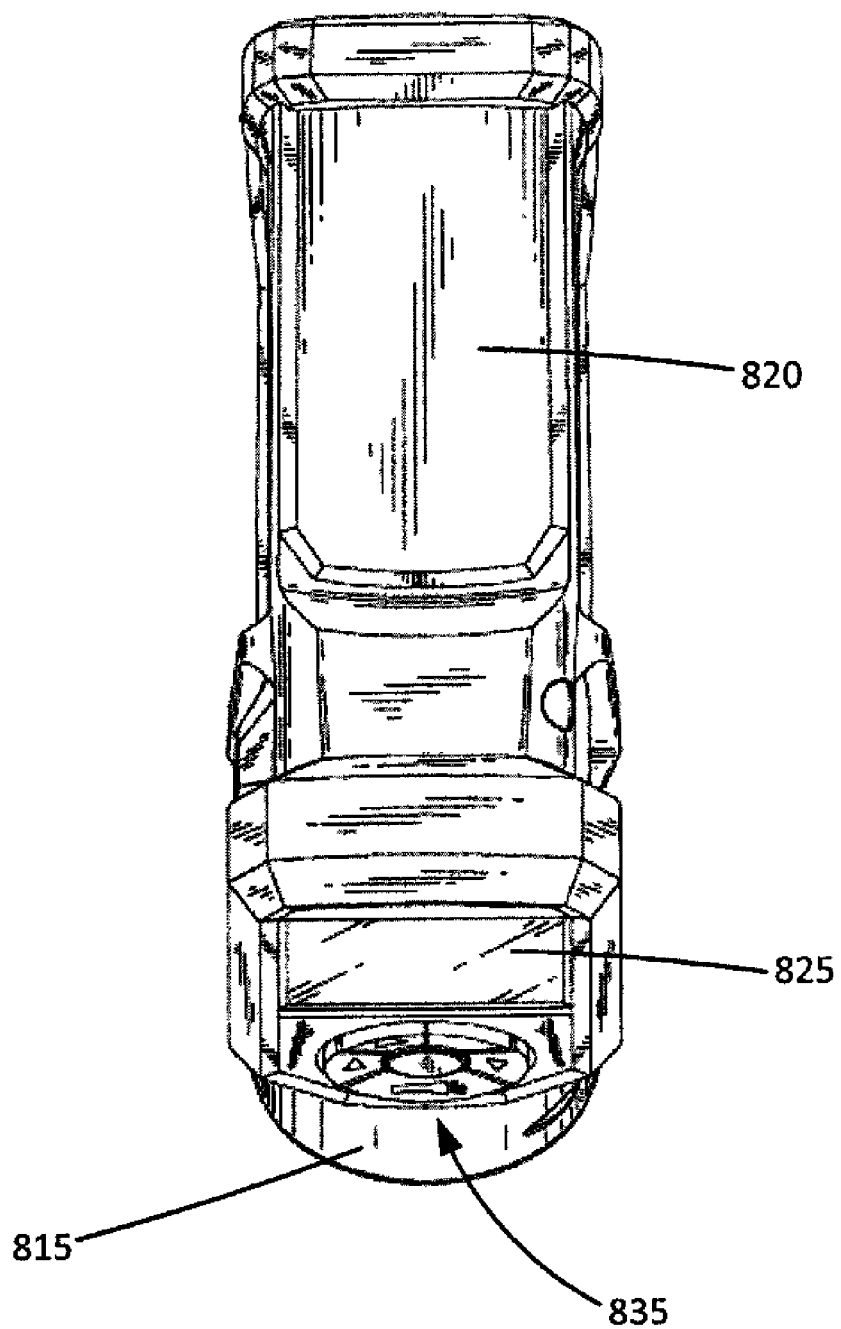
FIG. 28 is a top view of the IR thermometer of FIG. 23.
Figure 29:
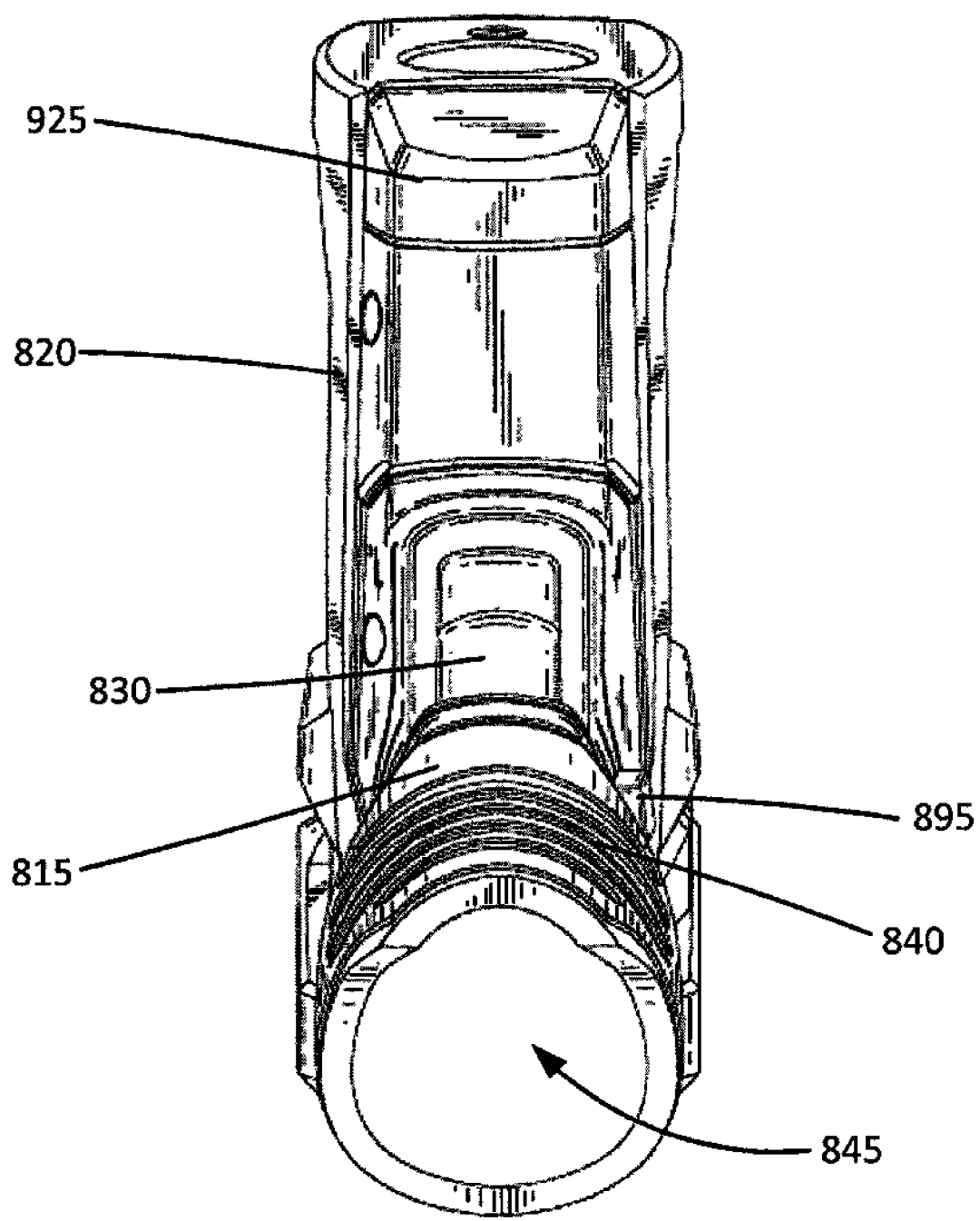
FIG. 29 is a bottom view of the IR thermometer of FIG. 23.

FIG. 22 is a block diagram of the clamp meter 200 of FIG. 7. In addition to the components and features of the clamp meter 200 described above, the clamp meter 200 also includes a controller 700. The controller 700 receives signals from the clamp 205, the NCVD 705, the electrical leads or terminals 225, the dial 250, the control buttons 220, the trigger 235, and the battery pack 100. The controller 700 processes and/or conditions the signals, and outputs the conditioned signals to, for example, the display 215 or another indication device, such as the voltage sense indicator. The clamp meter controller 700 includes for example, at least one printed circuit board ("PCB"). The PCB is populated with a plurality of electrical and electronic components which provide operational control and protection to the clamp meter. In some embodiments, the PCB includes a control or processing unit such as a microprocessor, a microcontroller, or the like. In some embodiments, the controller 700 includes, for example, the processing unit, a memory, and a bus. The bus connects various components of the controller 700 including the memory to the processing unit. The memory includes, in some embodiments, read only memory ("ROM") and random access memory ("RAM"). The controller 700 also includes an input/output system that includes routines for transferring information between components within the controller 700. Software included in the implementation of the clamp meter is stored in the ROM or RAM of the controller 700. The software includes, for example, firmware applications and other executable instructions. In other embodiments, the controller 700 can include additional, fewer, or different components.

The PCB also includes, for example, a plurality of additional passive and active components such as resistors, capacitors, inductors, integrated circuits, and amplifiers. These components are arranged and connected to provide a plurality of electrical functions to the PCB including, among other things, filtering, signal conditioning, and voltage regulation. For descriptive purposes, the PCB and the electrical components populated on the PCB are collectively referred to herein as "the controller" 700. The display 215 receives the processed and conditioned signals from the controller 700 and displays a value (e.g., a number) corresponding to the measured current, or an indication of a control parameter of the clamp meter 200 (e.g., sensing mode).

In some embodiments, a battery pack controller (not shown) provides information to the clamp meter controller 700 related to a battery pack temperature or voltage level. The clamp meter controller 700 and the battery pack also include low voltage monitors and state-of-charge monitors. The monitors are used by the clamp meter controller 700 or the battery pack controller to determine whether the battery pack is experiencing a low voltage condition, which may prevent proper operation of the clamp meter 200, or if the battery pack is in a state-of-charge that makes the battery pack 100 susceptible to being damaged. If such a low voltage condition or state-of-charge exists, the clamp meter 200 is shut down or the battery pack 100 is otherwise prevented from further discharging current to prevent the battery pack 100 from becoming further depleted.

Another embodiment of the invention is described with respect to an infrared ("IR") thermometer. FIGS. 23-29 illustrate an IR thermometer 810 that includes, among other things, a handle 815, a main body 820, an embedded display 825, a control device or trigger 830, a control section 835, a grip portion 840, and a high-voltage removable and rechargeable battery pack (described below). The handle 815 is substantially similar to the handle 10 described above with respect to FIGS. 1-3. The handle portion includes a recess that is adapted to receive the battery pack 100 described above with respect to FIGS. 4-6.

The display 825 is attached to a rear portion of the main body 820 along the first axis 850. The user's line-of-sight is aligned with or parallel to a first axis 850. In the illustrated embodiment, the display 825 is a liquid crystal display ("LCD"), such as a negative LCD ("NLCD") with an electroluminescent backlight, but may alternatively be another suitable type of display. The negative LCD includes lighted symbols, such as white alphanumeric symbols, on a black background. The NCLD improves the visibility of the display 825 in low or poor lighting conditions, such as outdoor, dark, or dirty conditions. In some embodiments, the display 825 is at an offset angle with respect to the first axis 850 to improve the visibility of the display 825. The display 825 also includes a screen timeout period which is either preprogrammed or set by the user. If the screen timeout period is reached or lapses and no buttons in the control section 835 are actuated and/or no measurements are taken, the display 825 enters a standby or power saving mode to conserve power.

Figure 30:
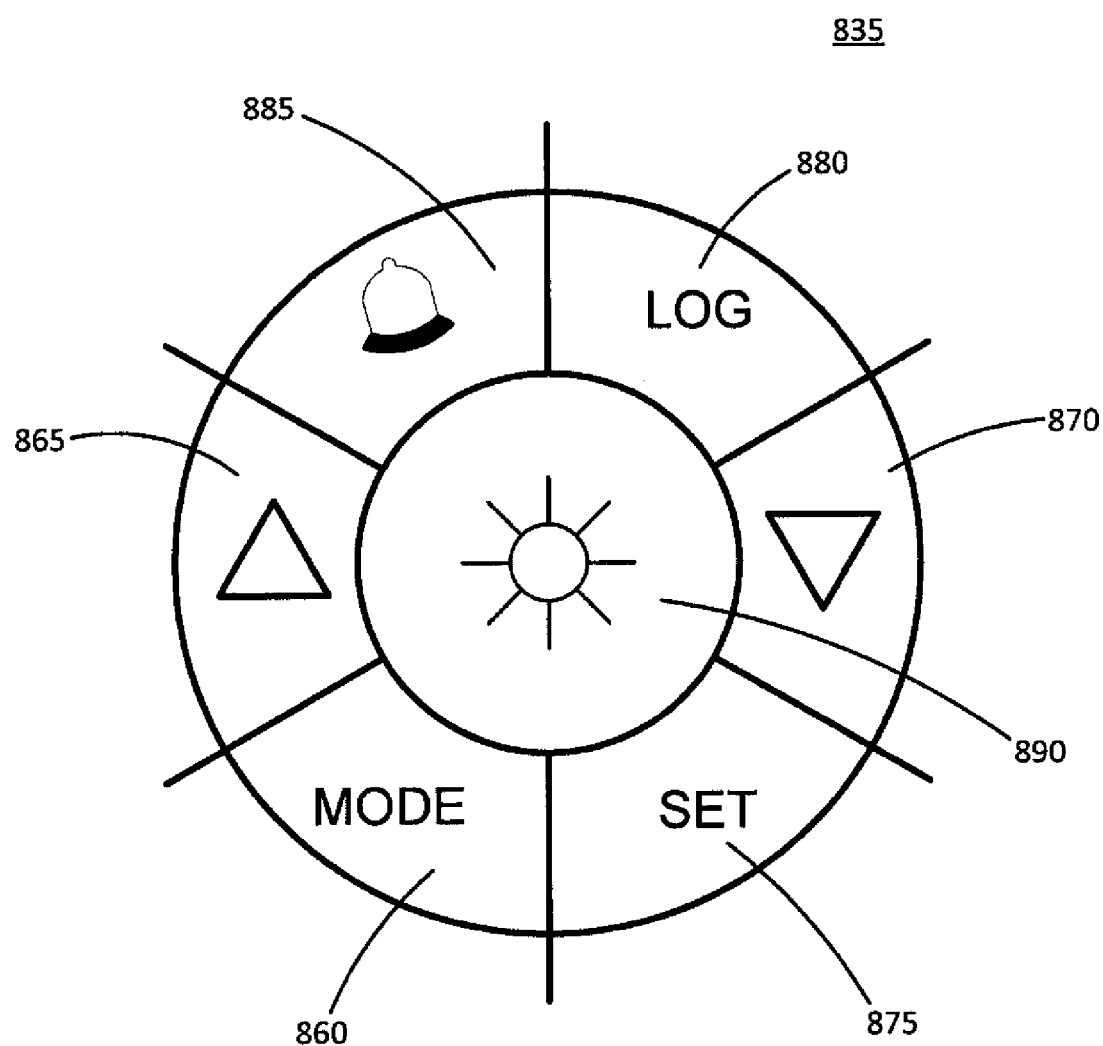
FIG. 30 illustrates a control section of the IR thermometer of FIG. 23.

The control section 835 is illustrated in FIG. 30. The control section 835 is positioned proximate to the display 825 and includes a plurality of control buttons. The position and configuration of the control buttons allow the thermometer 810 to be controlled without the user having to divert his or her line-of-sight from display 825 or the operation of the thermometer 810. For example, in the illustrated embodiment, the control section 835 is positioned below the display 825. The control section 835 includes a mode button 860, an up button 865, a down button 870, a settings button 875, a log save button 880, an alarm button 885, and a flashlight button 890. The mode button 860 is actuated to select an operational mode from, for example, a menu or a predetermined set of operational modes. For example, the mode button 860 allows a user to scroll through a plurality of operational modes, such as an average temperature mode, a maximum temperature mode, a minimum temperature mode, a humidity mode, a dew point mode, a wet bulb mode, and a contact temperature mode. In some embodiments, the mode button 860 is repeatedly selected to cycle through the operational modes of the thermometer 810. In other embodiments, the mode button 860 is pressed once, and the up and down buttons 65 and 870 are used to scroll through thermometer 810 modes. The selected operational mode determines the information that is displayed on the display 825. As such, in some embodiments, the thermometer 810 is a menu-driven device. In some embodiments, the thermometer 810 also includes one or more LEDs for providing an indication to the user of the status or operational mode of the thermometer 810, the battery pack, or both.

Additional control buttons can be located on the handle 815 and/or the main body 820. For example, an electronic trigger lock button 895 is located on the handle 815 and enables the thermometer 810 to take a continuous non-contact temperature reading without the trigger 830 being engaged. In some embodiments, the thermometer 810 takes the non-contact temperature reading until the user engages the trigger 830 a second time. In other embodiments, the continuous reading is taken until the trigger lock button 895 is deactivated, or a predetermined time limit (e.g., 20 minutes) has elapsed.

If the thermometer 810 is operating in the average temperature mode, an indication that the thermometer 810 is operating in the average temperature mode is displayed on the display 825. In one embodiment, the letters "AVG" are displayed. When operating in the average temperature mode, the average temperature during the course of a single temperature reading (e.g., the time during which the trigger 830 is pressed) is also displayed on the display 825. If the thermometer 810 is operating in the maximum temperature mode, an indication that the thermometer 810 is operating in the maximum temperature mode is displayed on the display 825. In one embodiment, the letters "MAX" are displayed. When operating in the maximum temperature mode, the maximum temperature reading during the course of a single temperature reading is also displayed. If the thermometer 810 is operating in the minimum temperature mode, an indication that the thermometer 810 is operating in the minimum temperature mode is displayed on the display 825. In one embodiment, the letters "MIN" are displayed. When operating in the minimum temperature mode, the minimum temperature reading during the course of a single temperature reading is also displayed on the display 825. If the thermometer 810 is operating in the humidity mode, an indication that the thermometer 810 is operating in the humidity mode is displayed on the display 825. In one embodiment, the letters "HUM" are displayed, as well as an indication that a relative humidity measurement is being displayed (e.g., "RH%"). When operating in the humidity mode, a three-digit relative humidity (e.g., 96.3) is displayed. If the thermometer 810 is operating in the dew point mode, an indication that the thermometer 810 is operating in the dew point mode is displayed on the display 825. In one embodiment, the letters "DEW" and a calculated dew point are displayed. If the thermometer 810 is in the wet bulb mode, an indication that the thermometer 810 is operating in the wet bulb mode is displayed. In one embodiment, the letters "WET" and a wet bulb calculation are displayed. If the thermometer 810 is operating in the contact temperature mode, an indication that the thermometer 810 is operating in the contact temperature mode is displayed. In one embodiment, the letters "CON" and a contact temperature measurement are displayed on the display 825.

The settings button 875 is operable to set or modify various thresholds and functions of the thermometer 810. For example, the settings button 875 is actuated to scroll through the thresholds and functions which the user can control. For example, the settings button 875 allows a user to set a high temperature alarm threshold, a low temperature alarm threshold, a log reading, an emissivity, and temperature measurement units (e.g., Fahrenheit or Celsius), and turn a laser (see FIG. 31) on and off. In some embodiments, the settings button 875 is repeatedly actuated to cycle through the thresholds and functions. In other embodiments, the settings button 875 is actuated once, and the up and down buttons 865 and 870 are used to scroll through thermometer thresholds and functions.

When setting the high temperature alarm threshold, the user actuates the settings button 875 until the letters "HI" appear on the display 825. The user adjusts the high temperature alarm threshold using the up and down buttons 865 and 870. The alarm is activated when the non-contact temperature reading is above the high temperature alarm threshold. When setting the low temperature alarm threshold, the user actuates the settings button 875 until the letters "LOW" appear on the display 825. The user adjusts the low temperature alarm threshold using the up and down buttons 865 and 870. The alarm is activated when the non-contact temperature reading is below the low temperature alarm threshold. The alarm is toggled on and off using the alarm button 885. When setting a log value, the user actuates the settings button 875 until the letters "LOG" appear on the display 825. The thermometer 810 also displays a number (e.g., between 1 and 20) which indicates a log value memory location. For example, if a log value was previously saved to a log value memory location, the previously saved log value is displayed. The user can scroll through the saved log values using the up and down buttons 865 and 870. The user can overwrite the previously saved log value by actuating the log save button 880 when a particular log value memory location is displayed. The user sets the emissivity of the thermometer 810 by actuating the settings button 875 until the symbol, $\epsilon$, is displayed. The user adjusts the emissivity level using the up and down buttons 865 and 870. The user toggles the laser on and off by actuating the settings button 875 until a laser symbol (e.g., a class two laser safety symbol) is displayed, and using the up and down buttons 865 and 870 to selectively activate and deactivate the laser.

Figure 31:
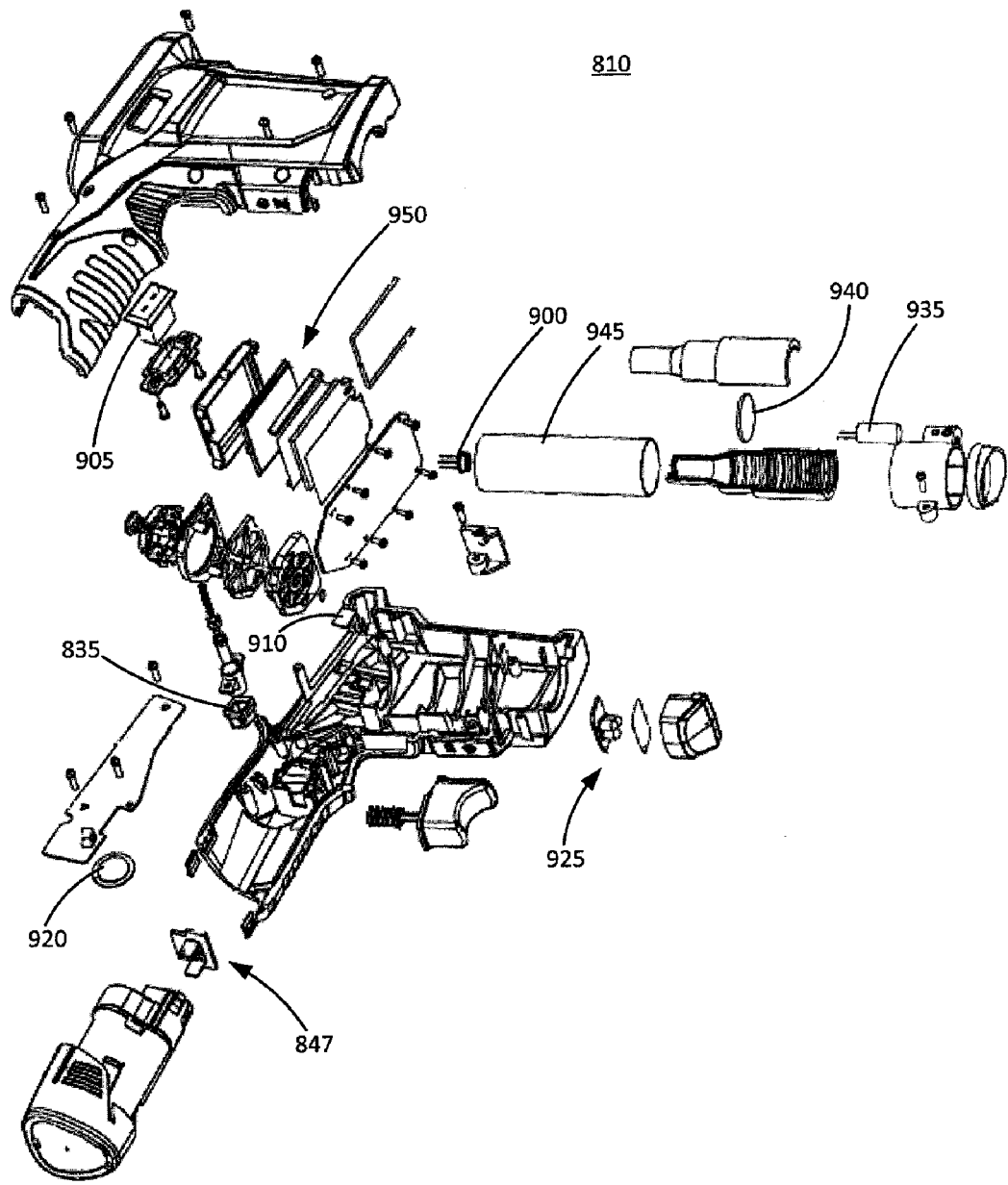
FIG. 31 is an exploded view of the IR thermometer of FIG. 23.

FIG. 31 illustrates an exploded view of the IR thermometer 810. The thermometer 810 includes, among other things, the trigger lock button 895, an IR temperature sensor 900, a contact temperature sensor port 905, a humidity sensor 910, a buzzer 920, an LED flashlight 925, a laser module 935, a convex lens 940, a cylindrical aluminum tube 945, and an LCD assembly 950. The flashlight 925 is toggled on and off using the flashlight button 890 in the control section 835. The flashlight 925 can include an incandescent light bulb, a plurality of light emitting diodes, or the like. In one embodiment, the LED flashlight 925 includes three high-intensity LEDs and has an output of, for example, 250 LUX at a distance of two feet. In some embodiments of the invention, the output of the LED flashlight 925 is greater than 250 LUX at a distance of two feet. In some embodiments, the LED flashlight 925 is integral to or detachable from the thermometer 810. In such embodiments, the flashlight 925 includes a secondary power source that is charged or otherwise receives power from the battery pack. The LED flashlight 925 also includes a flashlight timeout period. The flashlight timeout period can have a preprogrammed value or be set by the user. If the flashlight timeout period is reached or lapses and the LED flashlight 925 has not been turned off, the thermometer 810 turns off the LED flashlight 925 to conserve power.

Figure 32:
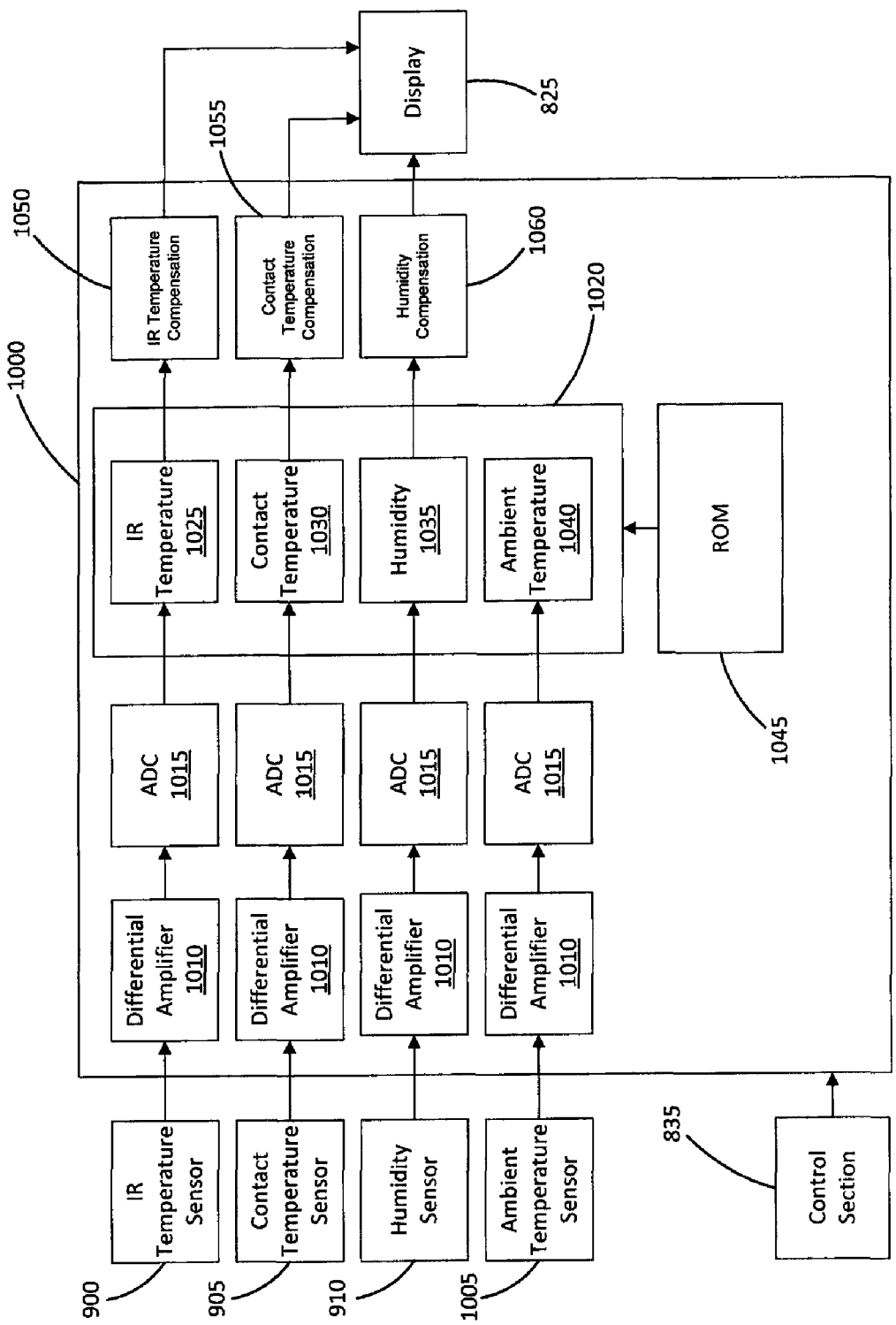
FIG. 32 is a block diagram of an IR thermometer according to an embodiment of the invention.

FIG. 32 is a block diagram of the IR thermometer 810. The thermometer 810 includes a thermometer controller 1000, the IR temperature sensor 900, the contact temperature sensor port 905, the humidity sensor 910, an ambient temperature sensor 1005, the control section 835, and the display 825. The controller 1000 includes a plurality of differential amplifiers 1010, a plurality of analog-to-digital converters ("ADCs") 1015, a processing module 1020, an IR temperature output 1025, a contact temperature output 1030, a humidity output 1035, an ambient temperature output 1040, a memory module 1045, an IR temperature compensation module 1050, a contact temperature compensation module 1055, and a humidity compensation module 1060. In some embodiments, the ADCs 1015 are 24-bit high precision delta-sigma ADCs. The thermometer controller 1000 also includes for example, at least one printed circuit board ("PCB"). The PCB is populated with a plurality of electrical and electronic components which provide power, operational control, and protection to the thermometer 810. In some embodiments, the PCB includes the processing module 1020 which is, for example, a microprocessor. The controller 1000 also includes a bus for connecting the various components and modules located within or connected to the controller 1000. The memory module 1045 includes, in some embodiments, read only memory ("ROM"), such as electronically erasable programmable ROM ("EEPROM"), and random access memory ("RAM"). The controller 1000 also includes an input/output system that includes routines for transferring information between components and modules within the controller 1000. Software included in the implementation of the thermometer 810 is stored in the ROM or RAM of the controller 1000. The software includes, for example, firmware applications and other executable instructions. The IR temperature compensation module 1050 and the contact temperature compensation module 1055 use output signals from the humidity sensor 910 or ambient temperature sensor 1005 to compensate temperature measurements and generate a compensated IR temperature output and a compensated contact temperature output. The humidity compensation module 1060 uses an output from the ambient temperature sensor to compensate humidity measurements and generate compensated humidity outputs. In other embodiments, the controller 1000 can include additional, fewer, or different components.

The PCB also includes, for example, a plurality of additional passive and active components such as resistors, capacitors, inductors, integrated circuits, and amplifiers. These components are arranged and connected to provide a plurality of electrical functions to the PCB including, among other things, sensing, filtering, signal conditioning, and voltage regulation. For descriptive purposes, the PCB and the electrical components populated on the PCB are collectively referred to herein as "the controller" 1000. The controller 1000 receives signals from the IR temperature sensor 900, the contact temperature sensor port 905, the humidity sensor 910, and the ambient temperature sensor 1005; processes or conditions the signals; and transmits the processed and conditioned signals to the display 825. In some embodiments, the IR temperature sensor 900, the contact temperature sensor port 905, and the humidity sensor 910 are calibrated or recalibrated using the ambient temperature signal. The display 825 receives the processed and conditioned signals and displays an indication of an IR temperature measurement, a contact temperature measurement, a humidity, a dew point, or the like to the user.

In some embodiments, a battery pack controller (not shown) provides information to the thermometer controller 1000 related to a battery pack temperature or voltage level. The thermometer controller 1000 and the battery pack also include low voltage monitors and state-of-charge monitors. The monitors are used by the thermometer controller 1000 or the battery pack controller to determine whether the battery pack 100 is experiencing a low voltage condition, which may prevent proper operation of the thermometer 810, or if the battery pack is in a state-of-charge that makes the battery pack susceptible to being damaged. If such a low voltage condition or state-of-charge exists, the thermometer 810 is shut down or the battery pack 100 is otherwise prevented from further discharging current to prevent the battery pack from becoming further depleted.

The IR temperature sensor 900 is, for example, a thermopile. The thermopile includes a plurality of thermoelements (e.g., thermocouples) connected in series to form a sensing area or detector, and the sensing area is covered with an IR-absorbing material. A lens focuses infrared energy onto the detector, and the thermopile outputs a signal which is directly proportional to the power of the infrared radiation incident upon the detector. In some embodiments, the IR temperature sensor 900 is operable to sense temperatures in the range of, for example, $-30°$ C. ($-22°$ F.) to $800°$ C. ($1472°$ F.). The contact temperature sensor port 905 is, for example, a thermocouple port and is operable to receive a thermocouple, such as a K-type thermocouple. The combination of the thermocouple and the thermocouple port are referred to herein as the thermocouple 905. The thermocouple 905 includes two metallic elements (e.g., a hot junction and a cold junction) which provide differing output voltages. The difference between the output voltages is used to determine a contact temperature measurement. The ambient temperature sensor 1005 (e.g., a thermistor) is used in combination with a look-up table for cold junction compensation of the thermocouple 905. In some embodiments, the thermocouple 905 is operable to detect temperatures in the range of, for example, $-40°$ C. ($-40°$ F.) to $550°$ C. ($1022°$ F.). The thermocouple may be used independently of the temperature sensor. As such, an output of the thermocouple 905 is not used to compensate or otherwise modify an output of the thermopile. The thermopile is operable to sense a first temperature of a first area in a non-contact manner, and the thermocouple 905 is operable to sense a second temperature of a second area in a contact manner. In some embodiments, the first area and the second are located on the same object or surface, and the thermocouple 905 can be used in conjunction with the IR temperature sensor 900 to provide, for example, both contact and non-contact temperature measurements of an object. In other embodiments, the first area is located on a first object, and the second area is located on a second object.

The humidity sensor 910 provides a signal to the controller 1000 that is indicative of the humidity in the environment surrounding the thermometer 810. The humidity sensor 910 is for example, a resistive hygrometer which uses a polymer membrane which has a conductivity that varies with the amount of water it absorbs. The humidity sensor 910 is used for calibrating the IR temperature sensor 900 and for compensating measurements made using the IR temperature sensor 900 and the thermocouple 905. In some embodiments, the humidity is displayed on the display 825.

The thermometer 810 also includes a distance-to-spot ratio ("D:S"). The D:S ratio is a ratio of a distance to an object and a diameter of a temperature measurement area (i.e., a spot size). For example, if the D:S is 20:1, the IR temperature sensor 900 averages the temperature of an object twenty feet away over an area with a one-foot diameter. The farther the IR temperature sensor 900 is from the object, the larger the spot size. In some embodiments, the IR temperature sensor 900 includes settings for measuring the temperature of both reflective and non-reflective surfaces.

In some embodiments, the thermometer 810 also includes a distance meter (not shown). The distance meter is, for example, a laser distance meter. The distance meter uses a time-of-flight of a light pulse or an ultrasonic wave to determine a distance to the object. The distance meter measures the time-of-flight required for the light pulse or the ultrasonic wave to travel to the object and back. Based on the time-of-flight and a known speed of light (or sound), the distance to the object is calculated. In other embodiments of the invention, different techniques are used to determine the distance to the object such as a multiple frequency phase-shift technique.

The spot size is calculated using the D:S ratio of the IR temperature sensor 900 and a distance measurement from the distance meter. For example, the distance meter and the IR temperature sensor 900 are aligned along an axis such that the distance meter and the temperature sensor are approximately the same distance from the object. The distance meter uses a single beam of light to determine the distance from the thermometer 810 to the object. The thermometer 810 uses the distance measurement from the distance meter and the D:S ratio to calculate the diameter of a measurement area on the object. The thermometer 810 then displays, for example, a numerical representation of the spot size, an area of the spot, or both. In other embodiments, a visual representation of the measurement area and/or the spot size is displayed.

Figure 33:
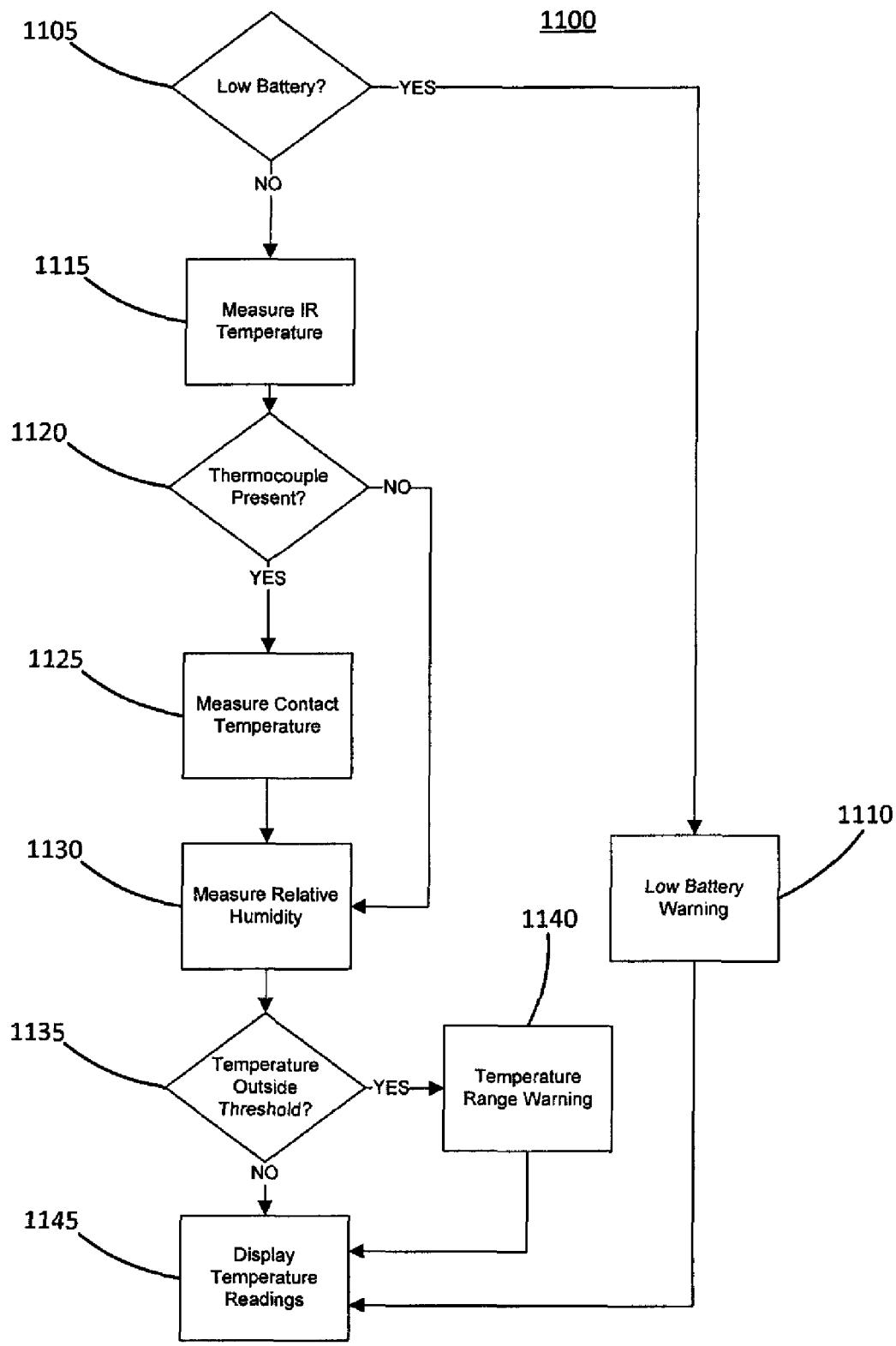
FIG. 33 illustrates a process for operating an IR thermometer according to an embodiment of the invention.
Figure 34:
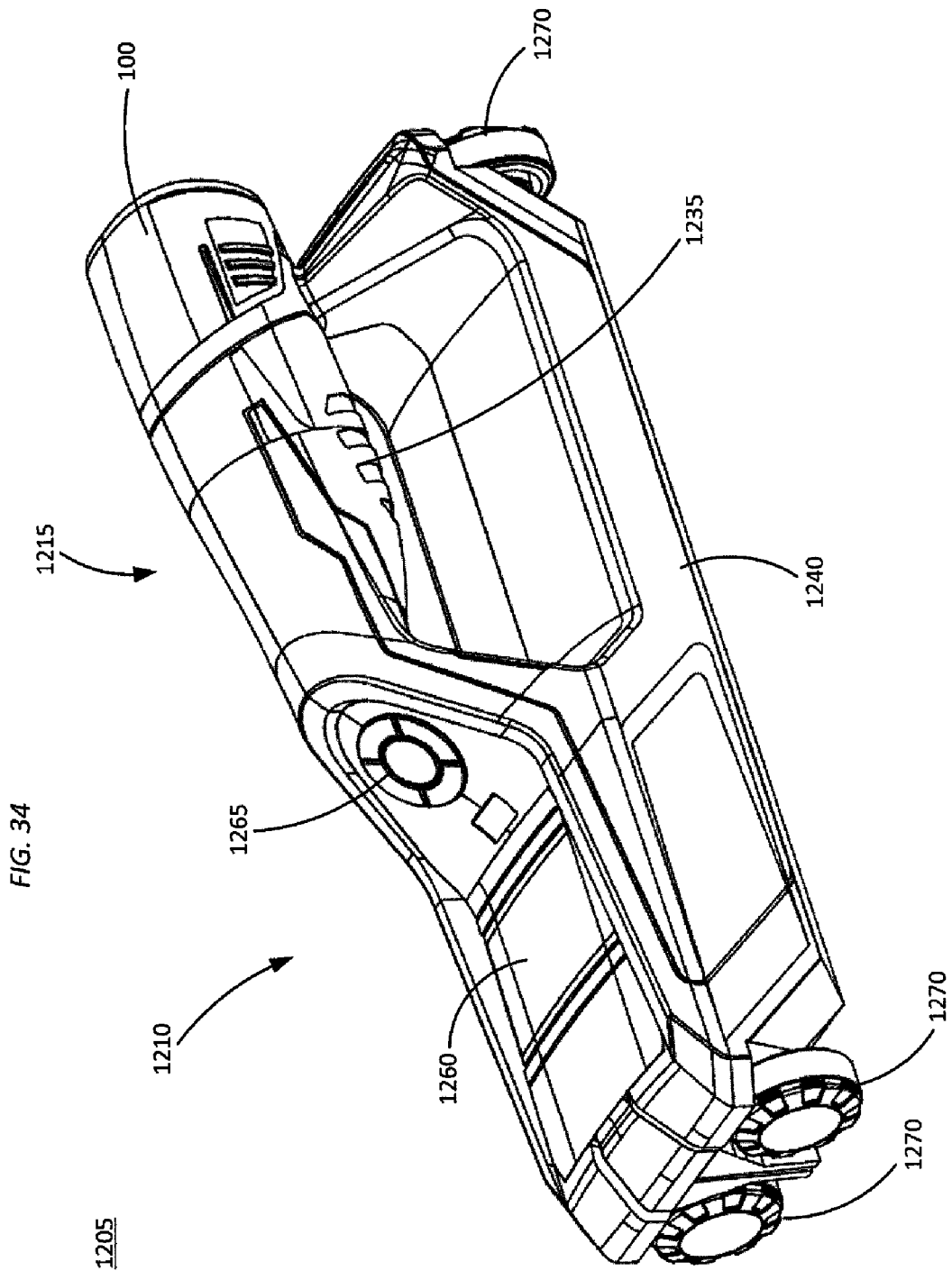
FIG. 34 illustrates a perspective view of a wall scanner according an embodiment of the invention.
Figure 35:
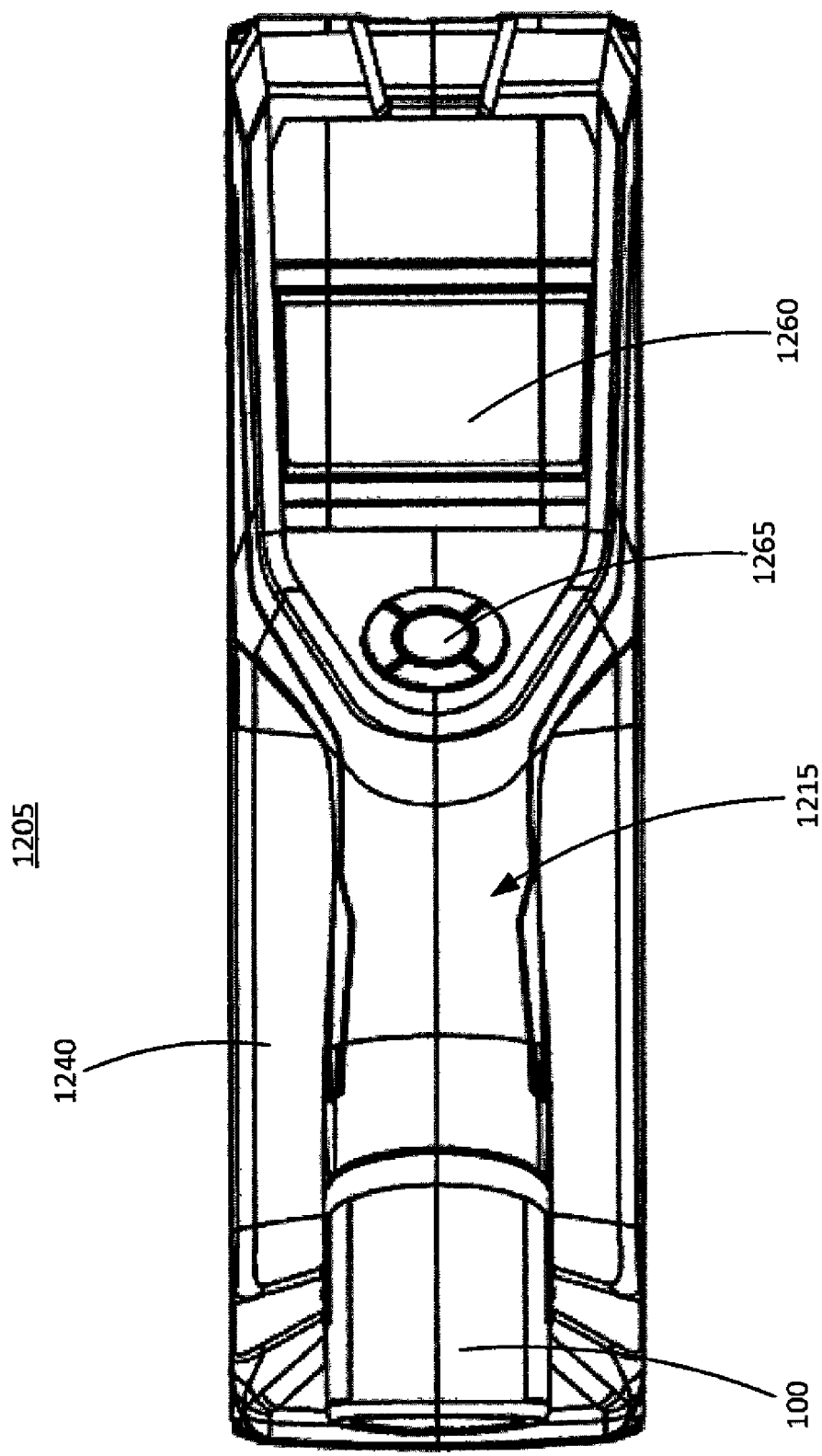
FIG. 35 illustrates a top view of the wall scanner of FIG. 34.
Figure 36:
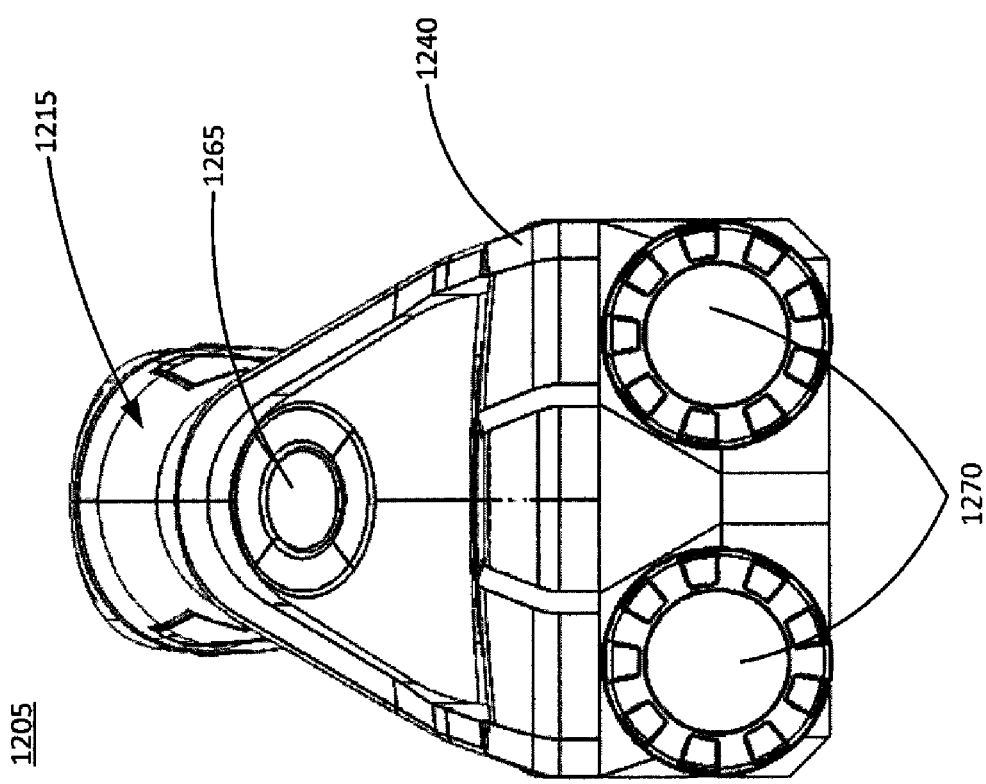
FIG. 36 illustrates a front view of the wall scanner of FIG. 34.
Figure 37:
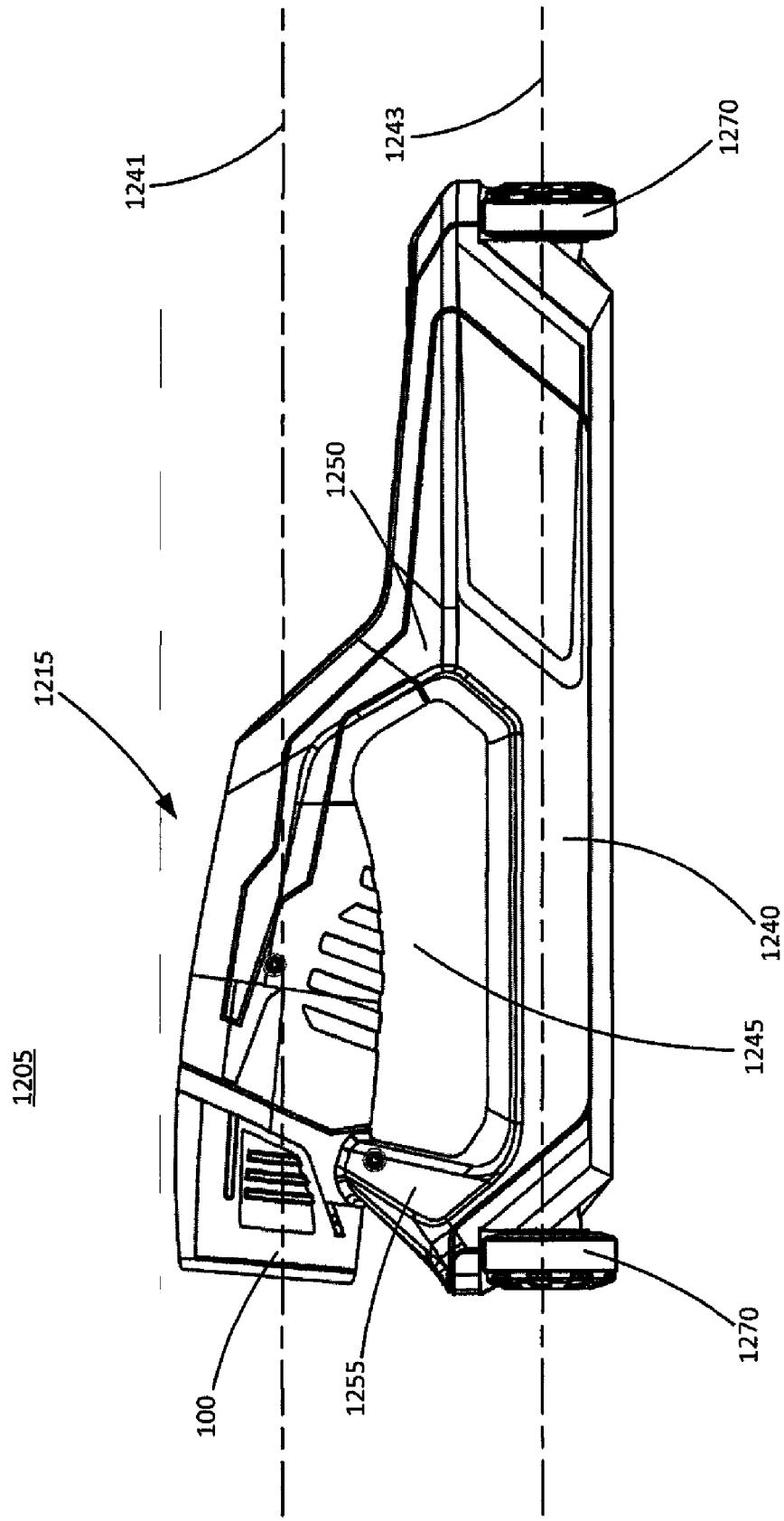
FIG. 37 illustrates a side view of the wall scanner of FIG. 34.

FIG. 33 illustrates a process 1100 for taking a temperature measurement using the thermometer 810. The thermometer 810 first determines whether the battery pack 100 is experiencing a low-voltage condition (step 1105). If the battery pack 100 is in a low-voltage condition, a low-battery warning is initiated (step 1110). In some embodiments, the low-battery warning is displayed on the display 825. In other embodiments, an LED is lighted or a buzzer is sounded to provide the low-battery warning. If no low-voltage condition exists, the thermometer 810 is operable to make temperature measurements. A default operational and display mode for the thermometer 810 is the non-contact temperature measurement mode. To take an IR temperature measurement (step 1115), the user engages the trigger 830. Temperature measurements are taken as long as the trigger 830 is engaged. Alternatively, if the electronic trigger lock button 895 is engaged, a continuous temperature measurement can be taken without continuously engaging the trigger 830. The thermometer 810 then determines whether a thermocouple 905 is present (step 1120). If a thermocouple 905 is present, a contact temperature measurement is taken (step 1125) and the relative humidity is measured using the humidity sensor 910 (step 1130). If no thermocouple 905 is present, the thermometer 810 measures the relative humidity using the humidity sensor 910 (step 1130). The thermometer 810 then determines whether the measured IR temperature is greater than the high-temperature alarm threshold or below the low temperature alarm threshold (step 1135). If the measured IR temperature is outside of the high and low threshold values, a temperature range warning is initiated (step 1140). In some embodiments, the temperature range warning is displayed on the display 825. In other embodiments, an LED is lighted or a buzzer is sounded to provide the temperature range warning. If the measured IR temperature is not greater than the high temperature alarm threshold or less than the low temperature alarm threshold, the measured temperature is displayed on the display 825 (step 1145).

Another embodiment of the invention is described with respect to a wall scanner that is capable of detecting a plurality of objects hidden behind a plurality of different surfaces. The wall scanner includes a housing, a plurality of sensors, a display, a control section, and a plurality of wheels. The housing includes a body portion and a handle portion similar to the handle 10 described above with respect to FIGS. 1-3. The handle portion includes a recess that is adapted to receive the battery pack 100 described above with respect to FIGS. 4-6.

FIGS. 34-41 illustrate the wall scanner 1205 and housing 1210 according to an embodiment of the invention. A handle portion 1215 of the wall scanner housing 1210 includes a battery pack recess 1220 (see FIG. 38) adapted to receive the battery pack 100. The battery pack recess 1220 includes a plurality of terminals (shown as 1345 in FIG. 40) for electrically connecting the battery pack 100 to the wall scanner 1205. Additionally, the handle portion 1215 includes a plurality of recessed gripping portions 1235 that provide additional grip to a user.

The handle portion 1215 and the battery pack 100 define a first axis 1241 of the wall scanner 1205. The handle portion 1215 is coupled to and extends from the body portion 1240 of the wall scanner 1205 such that a recess 1245 is formed between the body portion 1240 and the handle portion 1215. The extension of the handle portion 1215 from the body portion 1240 allows the wall scanner 1205 to receive the battery pack 100. In some embodiments, the recess 1245 between the handle portion 1215 and the body portion 1240 is closed by first and second connecting portions 1250 and 1255. In other embodiments, the recess 1245 is open and includes a single connecting portion. The recess 1245 defines a space for accommodating the fingers of a user while the user is holding the wall scanner 1205.

The handle portion 1215 extends approximately half the length of the housing 1210 and is approximately parallel to the body portion 1240 and a display 1260. In one embodiment, the first axis 1241 is parallel to a second axis 1243 which extends through a center of the body portion 1240. In other embodiments, the first axis 1241 is not parallel to the second axis 1243, and the first axis 1241 intersects the second axis 1243 at a point a distance, d, away from the wall scanner 1205. The display 1260 is positioned on the body portion 1240 such that the display 1260 is not blocked by the user's hand when the wall scanner 1205 is being gripped. The control section 1265 is provided on the first connecting portion 1250 between the body portion 1240 and the handle portion 1215 of the wall scanner 1205. The control section 1265 is positioned at an oblique angle with respect to the body portion 1240 of the housing such that the buttons or switches (described below) within the control section 1265 can be activated by the user using the same hand with which the user is gripping the wall scanner 1205. In some embodiments, the wall scanner 1205 also includes one or more LEDs for providing an indication to the user of the status of the wall scanner 1205, the battery pack 100, or both. The wheels 1270 are rotatably coupled to the housing 1210 to facilitate movement of the wall scanner 1205 along a surface. In the illustrated embodiment, the wheels 1270 are idle wheels, but may alternatively be driven wheels that are powered by the battery pack 100.

Figure 38:
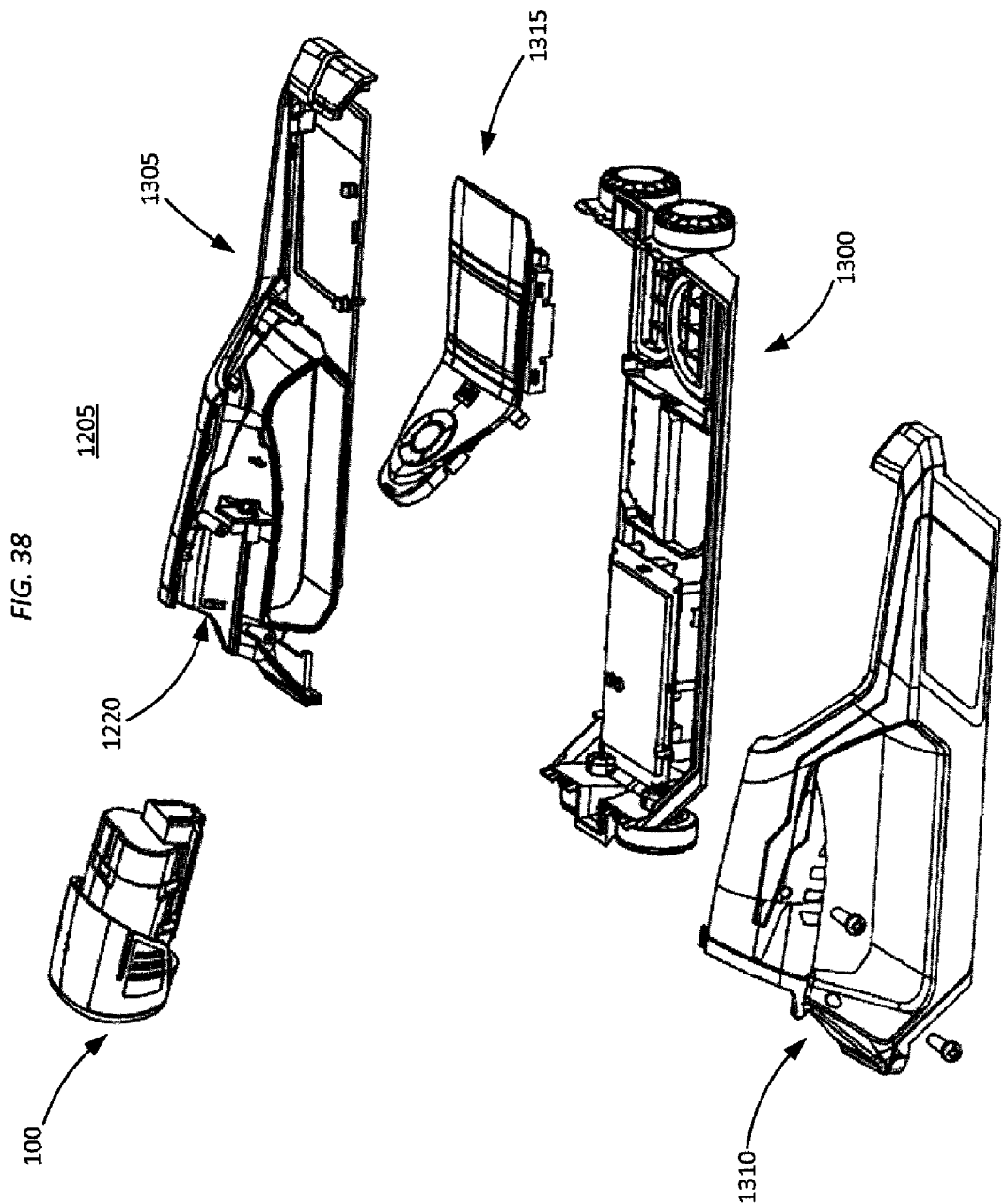
FIG. 38 illustrates an exploded view of the wall scanner of FIG. 34.
Figure 39:
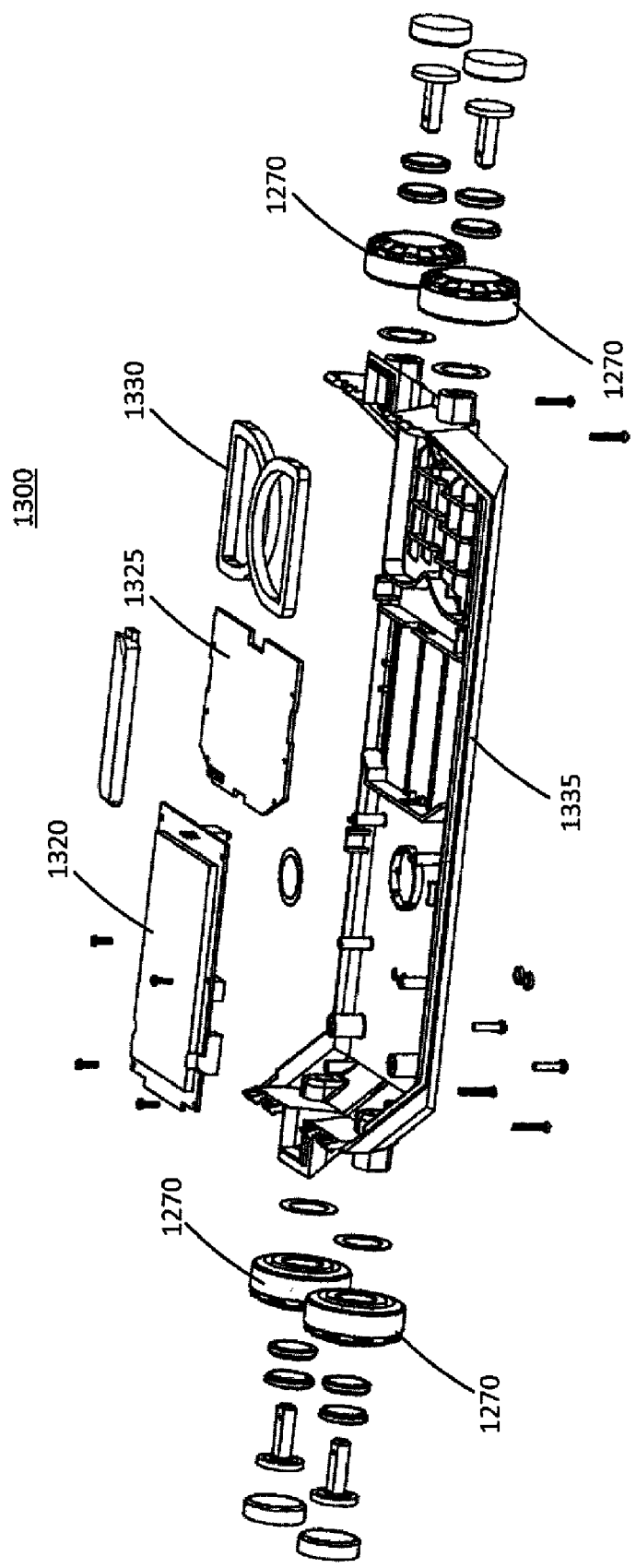
FIG. 39 illustrates an exploded view of a lower portion of the wall scanner of FIG. 34.
Figure 40:
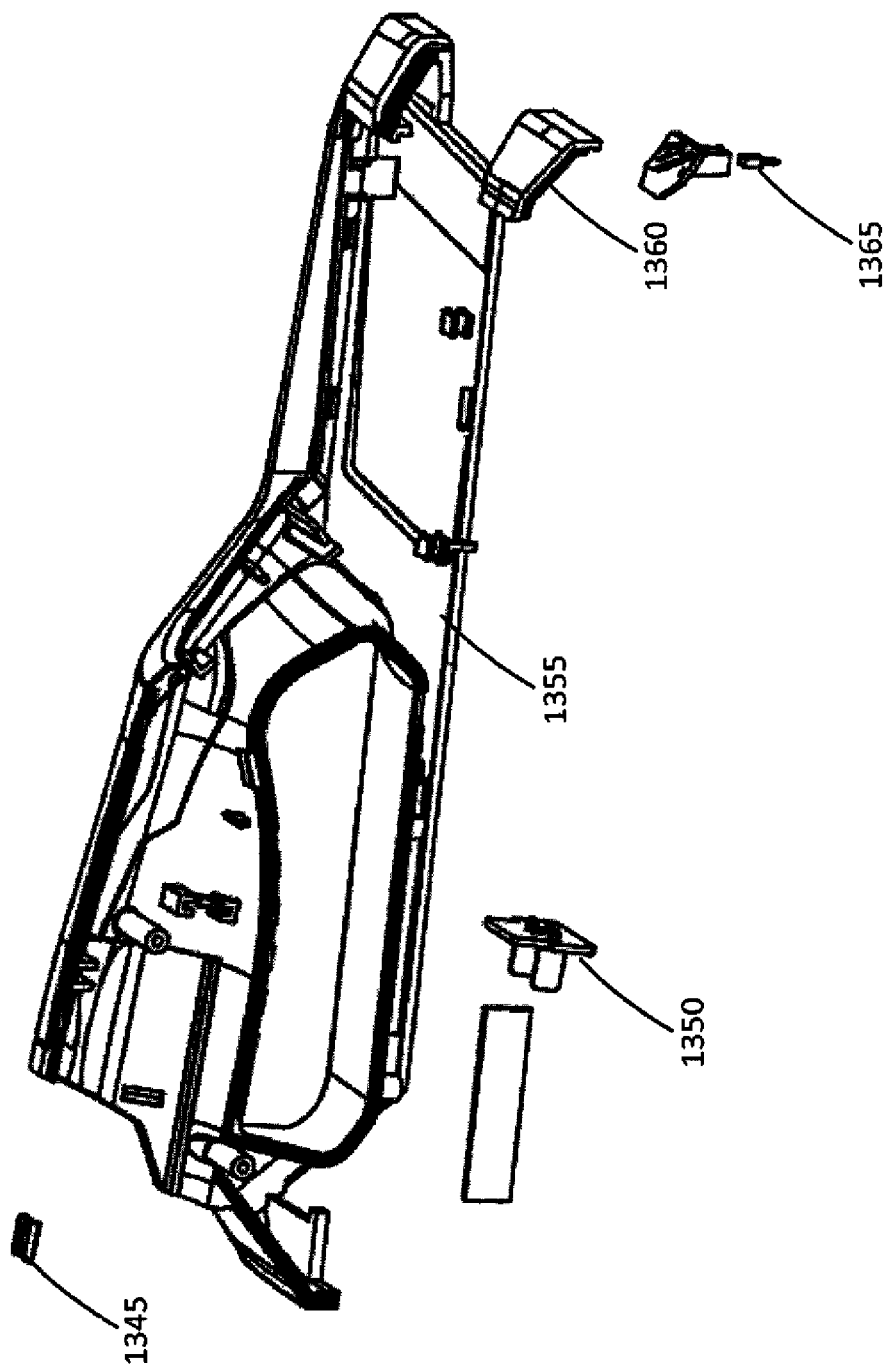
FIG. 40 illustrates an exploded view of a side portion of the wall scanner of FIG. 34.
Figure 41:
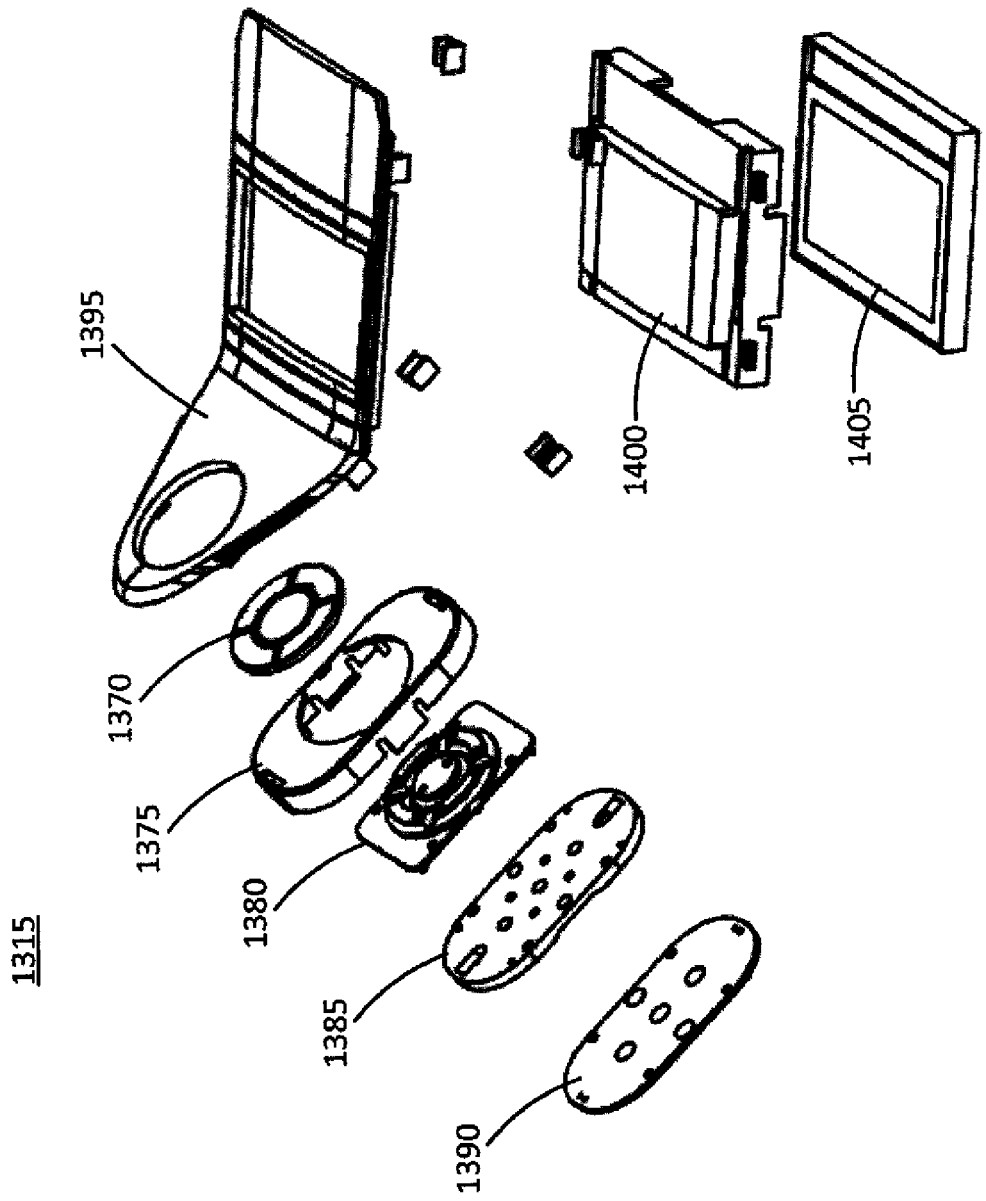
FIG. 41 illustrates an exploded view of a control section and a display according to an embodiment of the invention.

FIG. 38 illustrates an exploded view of the wall scanner 1205 shown in FIGS. 34-41. The wall scanner 1205 includes a base housing assembly 1300, right and left housing assemblies 1305 and 1310, a panel assembly 1315, and the battery pack 100. An exploded view of the base housing assembly 1300 is shown in FIG. 39. The base housing assembly 1300 includes a main printed circuit board assembly ("PCB") 1320, a sensor board 1325 which includes plate sensors for sensing studs, a D-coil sensor 1330 for sensing metal, a base 1335, and the wheels 1270. An exploded view of the right housing assembly 1305 is shown in FIG. 40. The left housing assembly 1310 is similar to the right housing assembly 1305 and is not described in detail. The right housing assembly 1305 includes contact plate terminals 1345, a battery contact PCB 1350, a right half of the housing 1355, an indicator lens 1360, and an LED 1365. An exploded view of the panel assembly 1315 is shown in FIG. 41. The panel assembly 1315 includes a keypad 1370, a key holder 1375, a rubber key 1380, a light guide 1385, a key PCB 1390, a key panel 1395, an LCD lens 1400, and an LCD assembly 1405.

Figure 42:
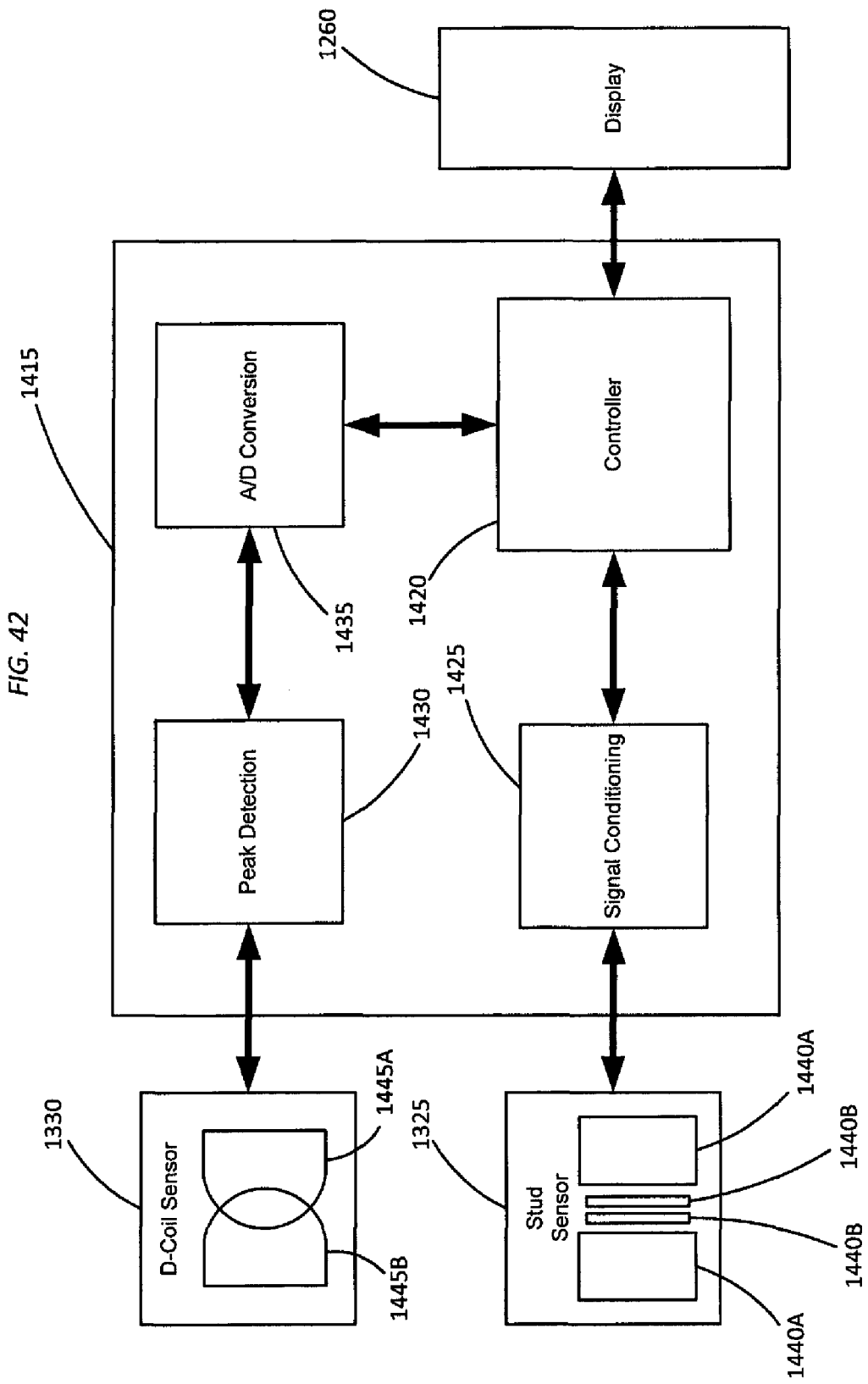
FIG. 42 is a block diagram of a wall scanner according to an embodiment of the invention.

FIG. 42 is a block diagram of a wall scanner 1205 according to an embodiment of the invention. The wall scanner 1205 includes a main system module 1415, the stud sensor 1325, the D-coil sensor 1330, and the display 1260. The main system module 1415 includes, among other things, a wall scanner controller 1420, a signal conditioning module 1425, a peak detection module 1430, and an analog-to-digital conversion module 1435. The display 1260 is, for example, a 128× 64 dot matrix liquid crystal display ("LCD") or negative LCD ("NLCD"). The wall scanner controller 1420 includes, for example, a PCB such as PCB 1320 shown in FIG. 39. The PCB 1320 is populated with a plurality of electrical and electronic components which provide operational control and protection to the wall scanner 1205. In some embodiments, the PCB 1320 includes a control or processing unit such as a microprocessor, a microcontroller, or the like. In some embodiments, the controller 1420 includes, for example, the processing unit, a memory, and a bus. The bus connects various components of the controller 1420 including the memory to the processing unit. The memory includes, in many instances, read only memory ("ROM") and random access memory ("RAM"). The controller 1420 also includes an input/output system that includes routines for transferring information between components within the controller 1420. Software included in the implementation of the wall scanner 1205 is stored in the ROM or RAM of the controller 1420. The software includes, for example, firmware applications and other executable instructions. In other embodiments, the controller 420 can include additional, fewer, or different components.

The PCB 1320 also includes, for example, a plurality of additional passive and active components such as resistors, capacitors, inductors, integrated circuits, and amplifiers. These components are arranged and connected to provide a plurality of electrical functions to the PCB 1320 including, among other things, filtering, signal conditioning, and voltage regulation. For descriptive purposes, the PCB 1320 and the electrical components populated on the PCB 1320 are collectively referred to herein as "the controller" 1420. The controller 1420 receives signals from the sensors within the wall scanner, conditions and processes the signals, and transmits processed and conditioned signals to the display 1260. The display 1260 receives the processed and conditioned signals and displays an indication of a sensed characteristic of an object hidden behind a surface. The signal conditioning module 1425 provides signals to and receives signals from the stud sensor 1325, as described below; the peak detection module 1430 receives signals from and sends signals to the D-coil sensor 1330, as described below; and the analog-to-digital conversion module 1435 provides the conversion necessary for the controller 1420 to interpret analog signals from the D-coil sensor 1330.

In some embodiments, a battery pack controller (not shown) can provide information to the wall scanner controller 1420 related to a battery pack temperature or voltage level. The wall scanner controller 1420 and the battery pack controller also include low voltage monitors and state-of-charge monitors. The monitors are used by the wall scanner controller 1420 or the battery pack controller to determine whether the battery pack 100 is experiencing a low voltage condition which may prevent proper operation of the wall scanner 1205, or if the battery pack 100 is in a state-of-charge that makes the battery pack 100 susceptible to being damaged. If such a low voltage condition or state-of-charge exists, the wall scanner 1205 is shut down or the battery pack 100 is otherwise prevented from further discharging current to prevent the battery pack 100 from becoming further depleted.

The wall scanner 1205 is operable to detect the presence of a stud, such as a wood stud or metal joists within residential, commercial, and industrial structures using the stud sensor 1325. The wooden studs or metal joists can be detected when hidden behind surfaces composed of, for example, plaster, non-metallic wall materials, wooden panels, wall board, and the like. The stud sensor 1325 includes a sensor circuit with a pair of sensors. Each sensor includes a coplanar primary plate 1440A with a single side coplanar plate 1440B arranged between the primary plates. The presence and location of the stud is then determined in a manner similar to that described in U.S. Patent Application Publication No. 2008/0238403, titled "STUD SENSOR," the entire contents of which are hereby incorporated by reference.

The wall scanner 1205 is also configured to operate in a metal scanning mode. The metal scanning mode is operable to detect both ferrous (i.e., iron based) and non-ferrous (e.g., copper) metals within residential, commercial, and industrial structures. While in the metal scanning mode, the wall scanner 1205 can detect metal (e.g., rebar, metal conduit, copper piping, etc.) behind surfaces composed of wall board, tile, plaster, brick, or the like. The wall scanner 1205 can also detect metal within walls composed of concrete, masonry, wood, brick, or the like. In some embodiments, the wall scanner 1205 is operable to sense metal to a depth of, for example, six inches.

The D-coil sensor 1330 illustrated in FIG. 39 uses an inductively coupled sensor that includes overlapping D-shaped transmitter and receiver coils 1445A and 1445B. When the D-coil sensor 1330 detects a metallic object, the sensor 1330 outputs a signal to the controller 1420 indicating the location of the object. The wall scanner 1205 detects the presence of metal in a manner similar to that described in U.S. Patent Application Publication No. 2008/0272761, titled "DEVICE AND METHOD OF DETECTING FERRITE AND NON-FERRITE OBJECTS," the entire contents of which are hereby incorporated by reference.

The wall scanner 1205 is also configured to detect the presence of "live" (i.e., energized) electrical wiring behind a surface. In some embodiments, the wall scanner 1205 includes an AC detection circuit such as that described in U.S. Pat. No. 6,894,508, titled "APPARATUS AND METHOD FOR LOCATING OBJECTS BEHIND A WALL LINING," the entire contents of which are hereby incorporated by reference. In other embodiments, the wall scanner 1205 includes a detachable non-contact voltage detector (not shown), such as that described in co-pending U.S. patent application Ser. No. 12/421,187, filed on Apr. 9, 2009 and titled "SLIDABLY ATTACHABLE NON-CONTACT VOLTAGE DETEC-TOR," the entire contents of which were previously incorporated by reference, which is slidably attachable to the housing 1210 of the wall scanner 1205. The wall scanner 1205 includes the LED 1365 for indicating the detection of an AC voltage. The LED 1365 can be located at a first end of the wall scanner 1205, such as the end opposite the battery pack 100 (as shown in FIG. 40), on the display 1260, or both. The wall scanner 1205 is operable to sense the presence of AC voltages regardless of the operational mode of the wall scanner 1205 (e.g., metal sensing mode or stud sensing mode), and the wall scanner 1205 does not need to be calibrated to detect the presence of AC voltages.

Figure 43:
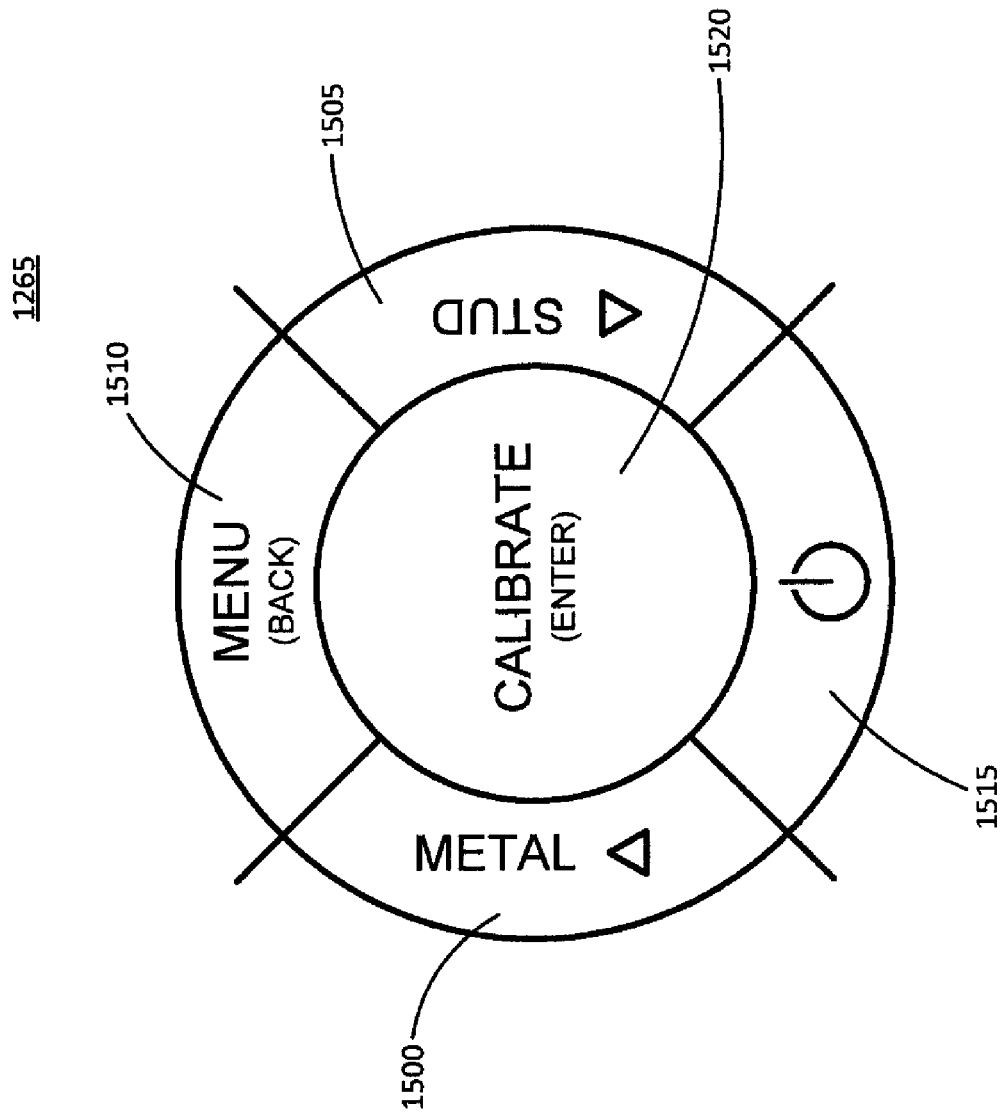
FIG. 43 illustrates a control section of a wall scanner according to an embodiment of the invention.

FIG. 43 illustrates the control section 1265 of the wall scanner 1205. The control section 1265 is positioned between the display 1260 and the handle portion 1215 along the first axis 1241. The control section 1265 includes buttons, switches, or other actuation devices for controlling the function and operation of the wall scanner 1205. In some embodiments, the control section 1265 includes a metal sensing mode button 1500, a stud sensing mode button 1505, a menu button 1510, a power button 1515, and a calibration button 1520. In other embodiments, the control section 1265 includes additional buttons or switches for controlling additional or different features or functions of the wall scanner 1205. One or more of the buttons included in the control section 1265 may have multiple functions such as selecting an operational mode and enabling a user to scroll through menu options on the display 1260. In the illustrated embodiment of the control section 1265, the buttons are arranged in a circular manner. In other embodiments, the buttons in the control section 1265 can be arranged in a variety of different configurations, such as a grid or an array. In various embodiments of the control section 1265, the buttons are configured such that a user can access and select each button using a single hand (e.g., the same hand the user is using to grip the handle portion of the wall scanner).

Figure 44:
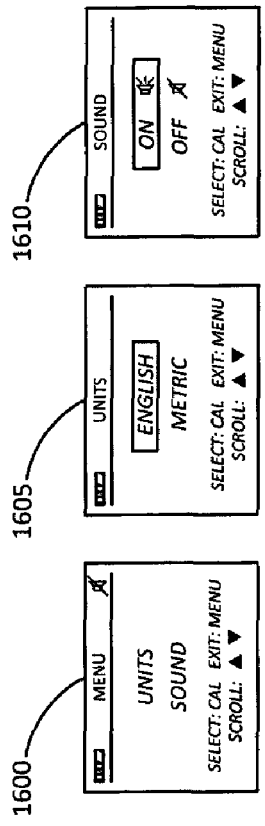
FIG. 44 illustrates a plurality of display screens of a wall scanner according to an embodiment of the invention.
Figure 45:
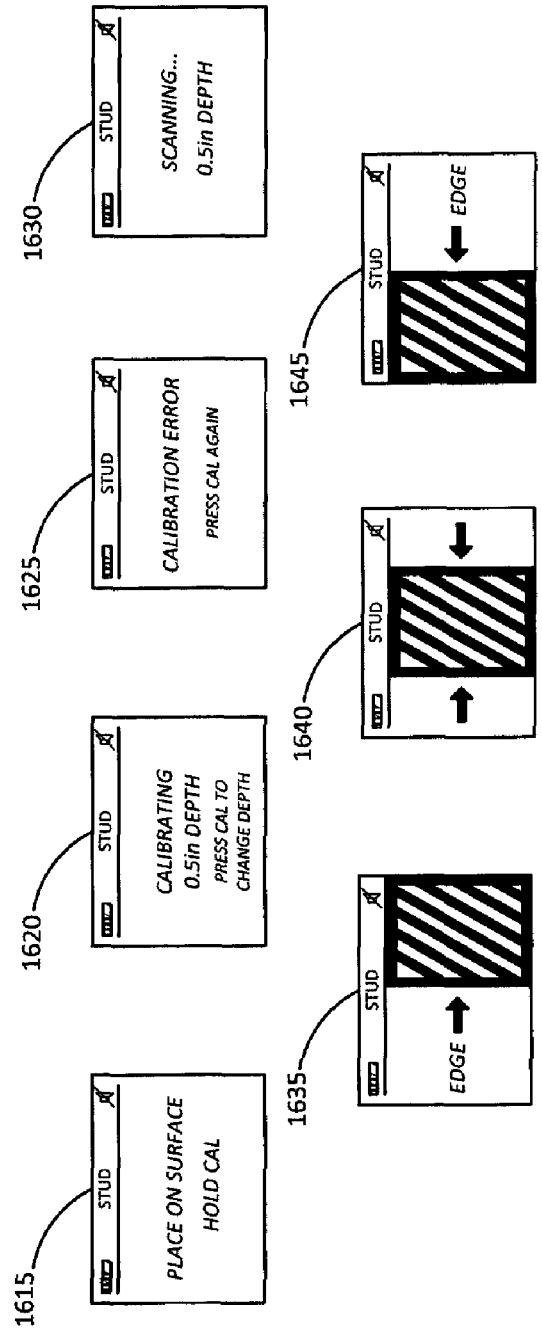
FIG. 45 illustrates a plurality of display screens of a wall scanner in a stud scanning mode according to an embodiment of the invention.
Figure 46:
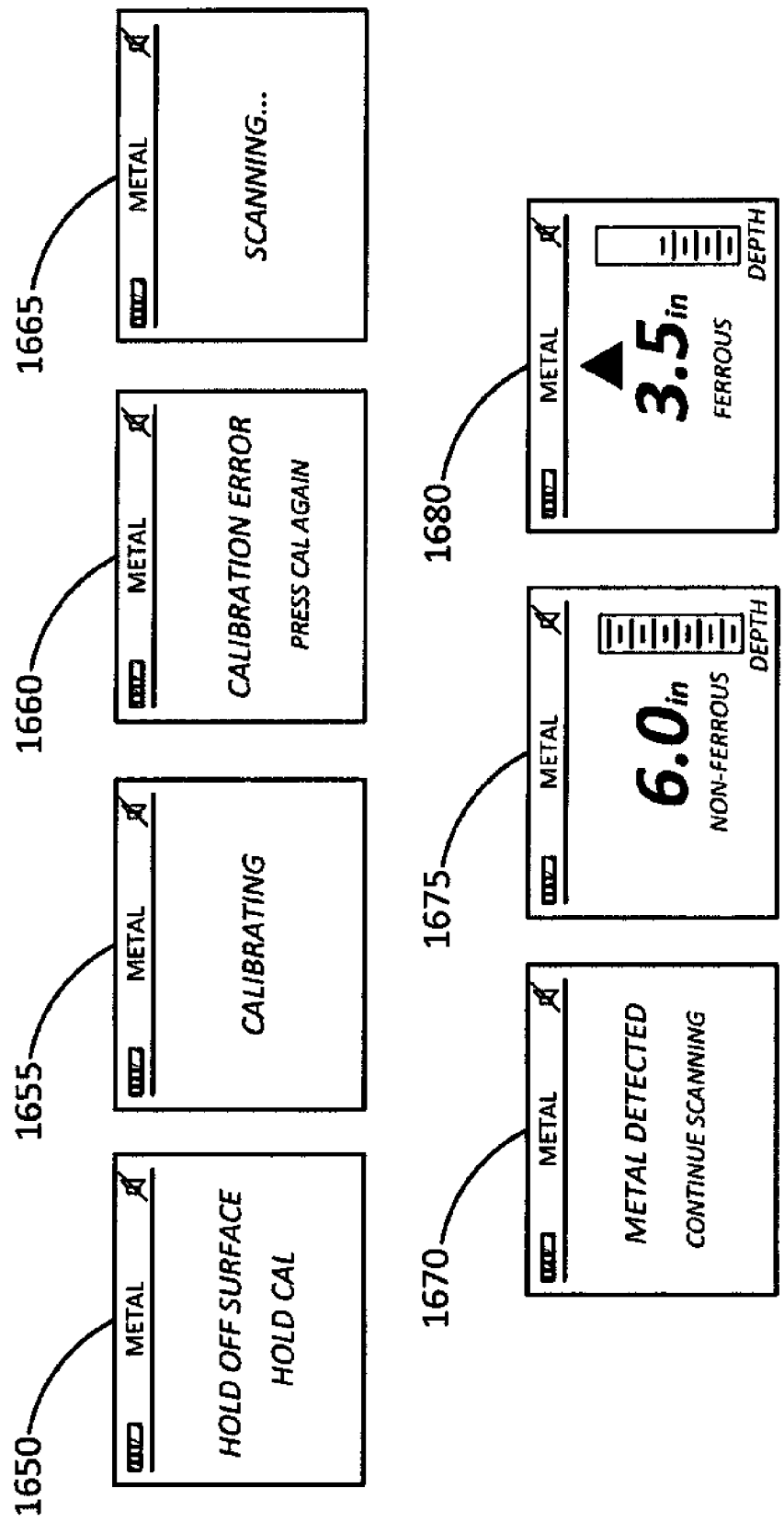
FIG. 46 illustrates a plurality of display screens of a wall scanner in a metal scanning mode according to an embodiment of the invention.

The display 1260 is symmetrically aligned along the first axis 1241 defined by the handle portion 1215 and the battery pack 100. The display 1260 is configured to display a plurality of status indications related to the operation of the wall scanner 1205. For example, the display 1260 can display, among other things, the operational mode of the wall scanner 1205, the location of an object hidden behind the surface in real-time, the depth of an object hidden behind the surface, whether an object hidden behind the surface is ferrous or non-ferrous, battery pack power level, and an indication of whether sound (i.e., audible indication) is turned on or off. FIGS. 44-46 illustrate embodiments of wall scanner status indications that the display 1260 is configured to display.

The controller 1420 receives signals from the sensors, processes or conditions the signals, and transmits the conditioned signals to the display 1260, as described above. The display 1260 receives the conditioned signals and displays an image, a value (e.g., a distance, coordinates, etc.), an alert relating to the detected object, test results, measurement values, properties of the wall scanner, etc. The display 1260 includes lighted symbols, such as white alphanumeric symbols, on a black background. The display 1260 improves the visibility of the display in low or poor lighting conditions, such as outdoor, dark, or dirty conditions. Additionally or alternatively, the wall scanner 1205 can include a remote display (not shown) that can be attachable to or detachable from the wall scanner 1205 to provide the user with a remote display of the detection and/or position of a stud, or the operation of the wall scanner 1205. The wall scanner 1205 can include a transmitter and a receiver for communicating with the remote display. In some embodiments, the remote display is configured to display the same information as the display 1260.

The user can access a menu (screen 1600) on the display 1260 by activating buttons in the control section 1265. From the menu, a list of options relating to various settings of the wall scanner 1205 is displayed on the display 1260. The user is able to select between English and metric units for displaying the depth or location of an object (screen 1605). The user can also select whether sound is activated (screen 1610). When sound is activated, the wall scanner 1205 produces, for example, a beep or a series of beeps to indicate the presence or depth of an object hidden behind a surface. In other embodiments, the menu is operable to control additional functions such as display screen brightness, turning a backlight on and off, controlling the operation of a remote display, and adjusting wall scanner sensitivities. As such, the wall scanner 1205 is a menu-driven device.

The display 1260 also provides instructions to the user for calibrating the wall scanner 1205 after power-up. When the wall scanner 1205 is operating in the stud sensing mode, the user is prompted to place the wall scanner 1205 on the surface to be scanned and activate the calibration button 1520 (screen 1615). The display 1260 then indicates to the user that the wall scanner 1205 is being calibrated (screen 1620). The user can, if desired, manually change the sensitivity (e.g., scan depth) of the wall scanner 1205. For example, in one embodiment, a default depth setting of 0.5 inches is set for the wall scanner 1205 when in the stud sensing mode. To change the scanning depth, the user activates the calibration button 1520 while the wall scanner 1205 is calibrating. Activating the calibration button 1520 a second time changes the scanning depth from 0.5 inches to 1.0 inches. Activating the calibration button 1520 a third time changes the scanning depth from 1.0 inches to 1.5 inches. If the calibration button is activated a fourth time, the scanning depth cycles back to 0.5 in. In other embodiments, the wall scanner 1205 is configured with different scanning depths and sensitivities. If an error occurs during calibration, the user is prompted with an error message, such as that shown in screen 1625.

After calibration, the display 1260 indicates when the wall scanner 1205 is scanning for a stud (screen 1630). The display 1260 is configured to display the location of a detected stud in real-time as the wall scanner 1205 is passing over the stud. For example, when the wall scanner 1205 is moving from left to right across a surface and a stud is detected, the stud is identified by a partially illuminated portion of the display 1260 (e.g., the stud is represented by a combination of illuminated pixels and non-illuminated pixels). The illuminated pixels form a plurality of lines such as horizontal lines, vertical lines, diagonal lines, or any combination thereof which are separated by non-illuminated pixels or lines. The display 1260 also includes a visual and/or linguistic identification of the edge of the stud (e.g., an arrow and/or the word "edge" displayed on the wall scanner display), as shown in screen 1635. The display 1260 can also display both edges of a stud if the width of the stud is not greater than the width of the display 1260. In such an instance, each edge is identified by an arrow and/or a linguistic identification, and the stud is represented by a combination of illuminated and non-illuminated portions (screen 1640). The wall scanner 1205 includes similar visual representations of a stud's location in real-time when the wall scanner is moving from the right to the left (screen 1645).

When the wall scanner 1205 is operating in the metal sensing mode, the user is prompted to hold the wall scanner 1205 off of the surface to be scanned in order for the wall scanner 1205 to be properly calibrated (screen 1650). Similar to the stud sensing mode, the wall scanner 1205 provides an indication on the display that the wall scanner 1205 is being calibrated (screen 1655). If an error occurs during calibration, the user is prompted with an error message, such as that shown in screen 1660. After calibration, the display 1260 indicates when the wall scanner 1205 is scanning for metal (screen 1665). If the wall scanner 1205 detects the presence of metal, the user is prompted visually or audibly that metal has been detected (screen 1670). The display 1260 then provides the user with an indication of whether the detected metal is ferrous or non-ferrous, a numerical indication of the depth of the detected object, and a visual indication of the depth of the object (screen 1675). In some embodiments of the invention, the display 1260 can also provide a symbol to indicate the nearest distance to a detected metal object (screen 1680).

Figure 47:
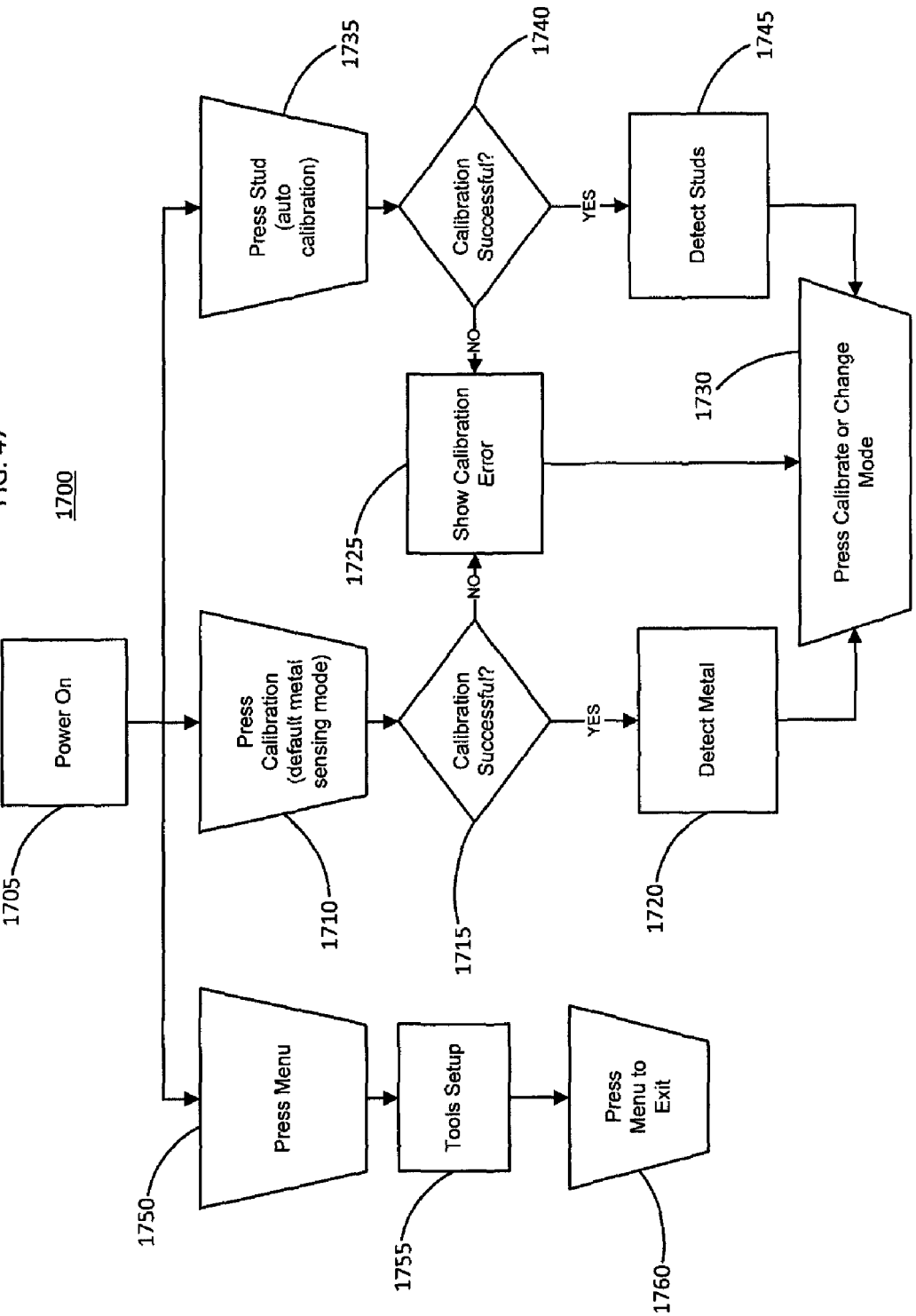
FIG. 47 illustrates a control process for a wall scanner according to an embodiment of the invention.

A process 1700 for the general operation of the wall scanner 1205 is illustrated in FIG. 47. After the wall scanner 1205 is powered up (step 1705), the default sensing mode for the wall scanner 1205 is the metal sensing mode. To use the wall scanner in the metal sensing mode, the user activates the calibration button 1520 from the control section 1265 (step 1710). If the wall scanner 1205 calibrates successfully (step 1715), the wall scanner 1205 is ready to detect metal objects hidden behind a surface (step 1720). If the wall scanner 1205 does not calibrate correctly, a calibration error is displayed (step 1725), and the wall scanner 1205 waits for a user to change sensing modes or activate the calibration button 1520 again (step 1730). In some embodiments, if a user selects the stud sensing mode (step 1735), the wall scanner 1205 calibrates automatically. In other embodiments, the user must activate the calibration button 1520. If the calibration is successful (step 1740), the wall scanner 1205 is ready to detect studs hidden behind a surface (step 1745). If the calibration is not successful, a calibration error is displayed (step 1725), and the wall scanner 1205 waits for the user to change sensing modes or activate the calibration button 1520 again (step 1730). Following steps 1720 and 1745, the wall scanner 1205 also waits for the user to change sensing modes or recalibrate the wall scanner 1205 (step 1730). Alternatively, the user can activate the menu button 1510 from the control section 1265 (step 1750) to set up wall scanner tools (step 1755) such as selecting display units and turning sound on and off. To exit the tools setup, the user activates the menu button 1510 a second time (step 1760).

Thus, the invention provides, among other things, a clamp meter configured to receive a removable and rechargeable battery pack. The clamp meter includes a main body having a first axis, a handle, a clamp, a trigger, and a display. The handle has a second axis and includes a first recess configured to receive the battery pack. The second axis forms an oblique angle with the first axis, and the battery pack is inserted into the first recess along the second axis. The clamp is coupled to the main body, aligned with the first axis, and operable to measure an electrical characteristic of a conductor based on an induced current. Various features and advantages of the invention are set forth in the following claims.

What is claimed is:

1. A clamp meter configured to receive a removable and rechargeable battery pack, the clamp meter comprising:
   a main body having a first axis;
   a handle having a second axis and including a first recess configured to receive the battery pack, the first recess including at least first and second electrical terminals which are exposed when the battery pack is not inserted into the first recess,
   wherein the second axis forms an oblique angle with the first axis, and wherein the battery pack is inserted into the first recess along the second axis;

a clamp coupled to and supported by the main body, the clamp aligned with the first axis, the clamp operable to measure an electrical characteristic of a conductor based on an induced current;

a trigger operable to selectively open and close the clamp, the trigger positioned below the main body in a second recess of the handle; and a display configured to display an indication of the electrical characteristic.

2. The clamp meter of claim 1, further comprising a non-contact voltage detector.

3. The clamp meter of claim 2, further comprising a voltage sense indicator.

4. The clamp meter of claim 1, further comprising an LED flashlight.

5. The clamp meter of claim 4, wherein the LED flashlight is operable to illuminate a first area enclosed by the clamp.

6. The clamp meter of claim 1, further comprising a pair of electrical leads operable to receive a pair of electrical probes.

7. The clamp meter of claim 1, wherein the battery pack is a lithium-ion battery pack.

8. A method of operating a clamp meter that includes a main body, a handle, a clamp supported by the main body, a trigger positioned below the main body, and a pair of electrical leads, the method comprising:

powering the clamp meter with a removable battery pack inserted into a recess of the handle, wherein the battery pack is inserted along a first axis;

sensing, using the clamp, a first electrical characteristic based on an induced current, wherein the clamp is aligned along a second axis, and wherein the first axis and the second axis form an oblique angle;

measuring, based on signals received through the pair of electrical leads, a second electrical characteristic, wherein the pair of electrical leads are operable to receive a pair of electrical probes; and displaying, on a display, an indication of the first electrical characteristic and the second electrical characteristic.

9. The method of claim 8, wherein the battery pack is a lithium-ion battery pack.

10. The method of claim 8, further comprising illuminating an area enclosed by the clamp using a flashlight powered by the battery pack.

11. The method of claim 8, further comprising detecting a voltage using a non-contact voltage detector.

12. The method of claim 11, further comprising activating a voltage sense indicator when the voltage is detected.

13. A test and measurement device configured to receive a removable and rechargeable battery pack, the device comprising:

a main body having a first axis;

a handle having a second axis; and a first recess and a second recess, the first recess including a mating interface for receiving, along the second axis, a first attachment operable to provide power to the test and measurement device, and the second recess configured to receive a trigger operable to provide operational control for the test and measurement device, the second recess positioned below the main body;

wherein the handle is offset from the main body of the test and measurement device, and wherein the handle is attached to a lower portion of the main body along the second axis such that the handle forms an oblique angle with respect to the first axis.

14. The test and measurement device of claim 13, wherein the test and measurement device is a clamp meter.

15. The test and measurement device of claim 13, wherein the first attachment is a lithium-ion battery pack.

16. The test and measurement device of claim 13, further comprising a display.

17. The test and measurement device of claim 13, further comprising an LED flashlight.

18. The test and measurement device of claim 13, further comprising at least first and second electrical terminals which are exposed when the first attachment is not inserted into the first recess.

* * * * *